(12) United States Patent
Shinohara

(10) Patent No.: US 8,779,575 B2
(45) Date of Patent: Jul. 15, 2014

(54) SEMICONDUCTOR DEVICE PACKAGE HAVING A SEMICONDUCTOR CHIP ON WIRING BOARD CONNECTED TO PLURALITY OF LEADS INCLUDING POWER MOSFETS

(75) Inventor: Minoru Shinohara, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/978,602

(22) Filed: Dec. 26, 2010

(65) Prior Publication Data

US 2011/0156229 A1     Jun. 30, 2011

(30) Foreign Application Priority Data

Dec. 25, 2009   (JP) ................................ 2009-295189

(51) Int. Cl.
   *H01L 23/48*   (2006.01)

(52) U.S. Cl.
   USPC ........... 257/692; 257/666; 257/676; 257/691; 257/693; 257/723; 257/724; 257/E23.039; 361/601; 361/622; 361/760; 361/772; 361/773

(58) Field of Classification Search
   None
   See application file for complete search history.

(56) References Cited

U.S. PATENT DOCUMENTS

| | | | |
|---|---|---|---|
| 7,843,700 B2* | 11/2010 | Fukuda et al. | 361/760 |
| 8,203,848 B2* | 6/2012 | Takakusaki et al. | 361/772 |
| 2007/0075419 A1* | 4/2007 | Fukuda et al. | 257/717 |
| 2007/0196950 A1 | 8/2007 | Shirai et al. | |
| 2007/0209737 A1 | 9/2007 | Satsu et al. | |

FOREIGN PATENT DOCUMENTS

| | | |
|---|---|---|
| JP | H08-130283 A | 5/1996 |
| JP | 2007-073674 A | 3/2007 |
| JP | 2007-158288 A | 6/2007 |
| JP | 2007-227416 A | 9/2007 |
| JP | 2007-281433 A | 10/2007 |
| JP | 2008-91945 A | 4/2008 |

OTHER PUBLICATIONS

Office Action issued Apr. 16, 2013, in Japanese Patent Application No. 2009-295189.

* cited by examiner

Primary Examiner — Marcos D. Pizarro
Assistant Examiner — Cesar Lopez
(74) Attorney, Agent, or Firm — Miles & Stockbridge P.C.

(57) ABSTRACT

A technology enabling reduction of the size of a semiconductor device including a micro and a power MOSFET is provided. The semiconductor device is obtained by single packaging a first semiconductor chip with a micro formed therein and second semiconductor chips with a power MOSFET formed therein. This makes it possible to reduce the size of the semiconductor device as compared with cases where a first semiconductor chip with a micro formed therein and second semiconductor chips with a power MOSFET formed therein are separately packaged.

24 Claims, 34 Drawing Sheets

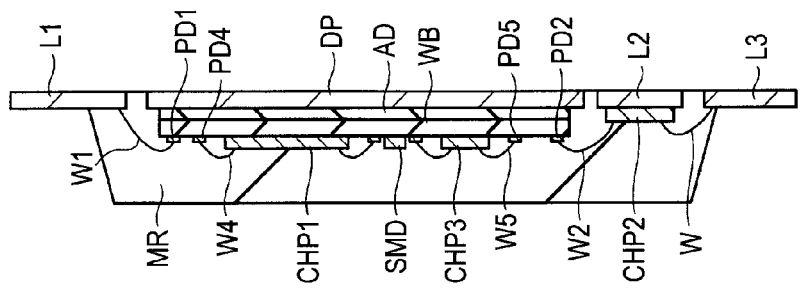
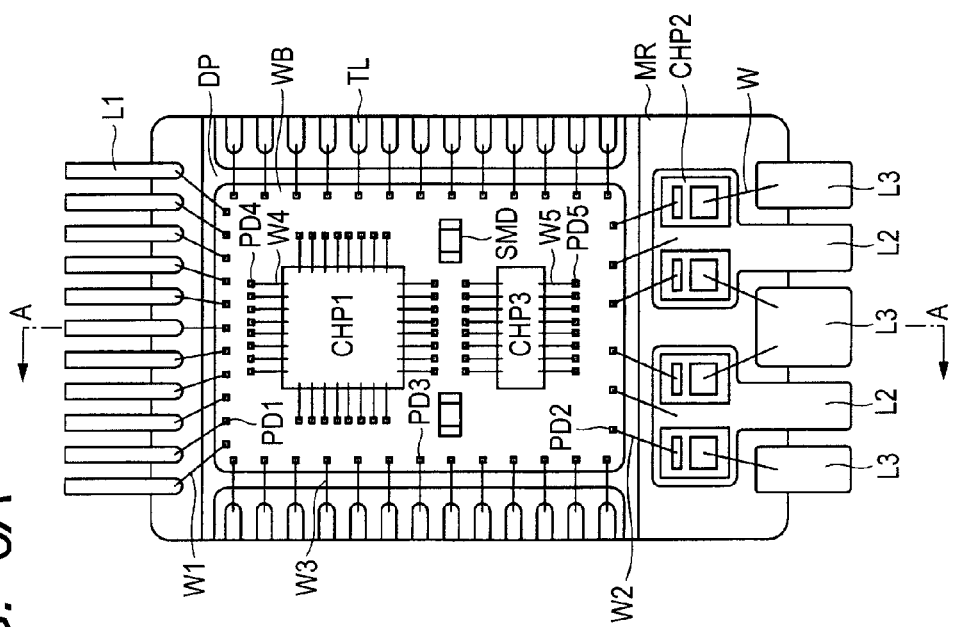

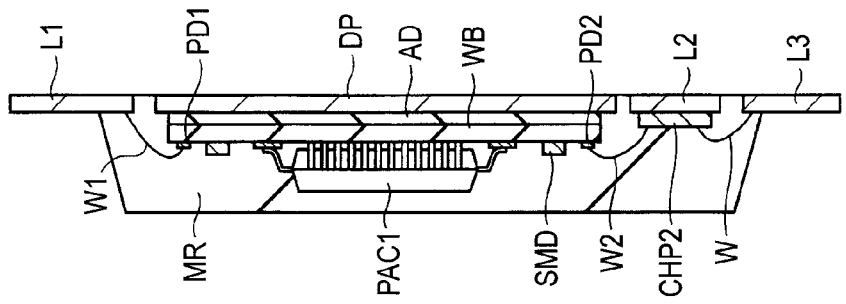
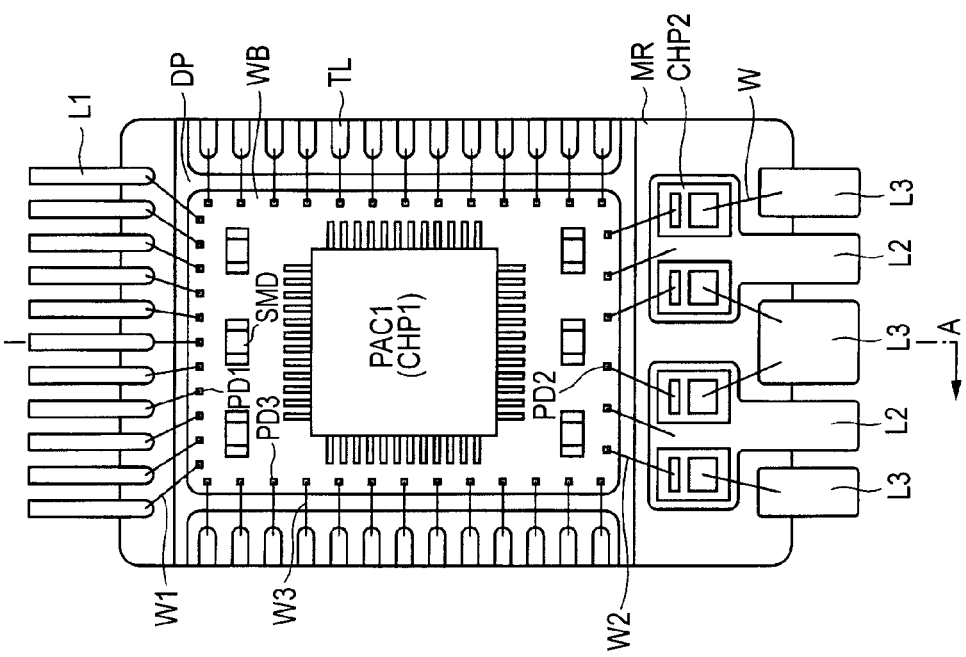

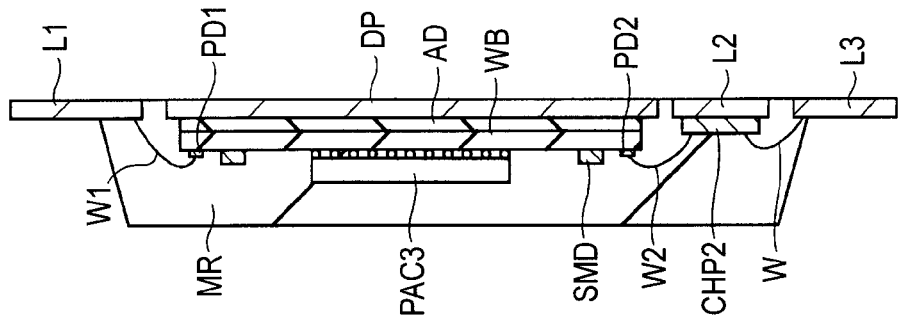
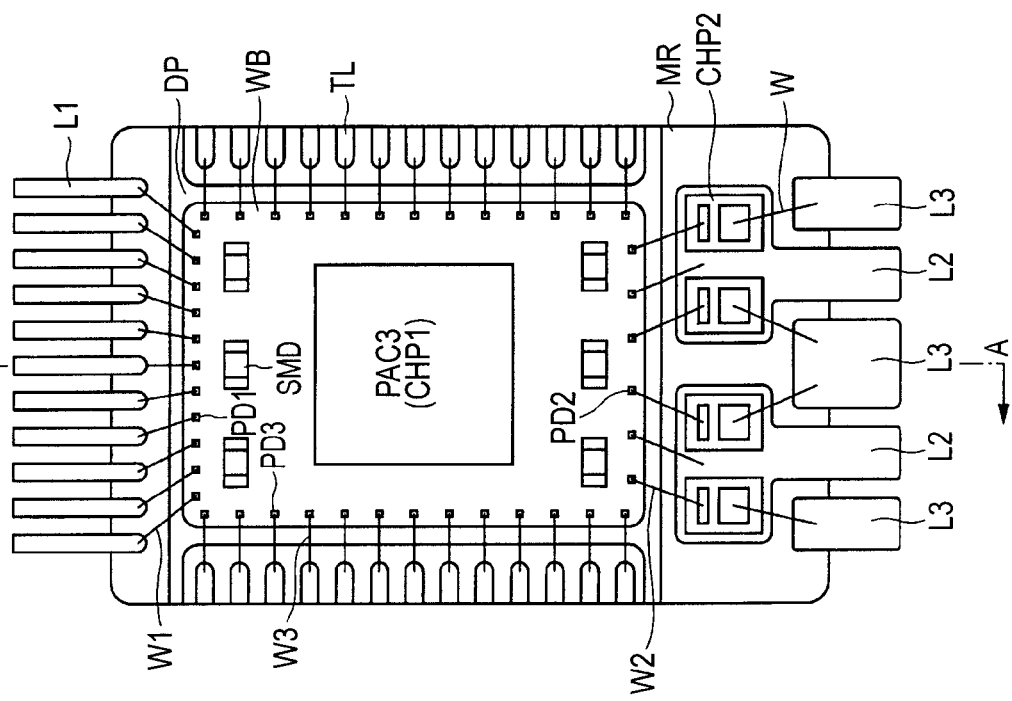

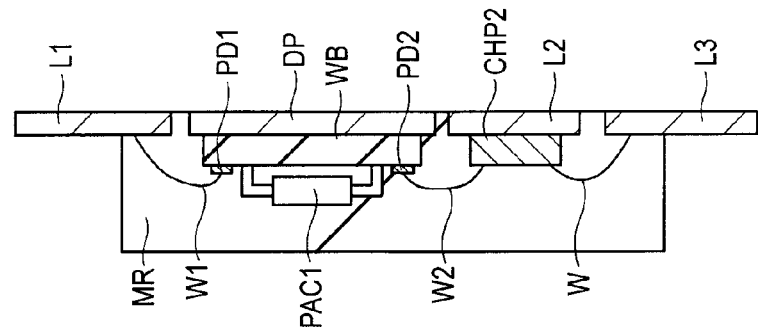
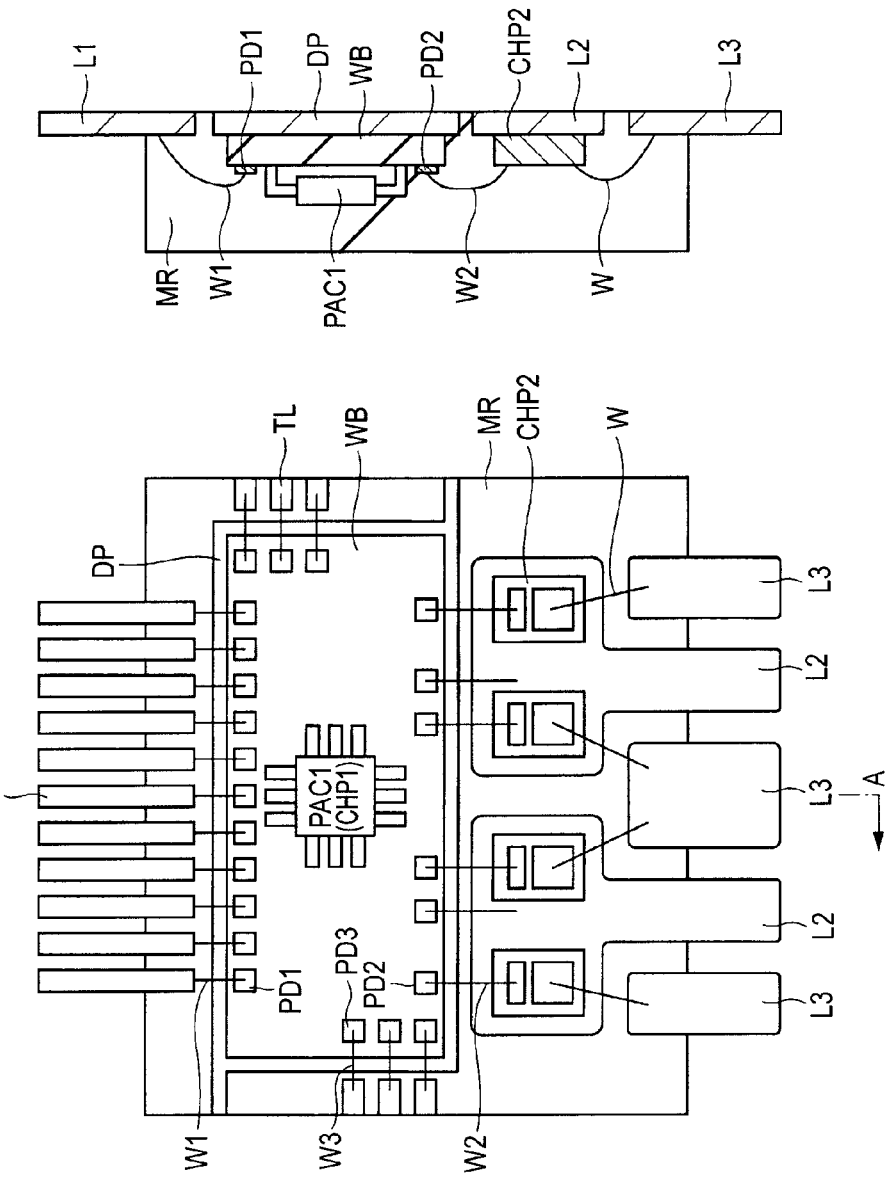

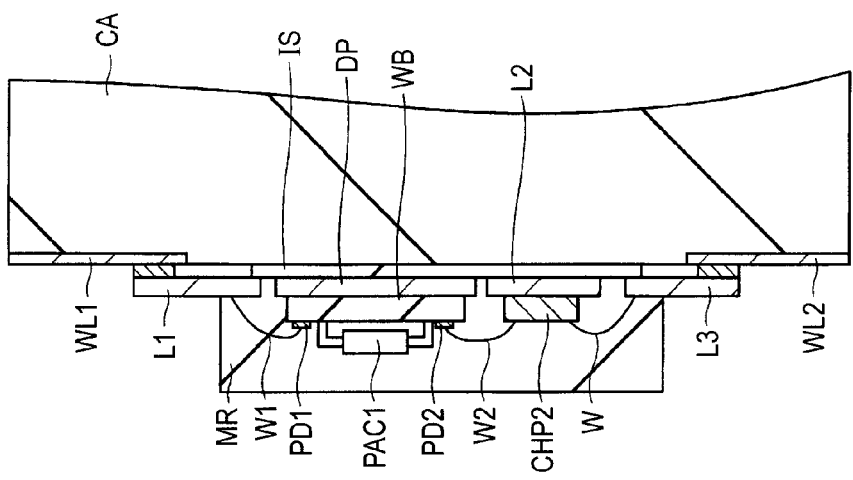
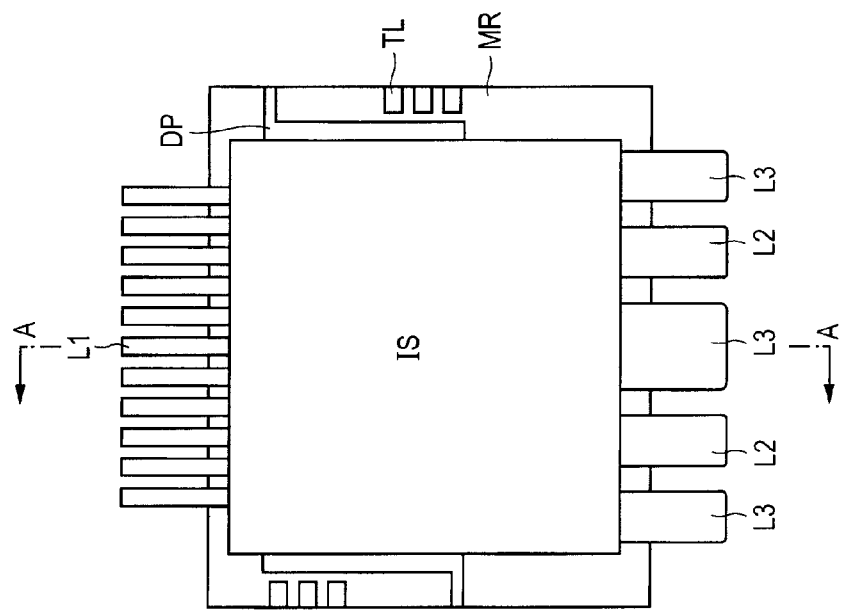

SEMICONDUCTOR DEVICE PACKAGE HAVING A SEMICONDUCTOR CHIP ON WIRING BOARD CONNECTED TO PLURALITY OF LEADS INCLUDING POWER MOSFETS

CROSS-REFERENCE TO RELATED APPLICATIONS

The disclosure of Japanese Patent Application No. 2009-295189 filed on Dec. 25, 2009 including the specification, drawings and abstract is incorporated herein by reference in its entirety.

BACKGROUND OF THE INVENTION

The present invention relates to semiconductor devices and manufacturing technologies therefor and in particular to a semiconductor device provided in one package with a microcomputer (hereafter, referred to as micro) and a power device typified by MOSFET (Metal Oxide Semiconductor Field Effect Transistor) and a technology effectively applicable to the manufacture thereof.

Japanese Unexamined Patent Publication No. 2007-281443 (Patent Document 1) discloses a technology for single packaging a semiconductor chip with IGBT formed therein and a semiconductor chip with a diode formed therein. In this technology, specifically, the semiconductor chip with the IGBT formed therein and the semiconductor chip with the diode formed therein are placed over the main surface of a multilayer wiring board (ceramic substrate) with solder bump electrodes in between.

Japanese Unexamined Patent Publication No. 2007-227416 (Patent Document 2) and Japanese Unexamined Patent Publication No. 2008-91945 (Patent Document 3) disclose technologies related to switching regulators (DC-DC converters). Specifically, these patent documents disclose a package structure for single packaging a control IC together with a high-side MOSFET and a low-side MOSFET comprising switching elements.

[Patent Document 1]
Japanese Unexamined Patent Publication No. 2007-281433
[Patent Document 2]
Japanese Unexamined Patent Publication No. 2007-227416
[Patent Document 3]
Japanese Unexamined Patent Publication No. 2008-091945

SUMMARY OF THE INVENTION

For example, automobiles are provided with functions of power windows and the like and motors are required to implement these functions. These motors are driven by a power MOSFET that functions as a switching element. Automobiles are also equipped with a high-performance micro. These micros have communication functions for automobile networks, functions of controlling turn-on/off of power MOSFETs (switching elements) for controlling a motor and the like, protection functions for protecting power MOSFETs against abnormal heating and overcurrent.

Since these micros and power MOSFETs are conventionally separately packaged, it is impossible to reduce the size of a semiconductor device including a micro and a power MOSFET.

It is an object of the invention to provide a technology enabling size reduction in a semiconductor device including a micro and a power MOSFET.

The above and other objects and novel features of the invention will be apparent from the description in this specification and the accompanying drawings.

The following is a brief description of the gist of the representative elements of the invention laid open in this application:

A semiconductor device in a representative embodiment includes: (a) a wiring board; (b) a first semiconductor chip placed over a main surface of the wiring board; (c) multiple first leads electrically coupled with the first semiconductor chip through the wiring board; and (d) multiple second leads. The semiconductor device further includes: (e) a second semiconductor chip placed over part of each of the second leads and having a power MOSFET functioning as a switching element formed therein; and (f) a sealing body sealing the wiring board, the first semiconductor chip, a partial area in each of the first leads, a partial area in each of the second leads, and the second semiconductor chip. At this time, the wiring board and the second semiconductor chip are electrically coupled with each other.

A manufacturing method for a semiconductor device in a representative embodiment includes the steps of: (a) preparing a wiring board; and (b) placing a first component including a first semiconductor chip over a main surface of the wiring board. The manufacturing method further includes the steps of: (c) placing a second component over the back surface of the wiring board located on the opposite side to the main surface; and (d) preparing a lead frame having first leads and second leads and including a second semiconductor chip placed over the second leads. The manufacturing method furthermore includes the steps of: (e) coupling together first terminals formed in the back surface of the wiring board and the first leads of the lead frame through a conductive material; and (f) bonding together second terminals formed in the main surface of the wiring board and the second semiconductor chip through wires. The manufacturing method includes the steps of: (g) after the above steps, sealing the wiring board, the first component, the second component, the second semiconductor chip, the wires, and partial areas in the first leads and partial areas in the second leads. In the first semiconductor chip, there are formed a rewritable nonvolatile memory for storing a program and a central processing unit that carries out processing based on the program stored in the nonvolatile memory. Further, in the second semiconductor chip, there is formed a power MOSFET that functions as a switching element.

The following is a brief description of the gist of the effect obtained by the representative elements of the invention laid open in this application:

The size of a semiconductor device including a micro and a power MOSFET can be reduced.

BRIEF DESCRIPTION OF THE DRAWINGS

FIG. 6A is a plan view illustrating the configuration of a semiconductor device in Modification 1;

FIG. 6B is a sectional view taken along line A-A of FIG. 6A, illustrating the configuration of the semiconductor device in Modification 1;

FIG. 7A is a plan view illustrating the configuration of a semiconductor device in Modification 2;

FIG. 7B is a sectional view taken along line A-A of FIG. 7A, illustrating the configuration of the semiconductor device in Modification 2;

FIG. 9A is a plan view illustrating the configuration of a semiconductor device in Modification 4;

FIG. 9B is a sectional view taken along line A-A of FIG. 9A, illustrating the configuration of the semiconductor device in Modification 4;

FIG. 10A is a plan view illustrating the configuration of a semiconductor device in a second embodiment;

FIG. 10B is a sectional view taken along line A-A of FIG. 10A, illustrating the configuration of the semiconductor device in the second embodiment;

FIG. 11A is a plan view of a semiconductor device as viewed from the back surface side;

FIG. 11B is a sectional view taken along line A-A of FIG. 11A, illustrating the semiconductor device in the second embodiment as is mounted over a mounting body;

DETAILED DESCRIPTION OF THE PREFERRED EMBODIMENTS

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number.

In the following description of embodiments, needless to add, their constituent elements (including elemental steps and the like) are not always indispensable unless explicitly stated otherwise or they are obviously indispensable in principle.

Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

In every drawing for illustrating embodiments, the same members will be marked with the same reference codes as a rule and the repetitive description thereof will be omitted. Even plan views will be sometimes hatched to facilitate visualization.

First Embodiment

For example, automobiles are provided with functions of power windows and the like and equipped with motors for implementing these functions. These motors are controlled by, for example, a motor control system. Hereafter, description will be given to an example of motor control systems that control a motor with reference to the drawings.

Figure 1:
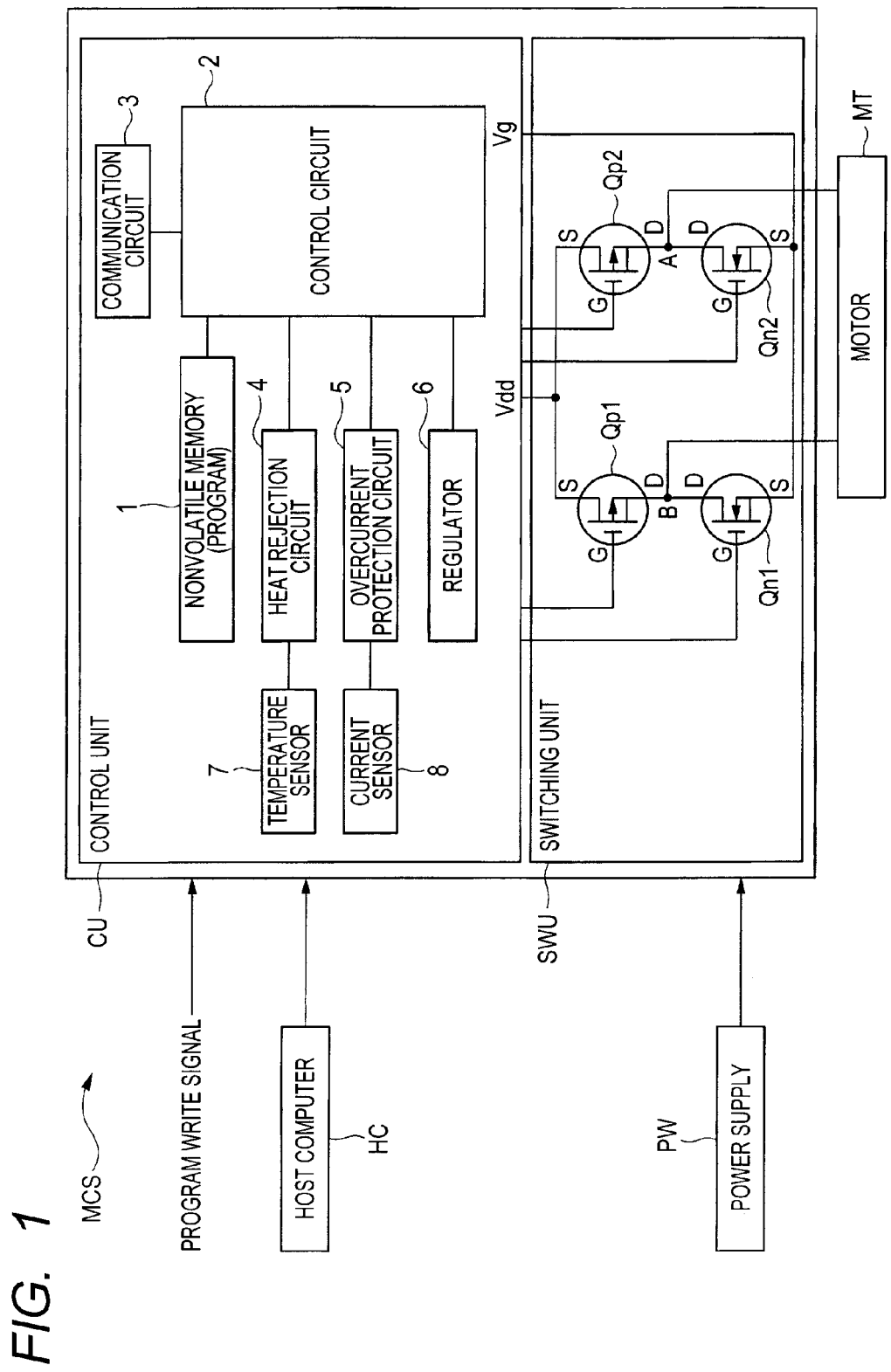
FIG. 1 is a block diagram illustrating a motor control system in a first embodiment.

FIG. 1 is a block diagram illustrating a motor control system MCS in the first embodiment. In the example in FIG. 1, the motor control system MCS in the first embodiment is equipped with a control unit CU and a switching unit SWU.

Description will be given to the configuration of the control unit CU. As illustrated in FIG. 1, the control unit CU includes a nonvolatile memory 1, a control circuit 2, a communication circuit 3, a heat rejection circuit 4, an overcurrent protection circuit 5, a regulator 6, a temperature sensor 7, and a current sensor 8.

The nonvolatile memory 1 is a rewritable memory and holds a program and the like. Specifically, a program is written to the nonvolatile memory 1 by an external program write signal.

The control circuit 2 is operated based on a program stored in the nonvolatile memory 1. Specifically, the control circuit 2 has the functions of: controlling communication with a host computer HC by the communication circuit 3; protecting the switching unit SWU against anomalies based on the output of the heat rejection circuit 4 or the overcurrent protection circuit 5; controlling the switching unit SWU to drive a motor MT; and carrying out other like processing.

The communication circuit 3 can communicate with the externally provided host computer HC. Specifically, the motor control system MCS is connected with automobile networks (CAN, LIN, FlexRay) and communicates with the externally provided host computer HC through these automobile networks. For this purpose, the control unit CU of the motor control system MCS is provided with the communication circuit 3 for communication with the host computer HC.

The heat rejection circuit 4 detects abnormal heating in the switching unit SWU and outputs a signal indicating an anomaly in the switching unit SWU to the control circuit 2. The overcurrent protection circuit 5 detects the amount of current passed through the switching unit SWU and outputs a signal indicating any anomaly in the amount of current (abnormal current flow) to the control circuit.

The regulator 6 has a function of converting supply voltage from an externally provided power supply PW into a predetermined voltage and is comprised of, for example, a switching regulator (DC-DC converter). Owing to this regulator 6, it is possible to generate a predetermined voltage different from the supply voltage and supply voltage required for the operation of each constituent element comprising the control unit CU.

The temperature sensor 7 is comprised of, for example, a temperature sensing diode. This temperature sensing diode monitors the temperature of the entire semiconductor device (module, package) incorporating the motor control system MCS. The temperature sensing diode senses the temperature of the entire semiconductor device by change in the forward current-voltage characteristic of the temperature sensing diode caused depending on the temperature of the semiconductor device. This temperature sensing diode is formed of, for example, a p-n junction diode obtained by implanting an impurity of a different conductivity type into polysilicon to form a p-n junction.

The current sensor 8 is comprised of, for example, a current sensing MOSFET. This current sensing MOSFET indirectly senses the current passed through a power MOSFET comprising the H-bridge by a current passed through the current sensing MOSFET via a shunt resistor and the like.

Description will be given to the configuration of the switching unit SWU. As illustrated in FIG. 1, the switching unit SWU includes p-channel MOSFETs Qp1, Qp2 and n-channel MOSFETs Qn1, Qn2. The p-channel MOSFETs Qp1, Qp2 and the n-channel MOSFETs Qn1, Qn2 are power MOSFETs that function as switching elements and comprise an H-bridge circuit. This H-bridge circuit is coupled with the motor MT as well as the control unit CU. The H-bridge circuit can control the rotation direction of the motor.

The above-mentioned temperature sensor 7 and current sensor 8 may be provided in this switching unit SWU.

The motor control system MCS in the first embodiment is configured as mentioned above and hereafter, description will be given to its operation. First, the control circuit 2 operates based on a program stored in the nonvolatile memory 1. More specific description will be given. The control circuit 2 communicates with the externally provided host computer HC through the communication circuit 3. This communication is carried out through an automobile network. When the control unit 2 is given an instruction to drive the motor MT from the host computer HC, it controls the power MOSFETs comprising the H-bridge of the switching unit SWU based on a program stored in the nonvolatile memory 1. Specifically, the turn-on/off of the p-channel MOSFETs Qp1, Qp2 and the n-channel MOSFETs Qn1, Qn2 is controlled by controlling voltage applied to the gate electrodes G of the p-channel MOSFETs Qp1, Qp2 and the n-channel MOSFETs Qn1, Qn2. For example, the p-channel MOSFET Qp1 and the n-channel MOSFET Qn2 are turned off and the p-channel MOSFET Qp2 and the n-channel MOSFET Qn1 are turned on. Thus continuity is established between the source region S and drain region D of the p-channel MOSFET Qp2 and the potential at point A is brought to power supply potential Vdd. Further, continuity is established between the source region S and drain region D of the n-channel MOSFET Qn1 and the potential at point B is brought to ground potential Vg. As a result, a potential difference is applied to the motor MT coupled between point A and point B and thus the motor MT is rotated in a predetermined direction.

Subsequently, for example, the p-channel MOSFET Qp1 and the n-channel MOSFET Qn2 are turned on and the p-channel MOSFET Qp2 and the n-channel MOSFET Qn1 are turned off. Thus continuity is established between the source region S and drain region D of the p-channel MOSFET Qp1 and the potential at point B is brought to power supply potential Vdd. Further, continuity is established between the source region S and drain region D of the n-channel MOSFET Qn2 and the potential at point A is brought to ground potential Vg. As a result, a potential difference in the opposite direction to the foregoing is applied to the motor MT coupled between point A and point B; therefore, the motor MT is rotated in the opposite direction to the predetermined direction. Thus the rotation direction of the motor MT can be controlled.

Because of the foregoing, the following can be implemented by controlling turn-on/off of the power MOSFETs comprising the switching unit SWU by the control unit CU: power can be supplied from the switching unit SWU to the motor MT and as a result, the motor MT can be rotated.

The control unit CU is provided with the temperature sensor 7 and at this time, the temperature of the power MOSFETs can be detected. The output of the temperature sensor 7 is inputted to the control circuit 2 through the heat rejection circuit 4 in the control unit CU. The heat rejection circuit 4 monitors output signals from the temperature sensor 7. When the output (corresponding to the temperature of the power MOSFETs) from the temperature sensor 7 becomes equal to or higher than a predetermined value, the heat rejection circuit outputs a signal for stopping the motor MT to the control unit CU. When the signal for stopping the motor MT is inputted from the heat rejection circuit 4, the control unit CU carries out control so as to turn off all the power MOSFETs comprising the switching unit SWU. Thus it is possible to protect the power MOSFETs comprising the switching unit SWU against abnormal heating.

The control unit CU is also provided with the current sensor 8 and can detects a current passed through the power MOSFETs. The output of the current sensor 8 is inputted to the control circuit 2 through the overcurrent protection circuit 5 in the control unit CU. The overcurrent protection circuit 5 monitors output signals from the current sensor 8. When the output (corresponding to the current passed through the power MOSFETs) from the current sensor 8 becomes equal to or higher than a predetermined value, the overcurrent protection circuit outputs a signal for stopping the motor MT to the control unit CU. When the signal for stopping the motor MT is inputted from the overcurrent protection circuit 5, the control unit CU carries out control so as to turn off all the power MOSFETs comprising the switching unit SWU. Thus it is possible to protect the power MOSFETs comprising the switching unit SWU against overcurrent.

In the motor control system MCS in the first embodiment, as illustrated in FIG. 1, the motor MT is controlled based on a program stored in the nonvolatile memory 1. Therefore, the motor control system can be used to control motors MT used for various purposes by rewriting a program stored in the nonvolatile memory 1. For example, automobiles are provided with power window and other functions; however, the use of the motor control system MCS in the first embodiment is not limited to the field of automobiles. The motor control system can also be applied to control on a motor MT used for different purposes. For example, it may be applied as an alternative to a mechanical relay to a semiconductor relay or an inverter circuit using MOSFET.

With the motor control system MCS in the first embodiment, custom products can be easily coped with, for example, by writing customer data to the nonvolatile memory 1. This means that the following can be implemented even with respect to small batches of a variety of products having multiple different specifications for multiple customers or even for a single customer: their specifications can be coped with by software with hardware unchanged. No increase in the number of types of hardware is highly advantageous to the manufacturer in terms of cost.

Description will be given to an example of the hardware configuration of a microcomputer (hereafter, referred to as micro MC) comprising the control unit CU with reference to the drawings.

Figure 2:
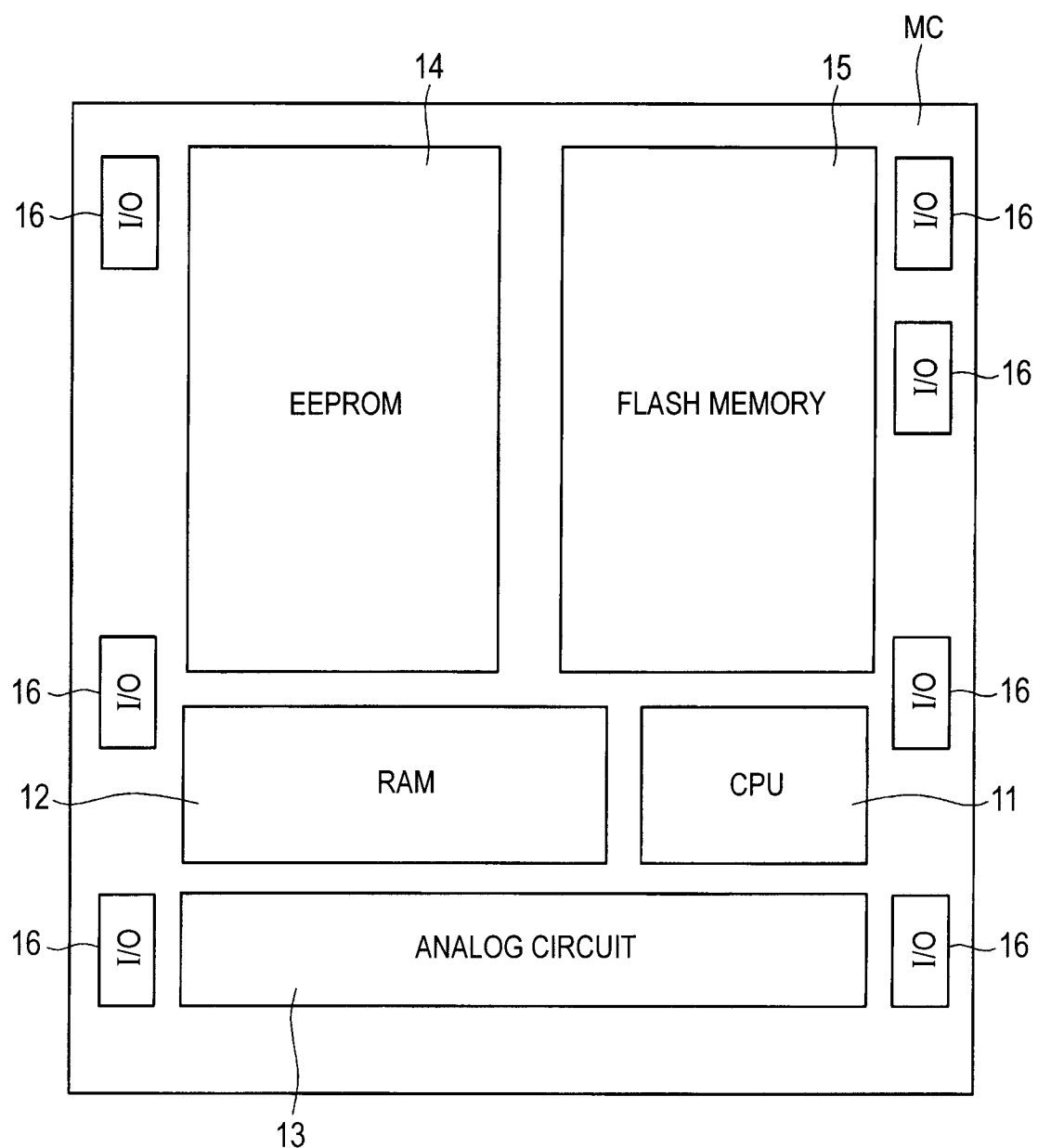
FIG. 2 is a drawing illustrating an example of the hardware configuration of a micro comprising a control unit.

FIG. 2 illustrates an example of the hardware configuration of the micro MC comprising the control unit CU. In the example in FIG. 2, the micro MC includes CPU (Central Processing Unit) 11, RAM (Random Access Memory) 12, an analog circuit 13, EEPROM (Electrically Erasable Programmable Read Only Memory) 14, a flash memory 15, and an I/O (Input/Output) circuit 16. It forms a semiconductor integrated circuit device.

The CPU (circuit) 11 is also referred to as central processing unit and equivalent to the heart of a computer or the like. The CPU 11 reads an instruction (program) from a storage device and decodes it and carries out varied computation and control based thereon.

The RAM (circuit) 12 is a memory from which memory information can be read randomly, that is, anytime and to which memory information can be newly written randomly, that is, anytime. It is also referred to as random access memory. There are two types of RAM as IC memory: DRAM (Dynamic RAM) using a dynamic circuit and SRAM (Static RAM) using a static circuit. DRAM is a random access memory that requires memory holding operation and SRAM is a random access memory that does not require memory holding operation.

The analog circuit 13 handles voltage and current signals that continuously vary with time, that is, analog signals. It is comprised of, for example, an amplification circuit, a conversion circuit, a modulation circuit, an oscillation circuit, a power supply circuit, and the like.

The EEPROM 14 and the flash memory 15 are types of nonvolatile memories electrically rewritable with respect both to write operation and to erase operation. They are also referred to as electrically erasable programmable read only memories. The memory cells of the EEPROM 14 and the flash memory 15 are comprised of, for example, a MONOS (Metal Oxide Nitride Oxide Semiconductor) transistor or a MNOS (Metal Nitride Oxide Semiconductor) transistor for storage (memory). For example, the Fowler-Nordheim tunneling phenomenon is utilized for write operation and erase operation in the EEPROM 14 and the flash memory 15. Write operation and erase operation can also be performed using hot electrons and hot holes. A difference between the EEPROM 14 and the flash memory 15 is that: while the EEPROM 14 is a nonvolatile memory that can be erased, for example, by byte and the flash memory 15 is a nonvolatile memory that can be erased, for example, by word line. In general, programs for executing varied processing at the CPU 11 and the like are stored in the flash memory 15. Meanwhile, varied frequently rewritten data is stored in the EEPROM 14.

The I/O circuit 16 is an input/output circuit for outputting data from the micro MC to connected equipment external to the micro MC and inputting data from connected equipment external to the micro MC to the micro MC.

The thus configured micro MC in the first embodiment refers to a semiconductor device including at least the following: a rewritable nonvolatile memory (flash memory 15) for storing a program and a central processing unit (CPU 11) for carrying out processing based on a program stored in this nonvolatile memory.

Description will be given to the correspondence in hardware configuration between the control unit CU illustrated in FIG. 1 and the micro MC illustrated in FIG. 2. For example, the nonvolatile memory 1 holding a program illustrated in FIG. 1 corresponds to the flash memory 15 illustrated in FIG. 2. The control circuit 2 illustrated in FIG. 1 is implemented by the CPU 11 illustrated in FIG. 2. That is, the CPU 11 is a central processing unit that carries out varied processing based on programs stored in the flash memory 15 and the control unit 2 in FIG. 1 is implemented by the computation by this central processing unit. The communication circuit 3, heat rejection circuit 4, overcurrent protection circuit 5, and regulator 6 illustrated in FIG. 1 are comprised of, for example, the analog circuit 13 and the like.

Description will be given to a modification to the circuit comprising the switching unit SWU illustrated in FIG. 1. As mentioned above, the motor control system MCS in the first embodiment can be used to control a motor MT used for various purposes by rewriting a program stored in the nonvolatile memory 1. Therefore, there is a wide variety of the circuitry of the switching unit SWU used to control the motor MT.

Figure 3:
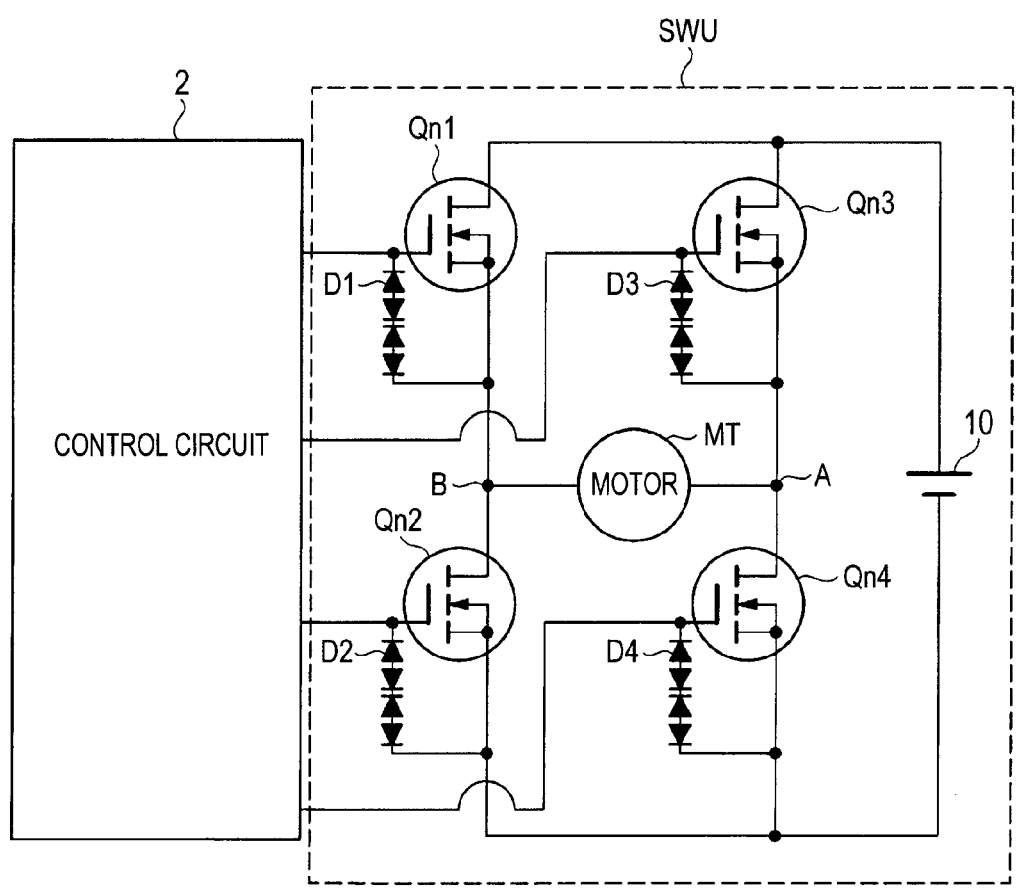
FIG. 3 is a circuit block diagram illustrating an example in which a switching unit is formed of an H-bridge comprised of four n-channel MOSFETs.

FIG. 3 illustrates an example in which the switching unit SWU is formed of an H-bridge comprised of four n-channel MOSFETs.

In the example in FIG. 3, the switching unit SWU includes n-channel MOSFETs (power MOSFETs) Qn1 to Qn4, a direct-current power supply 10, and protection diodes D1 to D4. In this switching unit SWU, the respective gate electrodes of the n-channel MOSFETs Qn1 to Qn4 are coupled to a control circuit 2; and the drain electrodes of the n-channel MOSFETs Qn1, Qn3 are coupled to the positive electrode of the direct-current power supply 10. The source electrode of the n-channel MOSFET Qn1 is coupled with the drain electrode of the n-channel MOSFET Qn2 and the source electrode of the n-channel MOSFET Qn3 is coupled with the drain electrode of the n-channel MOSFET Qn4. The source electrode of the n-channel MOSFET Qn2 and the source electrode of the n-channel MOSFET Qn4 are coupled with the negative electrode of the direct-current power supply 10. A motor MT is coupled between the joint (point B) between the n-channel MOSFET Qn1 and the n-channel MOSFET Qn2 and the joint (point A) between the n-channel MOSFET Qn3 and the n-channel MOSFET Qn4. The protection diodes D1 to D4 are respectively electrically coupled between the respective gate electrode and source electrode of the n-channel MOSFETs Qn1 to Qn4.

Hereafter, description will be given to the operation of the switching unit SWU illustrated in FIG. 3. First, the n-channel MOSFET Qn2 and the n-channel MOSFET Qn3 are turned on by the control circuit 2 and the n-channel MOSFET Qn1 and the n-channel MOSFET Qn4 are turned off by the same. Thus the positive electrode of the direct-current power supply 10 is coupled to the joint (point A) of the motor MT through the n-channel MOSFET Qn3. Meanwhile, the negative electrode of the direct-current power supply 10 is coupled to the joint (point B) of the motor MT through the n-channel MOSFET Qn2. As a result, the motor MT is rotated in a predetermined direction.

Subsequently, the n-channel MOSFET Qn1 and the n-channel MOSFET Qn4 are turned on by the control circuit 2 and the n-channel MOSFET Qn2 and the n-channel MOSFET Qn3 are turned off by the same. Thus the positive electrode of the direct-current power supply 10 is coupled to the joint (point B) of the motor MT through the n-channel MOSFET Qn1. Meanwhile, the negative electrode of the direct-current power supply 10 is coupled to the joint (point A) of the motor MT through the n-channel MOSFET Qn4. As a result, the motor MT is coupled oppositely to the foregoing and thus rotated in the opposite direction to the foregoing. The rotation direction of the motor MT can be controlled as mentioned above.

Figure 4:
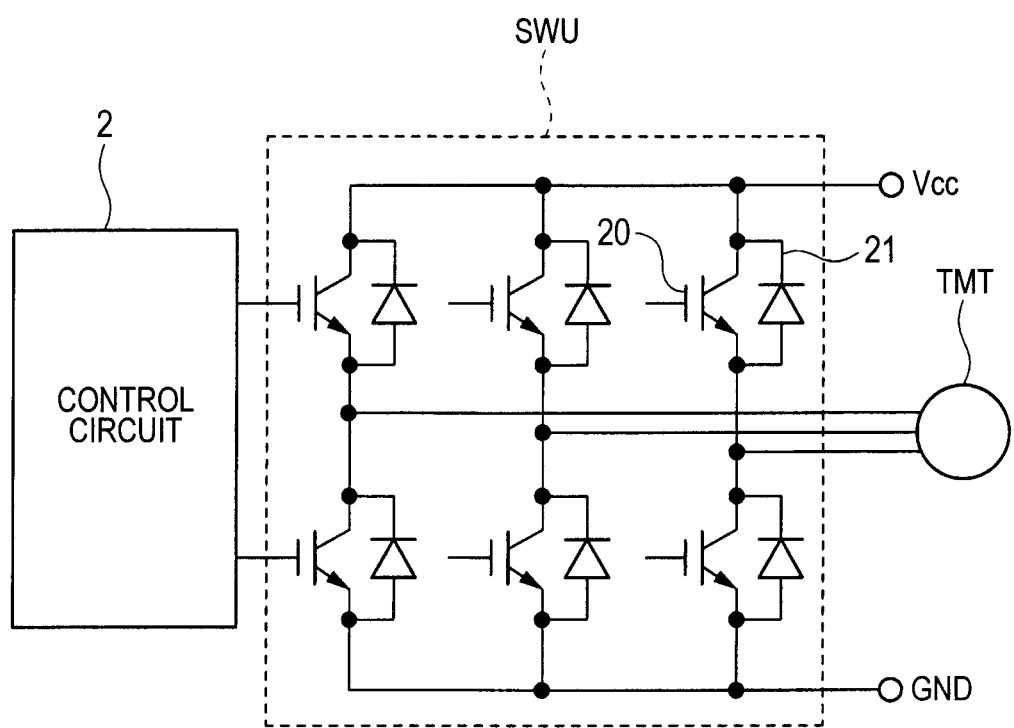
FIG. 4 is a circuit block diagram illustrating an example of the configuration of a switching unit used to control a three-phase motor.

FIG. 4 illustrates an example of the configuration of the switching unit SWU used to control a three-phase motor TMT. In the example in FIG. 4, the three-phase motor TMT is driven by three-phase voltages different in phase. The switching unit SWU is comprised of switching elements that control the three-phase motor TMT and is provided with, for example, IGBTs 20 and diodes 21 in correspondence with three phases. More specific description will be given. In each single phase, IGBT 20 and a diode 21 are coupled in antiparallel between power supply potential (Vcc) and the input potential of the three-phase motor TMT. IGBT 20 and a diode 21 are also coupled in antiparallel between the input potential of the three-phase motor TMT and ground potential (GND). That is, in the three-phase motor TMT, two IGBTs 20 and two diodes 21 are provided for each single phase (each phase) and six IGBTs 20 and six diodes 21 in total are provided for three phases. The gate electrode of each IGBT 20 is coupled with a control circuit 2, though partly not shown, and the IGBTs 20 are controlled by this control circuit 2. That is, the three-phase motor TMT is rotated by controlling the current passed through the IGBTs 20 (switching elements) comprising the switching unit SWU by the control circuit 2. Specifically, the IGBTs 20 function as switching elements that supply power supply potential (Vcc) or ground potential (GND) to the three-phase motor TMT. The three-phase motor TMT can be driven by controlling the timing of turn-on/off of the IGBTs 20 by the control circuit 2.

It is understood from the foregoing that the motor control system MCS in the first embodiment can be used to control a motor MT used for various purposes.

As illustrated in FIG. 1, the motor control system MCS in the first embodiment is comprised of the control unit CU and the switching unit SWU. The control unit CU is comprised of a micro and the switching unit SWU is comprised of power MOSFETs. Therefore, the motor control system MCS in the first embodiment includes a first semiconductor chip with the micro formed therein and a second semiconductor chip with a power MOSFET formed therein.

A micro and power MOSFETs are conventionally separately packaged and this poses a problem: the size of a semiconductor device including the micro and the power MOSFETs cannot be reduced. In the semiconductor device in the first embodiment, to solve this problem, a contrivance is made to implement the following: a first semiconductor chip with a micro formed therein and a second semiconductor chip with a power MOSFET formed therein are single packaged. Hereafter, description will be given to features of the semiconductor device in the first embodiment with reference to the drawings.

Figure 5B:
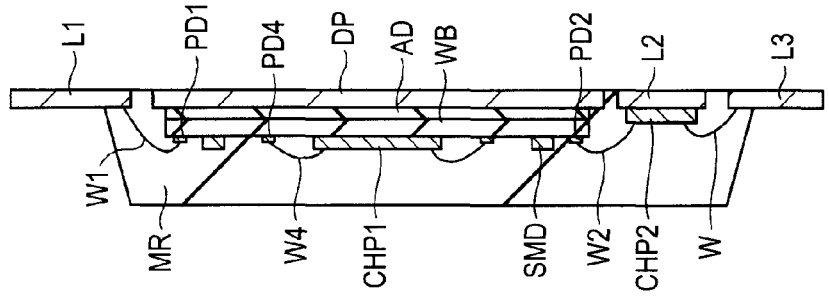
FIG. 5B is a sectional view taken along line A-A of FIG. 5A, illustrating the configuration of the semiconductor device in the first embodiment.
Figure 5A:
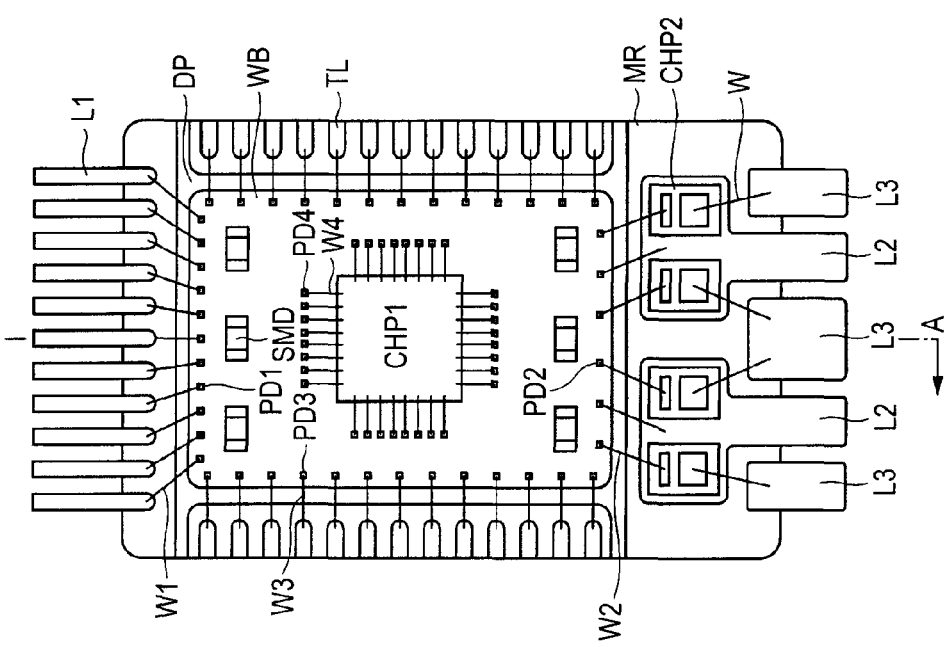
FIG. 5A is a plan view illustrating the configuration of a semiconductor device in the first embodiment.

FIG. 5A is a plan view illustrating the configuration of a semiconductor device (module) in the first embodiment. FIG. 5B is a sectional view taken along line A-A of FIG. 5A and illustrates the configuration of the semiconductor device in the first embodiment. Line A-A indicates a rough sectional line. In FIG. 5B, for example, a wire W2, a semiconductor chip CHP2, and a wire W are depicted. If the elements embraced in this section are exactly depicted in FIG. 5A, the drawing is complicated. Therefore, the sectional line (line A-A) in FIG. 5A indicates an approximate cut position. This is the same with the following drawings.

As illustrated in FIG. 5A, the semiconductor device in the first embodiment includes: a rectangular die pad DP; multiple leads L1 formed outside a first side of the die pad DP; and multiple leads L2 and multiple leads L3 formed outside a second side of the die pad DP opposite the first side. The die pad DP and the leads L1 to L3 are formed, for example, in the same layer and of the same copper material. The lead width of each lead L2 and each lead L3 is larger than the lead width of each lead L1. In addition, test leads TL are formed on a third side (a side intersecting with the first side) of the die pad DP and a fourth side (opposite the third side) thereof. These test leads TL are provided to test the electrical characteristics of the semiconductor device and write programs to the nonvolatile memory in the micro. The test leads TL are also formed in the same layer as the die pad DP and the leads L1 to L3 and of the same copper material.

A wiring board WB is placed over the die pad DP. The wiring board WB is formed of, for example, a multilayer wiring board in which wirings are formed in multiple layers. This wiring board WB is formed of glass epoxy resin, ceramic, a metal substrate, or the like. Over the wiring board WB, a semiconductor chip CHP1 with the micro formed therein is placed. This semiconductor chip CHP1 and a terminal PD4 of the wiring board WB is coupled with each other through a wire W4. The wire W4 is, for example, a gold wire or the like. Further, a passive component SMD is also placed over the wiring board WB.

In the semiconductor device in the first embodiment, the semiconductor chip CHP1 is not directly placed on the die pad DP but the semiconductor chip CHP1 is placed over the wiring board WB. The reason for this is as follows: in the semiconductor chip CHP1, there is formed the high-performance, multifunctional micro and the semiconductor chip CHP1 is inevitably a multi-pin component; and the wiring board WB is adopted to build a circuit using the semiconductor chip CHP1 as a multi-pin component and reduce the size of the semiconductor device.

Over the wiring board WB, terminals PD1 are formed and these terminals PD1 and the leads L1 are coupled with each other through a wire W1. The wire W1 is, for example, a gold wire or the like. Over the wiring board WB, in addition, terminals PD3 are formed and these terminals PD3 and test leads TL are coupled with each other.

Over each lead L2, there is placed a semiconductor chip CHP2 with a power MOSFET formed therein. The power MOSFET formed in each semiconductor chip CHP2 and a terminal PD2 formed in the wiring board WB are coupled with each other; and each power MOSFET and a lead L3 is coupled with each other through a wire W. Each semiconductor chip CHP2 with a power MOSFET formed therein is directly placed on a lead L2 without intervention of the wiring board WB unlike the above-mentioned semiconductor chip CHP1. There are some reasons why this structure is adopted:

One is to enhance heat radiation efficiency. Since a large current is passed through a power MOSFET formed in each semiconductor chip CHP2, the semiconductor chip CHP2 is prone to produce heat. To cope with this, each semiconductor chip CHP2 is placed over a lead L2 formed of metal thermally-conductive more than the wiring board WB formed of glass epoxy resin, ceramic, or the like. As a result, heat produced at the semiconductor chip CHP2 escapes (is radiated) to outside through the lead L2 and thus the heat radiation efficiency can be enhanced. As mentioned above, the lead width of each lead L2 is larger than the lead width of each lead L1. This is also intended to cope with a large current passed through each lead L2 and enhance heat radiation performance.

Another reason is to prevent heat produced at each semiconductor chip CHP2 from being conducted to the semiconductor chip CHP1 with the micro formed therein as much as possible. The semiconductor chip CHP1 with the micro formed therein is often formed using a wafer process with which thin wirings are formed than for each semiconductor chip CHP2 with a power MOSFET formed therein. Therefore, there is a high risk that the operation is destabilized by the influence of heat. For this reason, the following structure is adopted: a structure in which the die pad DP over which the wiring board WB with the semiconductor chip CHP1 placed thereover is placed and the leads L2 with the semiconductor chips CHP2 placed thereover are separated from each other.

When the performance of the semiconductor chip CHP1 with the micro formed therein is enhanced, the following case is naturally expected: a case where the amount of heat produced thereby exceeds the amount of heat produced by the semiconductor chips CHP2 with the power MOSFETs formed therein. In this case, this structure is effective in stabilizing the operation of each semiconductor chip CHP2.

In either case, the structure in which the die pad DP over which the wiring board WB with the semiconductor chip CHP1 placed thereover is placed and the leads L2 with the semiconductor chips 2 placed thereover are separated from each other achieves the following: the semiconductor chip CHP1 and each semiconductor chip CHP2 are thermally separated from each other and malfunction of each chip can be prevented.

To further reduce the influence of heat, it is desirable to set the semiconductor chip CHP1 closer to the leads L1 than to the leads L2. This increases the distance between the semiconductor chip CHP1 and each semiconductor chip CHP2 and thus it is possible to reduce the influence of heat made or received by each chip.

Further, it is advisable to set other components between the semiconductor chip CHP1 and each semiconductor chip CHP2. These components insulate heat; therefore, it is possible to further reduce the influence of heat made or received by each chip.

The terminals PD4 and terminals PD1 formed in the wiring board WB are electrically coupled with each other and the terminals PD4 and the terminals PD2 and the terminals PD4 and the terminals PD3 are also electrically coupled with each other. Therefore, it turns out that the semiconductor chip CHP1 with the micro formed therein is electrically coupled with the leads L1. These leads L1 include, for example, a control pin for communication between the semiconductor chip CHP1 and an external source and this lead L1 and the semiconductor chip CHP1 are coupled with each other. Therefore, communication with an externally existing host computer can be carried out through the lead L1. Since the terminals PD4 and the terminals PD3 are coupled with each other, it turns out that the test leads TL and the semiconductor chip CHP1 are also electrically coupled with each other. As a result, it is possible to input a test signal from a test lead TL to the semiconductor chip CHP1 to check the functionality of the semiconductor chip CHP1. Further, since the terminals PD4 and the terminals PD2 are coupled with each other, it turns out that the semiconductor chip CHP1 with the micro formed therein and each semiconductor chip CHP2 with a power MOSFET formed therein are electrically coupled with each other. It is understood from this that turn-on/off of the power MOSFET formed in each semiconductor chip CHP2 can be controlled from the micro formed in the semiconductor chip CHP1.

In other words, the leads L1 are leads (terminals) dedicated to the semiconductor chip CHP1 and the leads L2 are leads (terminals) dedicated to the semiconductor chips CHP2. As illustrated in FIG. 5A, the leads L1 are arranged on the first side (upper side); the leads L2 are arranged on the second side (lower side); and the semiconductor chip CHP1 is set closer to the leads L1 than to the leads L2; and the semiconductor chips CHP2 are set closer to the leads L2 than to the leads L1. As a result, the flow of signals (processing) is linearized and wirings joining together various points can be shortened. That wirings are shortened is effective in suppressing signal delay and the influence of noise. Further, since the test leads TL are arranged on the third side and the fourth side (left and right sides), the above-mentioned flow of signals (processing) is not blocked. The semiconductor device (module) in the first embodiment is formed not only by single packaging the semiconductor chip CHP1 and the semiconductor chips CHP2. It is formed also with the foregoing taken into account.

The die pad DP, wiring board WB, semiconductor chip CHP1, semiconductor chips CHP2, passive components SMD, wires W1 to W4, W, partial areas of the leads L1 to L3, and test leads TL are sealed with resin MR (sealing body). Since it is required to couple the leads L1 to L3 with external sources, they are protruded and exposed from the resin MR. In many cases, the test leads TL are not used after testing of the semiconductor device is completed; therefore, they are so structured that they are not protruded from the resin MR. That is, each test lead TL is so configured that its portion to the end is sealed with the sealing body (resin MR) and the (entire) bottom surface of the end of the test lead TL is exposed from the resin MR (not shown). That is, since each test lead TL is contacted only in the fabrication stage, it is not protruded from the resin MR unlike the leads L1 to L3.

The structure of each test lead TL is not limited to the structure in which it is not protruded from the resin MR as illustrated in FIG. 5A. When contact and thus testing is facilitated by protruding them, they may be protruded. When a test lead TL is unnecessary to test the semiconductor device, it need not be provided and it is not indispensable to provide it. When the test leads TL are not protruded, the outer dimensions of the semiconductor device can be reduced. When multiple semiconductor devices are mounted in line, they can be arranged with the reduced distance between them on the sides where the test leads TL are arranged. This makes it possible to reduce the mounting area as compared with cases where the test leads TL1 are protruded.

It is understood from FIG. 5B that the die pad DP and the leads L1 to L3 are formed in the same layer and the wiring board WB is placed over the die pad DP with adhesive AD in between. The semiconductor chip CHP1 and a passive component SMD are placed over the wiring board WB and the semiconductor chip CHP1 and a terminal PD4 formed in the wiring board WB are coupled with each other through a wire W4. A terminal PD1 formed over the wiring board WB and a lead L1 are coupled with each other through a wire W1. The passive component includes, for example, a resistor, a capacitor, a coil, a shunt resistor, and the like.

The passive components SMD are incorporated in the semiconductor device and they are single packaged (modularized). This structure is also one of the advantages brought by adoption of the wiring board WB. Though detailed description will be given later, this semiconductor device often adopts a mounting configuration in which the leads L1, leads L2 and leads L3 are welded to the enclosure of a motor or the like. If an attempt is made to electrically couple a micro, a power MOSFET, and a passive component separately packages as in conventional cases, it complicates the mounting work. Further, this configuration requires an interposer for once receiving these packages and passive components or what functions like an interposer.

In the first embodiment, the wiring board WB is adopted to single package (modularize) these element and the passive components are also incorporated in the package. Therefore, the above-mentioned problem can be solved.

A semiconductor chip CHP2 is placed over a lead L2 and a terminal PD2 over the wiring board WB and the semiconductor chip CHP2 are coupled with each other through a wire W2. The wire W2 is, for example, a gold wire, an aluminum wire, or the like. This semiconductor chip CHP2 is further coupled with a lead L3 through a wire W. The wire W is, for example, a gold wire or an aluminum wire. In this example, the semiconductor chip CHP2 and the lead L3 are coupled with each other through the wire W. Instead, the semiconductor chip CHP2 with a power MOSFET formed therein and the lead L3 may be coupled with each other, for example, through a metal ribbon or a clip (plate-like electrode). For example, use of a metal ribbon formed of aluminum or a clip formed of copper makes it possible to reduce the resistance between a semiconductor chip CHP2 through which a large current is passed and a lead L3.

The semiconductor device in the first embodiment is configured as mentioned above. A typical one of some features thereof is that: a semiconductor chip CHP1 with a micro formed therein and a semiconductor chip CHP2 with a power MOSFET formed therein are single packaged. This makes it possible to reduce the size of the semiconductor device as compared with cases where a semiconductor chip CHP1 with a micro formed therein and a semiconductor chip CHP2 with a power MOSFET formed therein are separately packaged.

Single packaging a semiconductor chip CHP1 with a micro formed therein and a semiconductor chip CHP2 with a power MOSFET formed therein also brings the following advantage: a motor can be controlled through only an automobile network. That is, the following can be implemented just by a host computer communicating with the single packaged micro: the single packaged micro can control switching of the power MOSFETs based on a program stored in the nonvolatile memory. For this reason, motor control can be simplified.

Description will be given to a modification to the semiconductor device in the first embodiment. FIG. 6A is a plan view illustrating the configuration of a semiconductor device in Modification 1; and FIG. 6B is a sectional view (sectional view taken along line A-A of FIG. 6A) illustrating the configuration of the semiconductor device in Modification 1. The configuration of the semiconductor device in Modification 1 illustrated in FIG. 6A and FIG. 6B is substantially the same as that of the semiconductor device in the first embodiment illustrated in FIG. 5A and FIG. 5B; therefore, description will be given to a difference.

A feature of Modification 1 is that in addition to the semiconductor chip CHP1, a semiconductor chip CHP3 is placed over the wiring board WB. More specific description will be given. In addition to the semiconductor chip CHP1 with the micro formed therein, in Modification 1, there is provided the semiconductor chip CHP3 only for controlling switching of the power MOSFETs (semiconductor chips CHP2).

For example, in the first embodiment illustrated in FIG. 5A and FIG. 5B, the following functions are implemented by the micro formed in the semiconductor chip CHP1: a function of controlling communication with a host computer; a function of protecting the switching unit against anomalies; and a function of controlling the switching unit to drive a motor. In Modification 1, meanwhile, the function of controlling communication with a host computer and the function of protecting the switching unit against anomalies are implemented by the micro formed in the semiconductor chip CHP1; and the function of controlling the switching unit to drive a motor is implemented by the specific integrated circuit formed in the semiconductor chip CHP3. As mentioned above, part of the functions implemented by the micro in the first embodiment may be assigned to a different semiconductor chip. That is, the following functions can be implemented by the micro formed in the semiconductor chip CHP1 and the specific integrated circuit formed in the semiconductor chip CHP3 as described in relation to Modification 1: the function of controlling communication with a host computer, the function of protecting the switching unit against anomalies, and the function of controlling the switching unit to drive a motor.

Even when the semiconductor chip CHP3 is a custom chip for a customer, the structure of Modification 1 is effective. More specific description will be given. A common general-purpose micro is used as the micro of the semiconductor chip CHP1 and the following can be implemented: only part of its functions can be replaced with a function of the semiconductor chip CHP3 or the functions of the semiconductor chip CHP1 can be reinforced by the functions of the semiconductor chip CHP3. Thus the boundaries of applications or systems can be extended. This makes it possible to suppress cost as compared with cases where a dedicated micro is newly designed and fabricated.

In case of Modification 1, the following measure is taken as illustrated in FIG. 6A and FIG. 6B: the semiconductor chip CHP3 is coupled with terminals PD5 formed in the wiring board WB through a wire W5 and the terminals PD5 and the terminals PD4 are electrically coupled with each other through a wiring. Therefore, the semiconductor chip CHP1 with the micro formed therein and the semiconductor chip CHP3 with the specific integrated circuit formed therein are electrically coupled with each other; and the specific integrated circuit formed in the semiconductor chip CHP3 is controlled by the micro formed in the semiconductor chip CHP1.

In the above description of the semiconductor device in the first embodiment and the semiconductor device in Modification 1, cases where the semiconductor chip CHP1 with the micro formed therein is directly placed on the wiring board WB have been taken as examples. That is, in the first embodiment and Modification 1, the semiconductor chip CHP1 as a bare chip is placed over the wiring board WB. Since the semiconductor chip CHP1 is a bare chip, in this case, the following advantages are brought: the wiring board WB over which the bare chip is placed can be reduced in size and consequently, the size of the single packaged semiconductor device (module) can be reduced.

In addition, other effects can also be obtained with the above-mentioned semiconductor device in Modification 1. In Modification 1, a semiconductor chip CHP2 is set over part of each of multiple leads L2 so arranged that they adjoin to the second side (lower side) of the wiring board WB. Meanwhile, the semiconductor chip CHP1 is set over the wiring board WB closer to the first side (upper side) opposite the second side of the wiring board WB. That is, in Modification 1, there is provided the semiconductor chip CHP3 that is placed over the main surface of the wiring board WB and in which a switching control unit for controlling turn-on/off of the power MOSFETs (switching elements) is formed; and this semiconductor chip CHP3 is set between the semiconductor chip CHP1 and the semiconductor chips CHP2. For this reason, it is possible to increase the distance between the semiconductor chip CHP1 with the micro formed therein and each semiconductor chip CHP2 with a power MOSFET formed therein. In Modification 1, as a result, it is possible to make heat produced at each power MOSFET less prone to be conducted to the micro and suppress degradation in the performance of the micro due to heat.

Hereafter, description will be given to an example in which the semiconductor chip CHP1 with the micro formed therein is packaged and placed over the wiring board WB. FIG. 7A is a plan view illustrating the configuration of a semiconductor device in Modification 2; and FIG. 7B is a sectional view (sectional view taken along line A-A of FIG. 7A) illustrating the configuration of the semiconductor device in Modification 2. The configuration of the semiconductor device in Modification 2 illustrated in FIG. 7A and FIG. 7B is substantially the same as that of the semiconductor device in the first embodiment illustrated in FIG. 5A and FIG. 5B; therefore, description will be given to a difference.

A feature of Modification 2 is that the semiconductor chip CHP1 is not placed as a bare chip over the wiring board WB but a package PAC1 in which the semiconductor chip CHP1 is sealed with resin is placed. FIG. 7A and FIG. 7B illustrate a concrete example in which the type of the package PAC1 is QFP (Quad Flat Package).

When the semiconductor chip CHP1 is placed as the package PAC1 over the wiring board WB as mentioned above, the following advantages are obtained:

When the semiconductor chip CHP1 is placed as a bare chip over the wiring board WB, the semiconductor chip CHP1 has often not undergone burn-in inspection (reliability inspection). This is because the following problems underlie the conduct of chip (wafer) burn-in inspection: a problem of the high cost of jigs and tools such as a microprobe and a problem of technical difficulty in probing a pad with a microprobe. For this reason, there are inevitably a lot of semiconductor chips CHP1 that have not undergone burn-in inspection and there is a high possibility that a defective is placed over the wiring board WB. If the semiconductor chip CHP1 is defective, the semiconductor device (module) becomes defective and this degrades the yield.

When the semiconductor chip CHP1 is placed as the package PAC1 over the wiring board WB, meanwhile, it is easier to apply burn-in inspection to the package PAC1 than to apply chip (wafer) burn-in inspection. For example, burn-in inspection on the package PAC1 does not require a microprobe or the like and a large number of packages can be measured with a common IC socket. An external terminal (outer lead or BGA ball) of the package PAC1 only has to be probed (contacted). Since a pad of a chip (wafer) is not probed, it is unnecessary to take measures against damage to the front surface of the chip.

With respect to the semiconductor chip CHP1 placed over the wiring board WB, the following takes place because of the foregoing: it is easier to procure and prepare non-defectives in burn-in inspection and incorporate them in a semiconductor device (module) when they are in the form of package PAC1. As a result, a semiconductor chip CHP1 assured as a non-defective is incorporated and the high yield and reliability of the semiconductor device (module) can be ensured.

This is not limited to the form of package PAC1 and even a bare chip can obtain the same effect as long as it is a non-defective in burn-in inspection. It is advisable to use chips and packages on a case-by-case basis. For example, bare chips that have not undergone burn-in inspection are applied to single-function products with less external input/output and non-defectives in burn-in inspection in the form of package are applied to high-functionality products.

In the description of Modification 2, QFP has been taken as an example of the type of package for the semiconductor chip CHP1 but the invention is not limited to this. For example, when the semiconductor chip CHP1 with the micro formed therein and each semiconductor chip CHP2 with a power MOSFET formed therein are not single packaged and are separately packaged, the type of package for the semiconductor chip CHP1 with the micro formed therein is limited mainly to QFP. This is because in automobile applications, it is required to ensure the reliability of mounting. More specific description will be given. When the semiconductor chip CHP1 and the semiconductor chips CHP2 are separately packaged, the package with the semiconductor chip CHP1 sealed therein is directly mounted to a mounting body (customer unit). Therefore, in automobile applications requiring the reliability of mounting, the package type of the semiconductor chip CHP1 is limited to QFP with which the high reliability of mounting can be obtained.

In Modification 2, meanwhile, the package PAC1 obtained by sealing the semiconductor chip CHP1 with resin is directly mounted to the mounting body. Instead, the package PAC1 and the semiconductor chips CHP2 are further single packaged to form a module (semiconductor device). Therefore, it is the above-mentioned module (semiconductor device) that is actually mounted to the mounting body. As a result, the package PAC1 obtained by sealing the semiconductor chip CHP1 with resin is sealed in the module and is not directly mounted to the mounting body. In other words, the package PAC1 obtained by sealing the semiconductor chip CHP1 with resin is further sealed and is mechanically and electrically protected in the module. Since the package PAC1 obtained by sealing the semiconductor chip CHP1 with resin is not directly mounted to the mounting body, therefore, its type is not limited to QFP even for automobile applications. For example, the package type of the semiconductor chip CHP1 with the micro formed therein may be QFN (Quad Flat Non-Lead package), BGA (Ball Grid Array), or CSP (Chip Size Package).

Figure 8B:
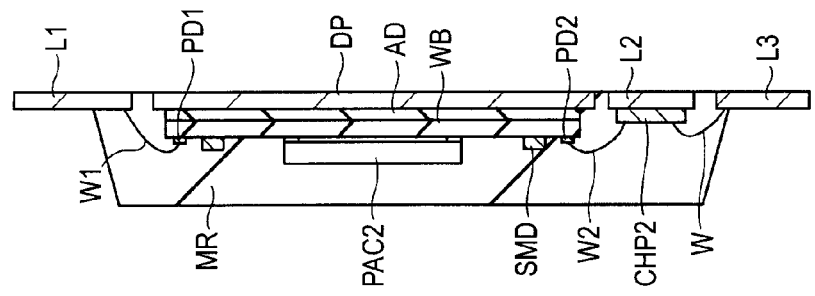
FIG. 8B is a sectional view taken along line A-A of FIG. 8A, illustrating the configuration of the semiconductor device in Modification 3.
Figure 8A:
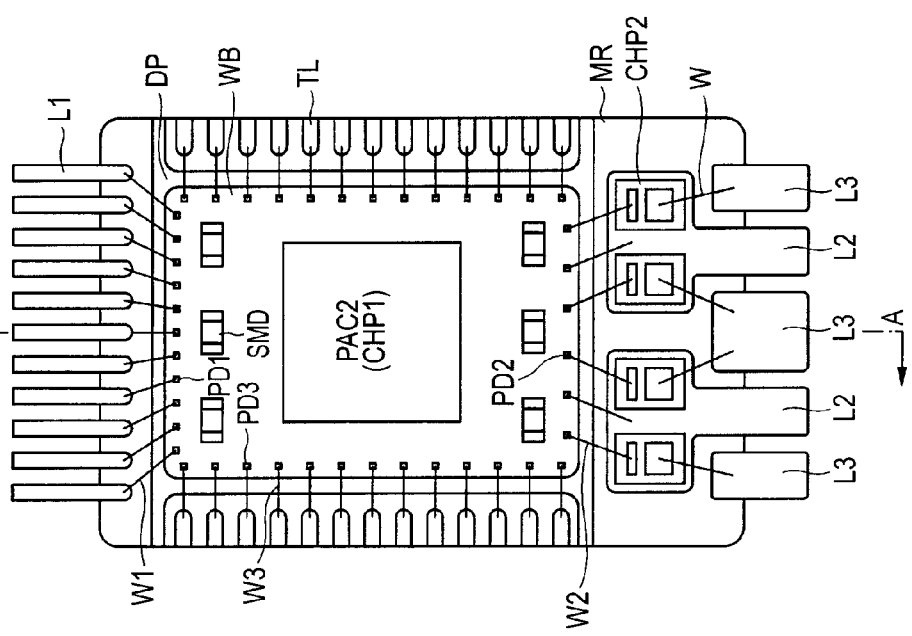
FIG. 8A is a plan view illustrating the configuration of a semiconductor device in Modification 3.

FIG. 8A is a plan view illustrating the configuration of a semiconductor device in Modification 3; and FIG. 8B is a sectional view (sectional view taken along line A-A of FIG. 8A) illustrating the configuration of the semiconductor device in Modification 3. The configuration of the semiconductor device in Modification 3 illustrated in FIG. 8A and FIG. 8B is substantially the same as that of the semiconductor device in the first embodiment illustrated in FIG. 5A and FIG. 5B; therefore, description will be given to a difference.

A feature of Modification 3 is that the semiconductor chip CHP1 is not placed as a bare chip over the wiring board WB but a package PAC2 in which the semiconductor chip CHP1 is sealed with resin is placed. FIG. 8A and FIG. 8B illustrate a concrete example in which the type of the package PAC2 is QFN. When QFN is adopted for the package PAC2 placed over the wiring board WB as mentioned above, leads are not protruded from a sealing body unlike QFP. Therefore, the size of the wiring board WB for placing the package PAC2 can be reduced. As a result, it is possible to reduce the size of a module (semiconductor device) obtained by single packaging the package PAC2 and each semiconductor chip CHP2.

FIG. 9A is a plan view illustrating the configuration of a semiconductor device in Modification 4; and FIG. 9B is a sectional view (sectional view taken along line A-A of FIG. 9A) illustrating the configuration of the semiconductor device in Modification 4. The configuration of the semiconductor device in Modification 4 illustrated in FIG. 9A and FIG. 9B is substantially the same as that of the semiconductor device in the first embodiment illustrated in FIG. 5A and FIG. 5B; therefore, description will be given to a difference.

A feature of Modification 4 is that the semiconductor chip CHP1 is not placed as a bare chip over the wiring board WB but a package PAC3 in which the semiconductor chip CHP1 is sealed with resin is placed. FIG. 9A and FIG. 9B illustrate a concrete example in which the type of the package PAC3 is BGA. When BGA is adopted for the package PAC3 placed over the wiring board WB to obtain a non-lead product as mentioned above, the size of the wiring board WB for placing the package PAC3 can be reduced. As a result, it is possible to reduce the size of a module (semiconductor device) obtained by single packaging the package PAC3 and each semiconductor chip CHP2.

With respect to products for automobiles or the like requiring extra high reliability, it is advisable to apply liquid resin, such as underfill, to the gap between the wiring board WB and the package (package PAC1, package PAC2, and package PAC3) to fill the gap. If an attempt is made to fill the above-mentioned gap with the resin MR (sealing body) used in the semiconductor device (module), a problem arises. The particle size of filler contained in the resin MR is often larger than the height of the gap. At this time, the filler prevents the resin from filling the gap; therefore, the gap cannot be sufficiently filled and a void is prone to be produced. With the presence of this void, the gap is repeatedly expanded and contracted due to moisture absorption or temperature change. This causes package cracking and may result in product destruction.

For this reason, filling the gap between the wiring board WB and the package with underfill or the like is effective in solving the above-mentioned problem.

The idea of filling with underfill or the like is also effective even for, for example, a structure in which the semiconductor chip CHP1 is flip chip mounted to the wiring board WB.

Second Embodiment

FIG. 10A is a plan view illustrating the configuration of a semiconductor device (module) in the second embodiment; and FIG. 10B is a sectional view (sectional view taken along line A-A of FIG. 10A) illustrating the configuration of the semiconductor device in the second embodiment. As illustrated in FIG. 10A, the semiconductor device in the second embodiment includes: a rectangular die pad DP; multiple leads L1 formed outside a first side of the die pad DP; and multiple leads L2 and multiple leads L3 formed outside a second side of the die pad DP opposite the first side. In addition, test leads TL are formed on a third side (a side intersecting with the first side) of the die pad DP and a fourth side (a side opposite the third side) thereof. These test leads TL are provided to test the electrical characteristics of the semiconductor device.

A wiring board WB is placed over the die pad DP. The wiring board WB is formed of, for example, a multilayer wiring board in which wirings are formed in multiple layers. This wiring board WB is formed of glass epoxy resin, ceramic, or the like. Over the wiring board WB, a package PAC1 (QFP) obtained by sealing a semiconductor chip CHP1 with a micro formed therein is placed.

Over the wiring board WB, terminals PD1 are formed and these terminals PD1 and the leads L1 are coupled with each other through a wire W1. Over the wiring board WB, in addition, terminals PD3 are formed and these terminals PD3 and the test leads TL are coupled with each other.

Over each lead L2, there is placed a semiconductor chip CHP2 with a power MOSFET formed therein. The power MOSFET formed in each semiconductor chip CHP2 and a terminal PD2 formed in the wiring board WB are coupled with each other; and each power MOSFET and a lead L3 is coupled with each other through a wire W.

The thus configured die pad DP, wiring board WB, package PAC1, semiconductor chips CHP2, wires W1 to W3, W, partial areas of the leads L1 to L3, and test leads TL are sealed with resin MR (sealing body). Since it is required to couple the leads L1 to L3 with external sources, they are protruded and exposed from the resin MR. Since the test leads TL are not used after testing of the semiconductor device, they are not protruded from the resin MR. The concept behind the presence/absence of the test leads TL is as described in relation to the first embodiment.

It is understood from FIG. 10B that the die pad DP and the leads L1 to L3 are formed in the same layer and the wiring board WB is placed over the die pad DP with adhesive (not shown) in between. The package PAC1 is placed over the wiring board WB. A terminal PD1 formed over the wiring board WB and a lead L1 is coupled with each other through a wire W1.

A semiconductor chip CHP2 is placed over a lead L2 and a terminal PD2 over the wiring board WB and the semiconductor chip CHP2 are coupled with each other through a wire W2. This semiconductor chip CHP2 is further coupled with a lead L3 through a wire W.

Though no passive components are depicted here, they may be placed over the wiring board WB as in the first embodiment.

The semiconductor device (module) in the second embodiment is configured as mentioned above and hereafter, description will be given to a configuration for mounting this semiconductor device (module) to a mounting body CA.

FIG. 11A is a plan view of a semiconductor device (module) as viewed from its back surface (die pad DP side); and FIG. 11B is a sectional view (sectional view taken along line A-A of FIG. 11A) illustrating the semiconductor device (module) in the second embodiment as is mounted to the mounting body CA. As seen from FIG. 11A, an insulating sheet IS is set over the back surface of the semiconductor device (module). It is understood from FIG. 11B that the semiconductor device (module) in the second embodiment is anchored to the mounting body CA with the insulating sheet IS in between. Specifically, a lead L1 of the semiconductor device (module) is coupled with a wiring WL1 formed in the mounting body CA by welding. Similarly, a lead L2 of the semiconductor device (module) is coupled with a wiring WL2 formed in the mounting body CA by welding. As mentioned above, the semiconductor device (module) in the second embodiment is coupled with the mounting body CA by welding. The mounting body CA is, for example, the enclosure of a motor or the like and in automobile applications, joining by welding, not joining by soldering, is often used to ensure reliability.

In the second embodiment, the semiconductor device (module) is coupled with the mounting body CA by welding; therefore, the following advantages are brought:

A case where the semiconductor device (module) is mounted to the mounting body CA by soldering will be taken as an example. In this case, ref lowing (heat treatment) for melting solder is required to mount the semiconductor device (module) to the mounting body CA. Then the wiring board WB sealed in the semiconductor device (module) is peeled off or the moisture within the wiring board WB is expanded by heat arising from ref lowing. If the wiring board WB is peeled off or the moisture therein is expanded, package cracking may occur in the resin MR sealing it. Solder is used to join constituent components in the semiconductor device (module). If the melting point of this solder is equal to or lower than the reflow temperature, remelting of the solder occurs. The solder is expanded by this solder remelting; therefore, pressure is applied to the sealing resin MR by this expansion due to solder remelting and this may also lead to an occurrence of package cracking. More specific description will be given. In the second embodiment, the package PAC1 with the semiconductor chip CHP1 sealed therein and the semiconductor chips CHP2 are single packaged. In this single packaged semiconductor device (module), solder is used for joining the wiring board WB and the constituent components of the module. If the thus configured semiconductor device (module) is mounted to the mounting body CA using solder, package cracking arising from solder for joining the wiring board WB and the constituent components is prone to occur during ref lowing. If package cracking occurs in the semiconductor device (module), moisture or foreign matter gets from this package crack into the semiconductor device (module) and causes a failure.

In the second embodiment, meanwhile, the semiconductor device (module) and the mounting body CA are joined together by welding, not by soldering. Therefore, to mount the semiconductor device (module) to the mounting body CA, ref lowing is unnecessary and the semiconductor device (module) is not subjected to heat treatment at a high temperature (200° C. to 300° C.). For this reason, package cracking arising from ref lowing can be suppressed as in the second embodiment even in the following cases, for example: cases where solder with a low melting point is used to join the constituent elements of the semiconductor device (module) or cases where the wiring board WB is used. As a result, it is possible to prevent degradation in the reliability of the semiconductor device (module).

In the semiconductor device (module) in the second embodiment, solder is used to join the wiring board WB and the constituent components of the module. However, since welding is used to join the semiconductor device (module) and the mounting body CA together, the reliability of the semiconductor device (module) can be maintained. Especially, since a built-up wiring board with which thin wirings are formed can be used for the wiring board WB, it is possible to mount a large-system scale micro. This also brings an advantage that it is possible to reduce the size of the wiring board WB and achieve the enhancement of system functionality. Therefore, it is understood that the semiconductor device (module) in the second embodiment is especially effective when welding is used to join it with the mounting body CA.

However, even when solder is used to mount the semiconductor device (module) in the second embodiment to the mounting body CA, package cracking can be sufficiently suppressed by taking the following means: using solder with a high melting point as solder used inside the semiconductor device (module), providing the resin MR used for sealing with a multilayer structure, or the like. That is, the semiconductor device (module) in the second embodiment can be applied even to cases where it is mounted to the mounting body CA by soldering by making some contrivance to suppress package cracking.

The foregoing described up to this point in relation to the second embodiment is also applicable to the above-mentioned semiconductor device in the first embodiment.

Third Embodiment

Figure 12B:
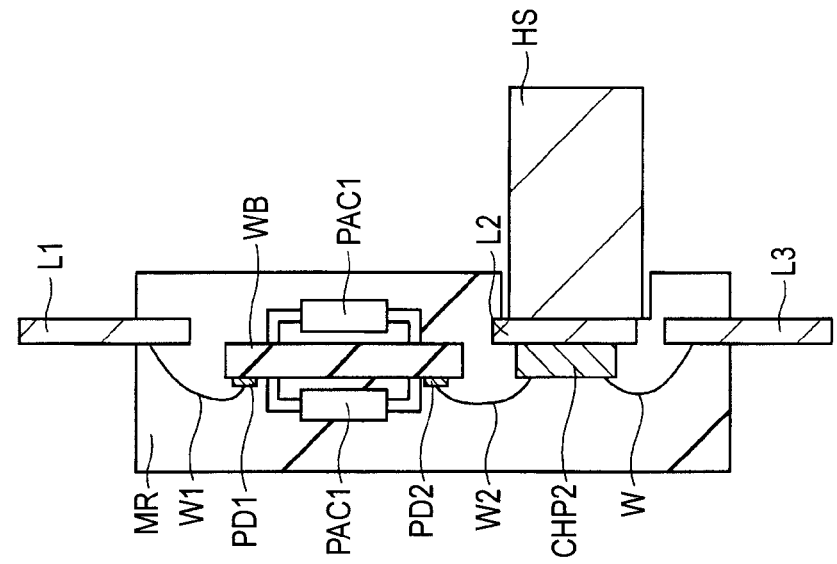
FIG. 12B is a sectional view taken along line A-A of FIG. 12A, illustrating the configuration of the semiconductor device in the third embodiment.
Figure 12A:
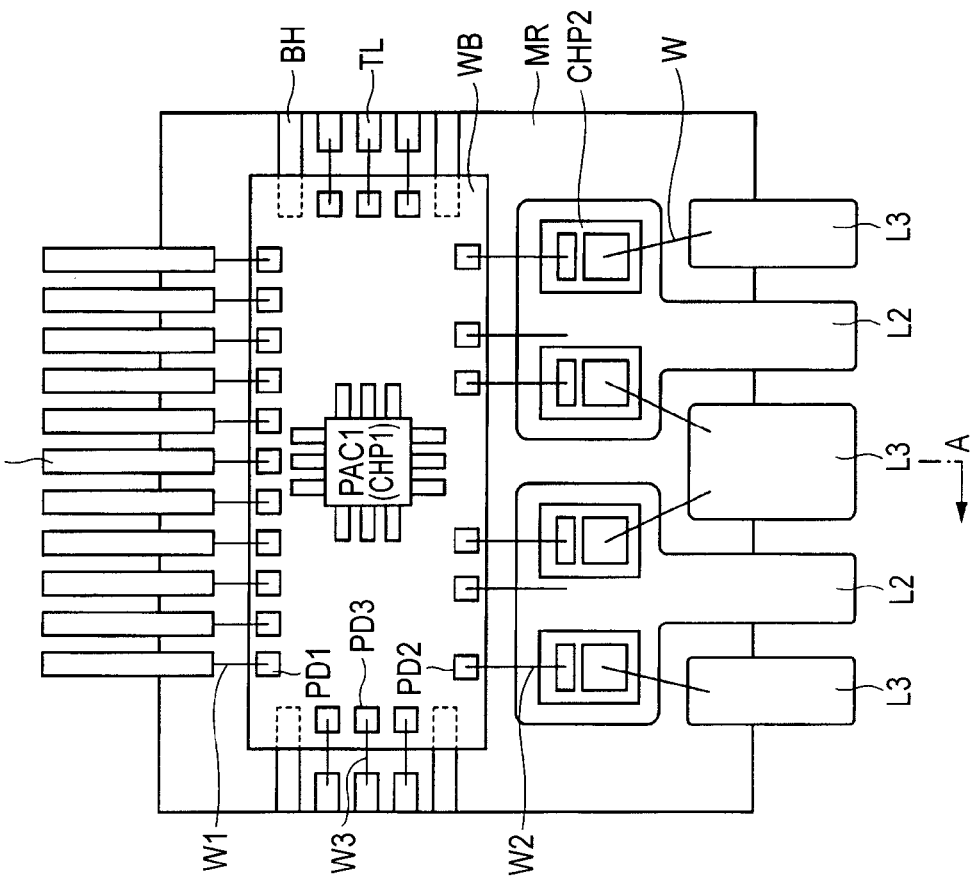
FIG. 12A is a plan view illustrating the configuration of a semiconductor device in a third embodiment.

As the third embodiment, description will be given to a semiconductor device (module) in which components are placed over both sides of a wiring board WB. FIG. 12A is a plan view illustrating the configuration of a semiconductor device in the third embodiment; and FIG. 12B is a sectional view (sectional view taken along line A-A of FIG. 12A) illustrating the configuration of the semiconductor device in the third embodiment. The configuration of the semiconductor device in the third embodiment illustrated in FIG. 12A and FIG. 12B is substantially the same as that of the semiconductor device in the second embodiment illustrated in FIG. 10A and FIG. 10B; therefore, description will be given to a difference.

A feature of the third embodiment is that the wiring board WB is supported by a board holder BH as illustrated in FIG. 12A. More specific description will be given. In the second embodiment, the wiring board WB is placed over the die pad DP as illustrated in FIG. 10A. In the third embodiment, meanwhile, the wiring board WB is supported at four corners by board holders BH as illustrated in FIG. 12A. This wiring board WB and the board holders BH are joined together, for example, by solder or adhesive. This makes it possible to place components over both sides of the wiring board WB. When the wiring board WB is placed over the die pad DP as in the second embodiment, for example, the back surface of the wiring board WB is brought into contact with the die pad DP; therefore, a component cannot be placed over the back surface of the wiring board WB. In the third embodiment, meanwhile, only the four corners of the wiring board WB are supported by the board holders BH and a component can be placed over the back surface of the wiring board WB.

In the above description, a structure in which the board holders BH support the four corners (four points) of the wiring board WB has been taken as an example. However, the invention is not limited to this. Three or more points are effective to stably support the wiring board WB. The structure in which a board is supported at four corners has less influence on routing of the wires in the wiring board WB; therefore, the four corners are appropriate as places at which the board is supported.

Specifically, as illustrated in FIG. 12B, a package PAC1 is placed over both the main surface (front surface, upper surface) and the back surface (lower surface) of the wiring board WB. As a result, the size of the wiring board WB can be reduced even when the number of components placed over the wiring board WB is identical. That is, the following can be implemented by placing components over both sides of the wiring board WB: the size of the wiring board WB can be reduced to, for example, approximately ½ as compared with cases where components are placed over only one side of the wiring board WB. As a result, further size reduction in the semiconductor device (module) can be achieved.

Resin MR is so formed as to cover the packages PAC1 (components) placed over both sides of the wiring board WB. However, a heat spreader HS is set over the back surface of a lead L2 for placing a semiconductor chip CHP2 with a power MOSFET formed therein with an insulating material in between. The reason why a heat spreader HS is set over the back surface of a lead L2 is to enhance the heat radiation efficiency of each semiconductor chip CHP2 because much heat is produced from a power MOSFET formed in the semiconductor chip CHP2. More specific description will be given. In the second embodiment, the back surface of each lead L2 is exposed from the resin MR as illustrated in FIG. 10B. Meanwhile, in cases where the components placed over the back surface of the wiring board WB are also sealed with resin MR as shown in FIG. 12B illustrating the third embodiment, the following takes place: if the back surface of each lead L2 is also sealed with resin MR, the heat radiation efficiency of the semiconductor chip CHP2 placed over the front surface of the lead L2 is degraded. This is because the heat radiation effect can be expected only from the lead L2 side and the heat radiation effect from the chip back surface side is degraded. To cope with this, a heat spreader HS is set over the back surface of a lead L2 to efficiently radiate heat from a semiconductor chip CHP2 with a power MOSFET formed therein.

In the above description, a structure in which the leads L2 are not bent has been taken as an example. However, the invention is not limited to this. Each lead L2 may be bent so that the back surface of its portion where a semiconductor chip CHP2 is placed is flush with the back surface of the resin MR. However, when the leads L2 are not bent, the thickness of the resin MR over each semiconductor chip CHP2 and the thickness of the resin MR under each lead L2 are substantially equal to each other. In this case, warp in the semiconductor device (module) can be reduced.

Fourth Embodiment

In the description of the fourth embodiment, the following case will be taken as an example: a case where components are placed over both sides of a wiring board WB and board holders BH are set in areas located under that planarly overlap with the terminals PD1 to terminals PD3 formed in the wiring board WB.

Figure 13:
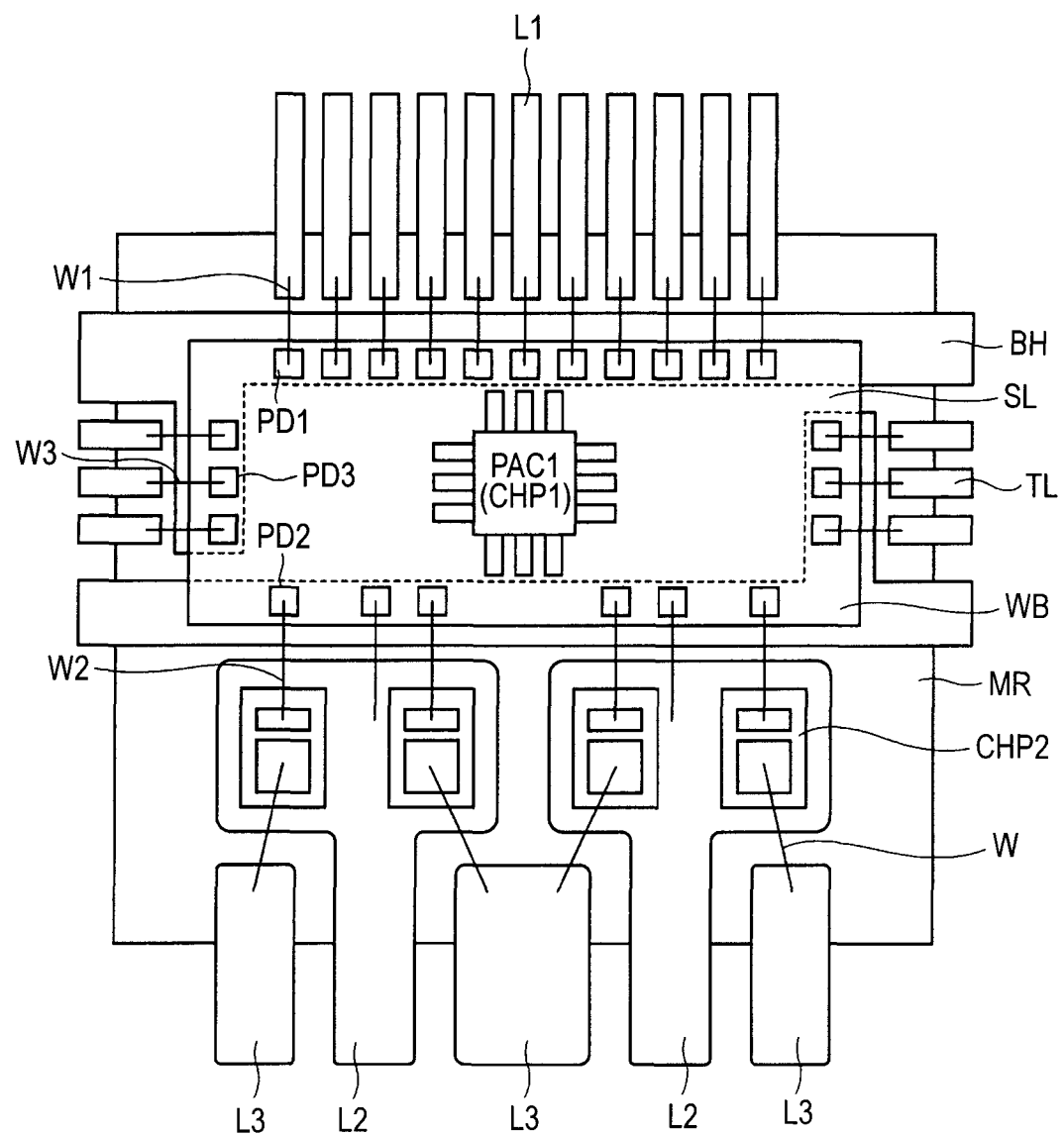
FIG. 13 is a plan view illustrating the configuration of a semiconductor device in a fourth embodiment.

FIG. 13 is a plan view illustrating the configuration of a semiconductor device in the fourth embodiment. The configuration of the semiconductor device in the fourth embodiment illustrated in FIG. 13 is substantially the same as that of the semiconductor device in the third embodiment illustrated in FIG. 12A; therefore, description will be given to a major difference.

As illustrated in FIG. 13, the semiconductor device (module) in the fourth embodiment includes a rectangular wiring board WB and terminals PD1 to terminals PD3 are formed along the peripheral portion of this wiring board WB. The terminals PD1 are coupled with leads L1 through a wire W1 and the terminals PD2 are coupled with semiconductor chips CHP2 placed over leads L2 through a wire W2. Meanwhile, the terminals PD3 are coupled with test leads TL through a wire W3. The wire W3 is, for example, a gold wire, an aluminum wire, or the like.

A feature of the fourth embodiment is that board holders BH are set in areas located under that planarly overlap with the terminals PD1 to terminals PD3 formed in the wiring board WB. A component is placed over the back surface of the wiring board WB excluding these areas located under. That is, in the semiconductor device (module) in the fourth embodiment, the following measure is taken: components are placed over both sides of the wiring board WB and board holders BH are set in areas located under that planarly overlap with the terminals PD1 to terminals PD3 formed in the wiring board WB. As a result, the areas located under the terminals PD1 to terminals PD3 formed in the wiring board WB are supported by the board holders BH. As a result, the areas located under the terminals PD1 to terminals PD3 are supported by the hard board holders BH during the following steps: a wire bonding step for coupling together the terminals PD1 and the leads L1 through the wire W1; a wire bonding step for coupling together the terminals PD2 and the semiconductor chips CHP2 through the wire W2; and a wire bonding step for coupling together the terminals PD3 and the test leads TL through the wire W3. With this structure, an ultrasonic wave from a capillary as a bonding tool for wire bonding does not escape and is transmitted to each of the terminals PD1, terminals PD2, and terminals PD3 without fail. Therefore, it is possible to reliably couple the wires W1 to W3 to the terminals PD1 to terminals PD3. As a result, the reliability of coupling by wire can be enhanced.

In the fourth embodiment, not only the board holders BH are formed so as to surround the entire periphery of the wiring board WB. The board holders BH are partially provided with slits SL. Consequently, when the entire semiconductor device (module) is sealed with resin MR, thermal stress applied to the resin MR is dispersed by the slits SL and an occurrence of package cracking due to thermal stress can be suppressed. As a result, the reliability of the semiconductor device (module) can be enhanced.

In the semiconductor device (module) in the fourth embodiment illustrated in FIG. 13, the board holders BH are set under all the terminals (terminals PD1 to terminals PD3) over the wiring board WB. However, the invention is not limited to this structure and the board holders BH may be partially set as required. Especially, when there is any point (terminal) where the wiring board WB bends during bonding and stable coupling cannot be achieved, it is effective to set the board holders BH thereunder.

Fifth Embodiment

In the description of the fifth embodiment, a case where the wiring board WB and part of the leads are bonded by conductive material, not by wire, will be taken as an example.

Figure 14:
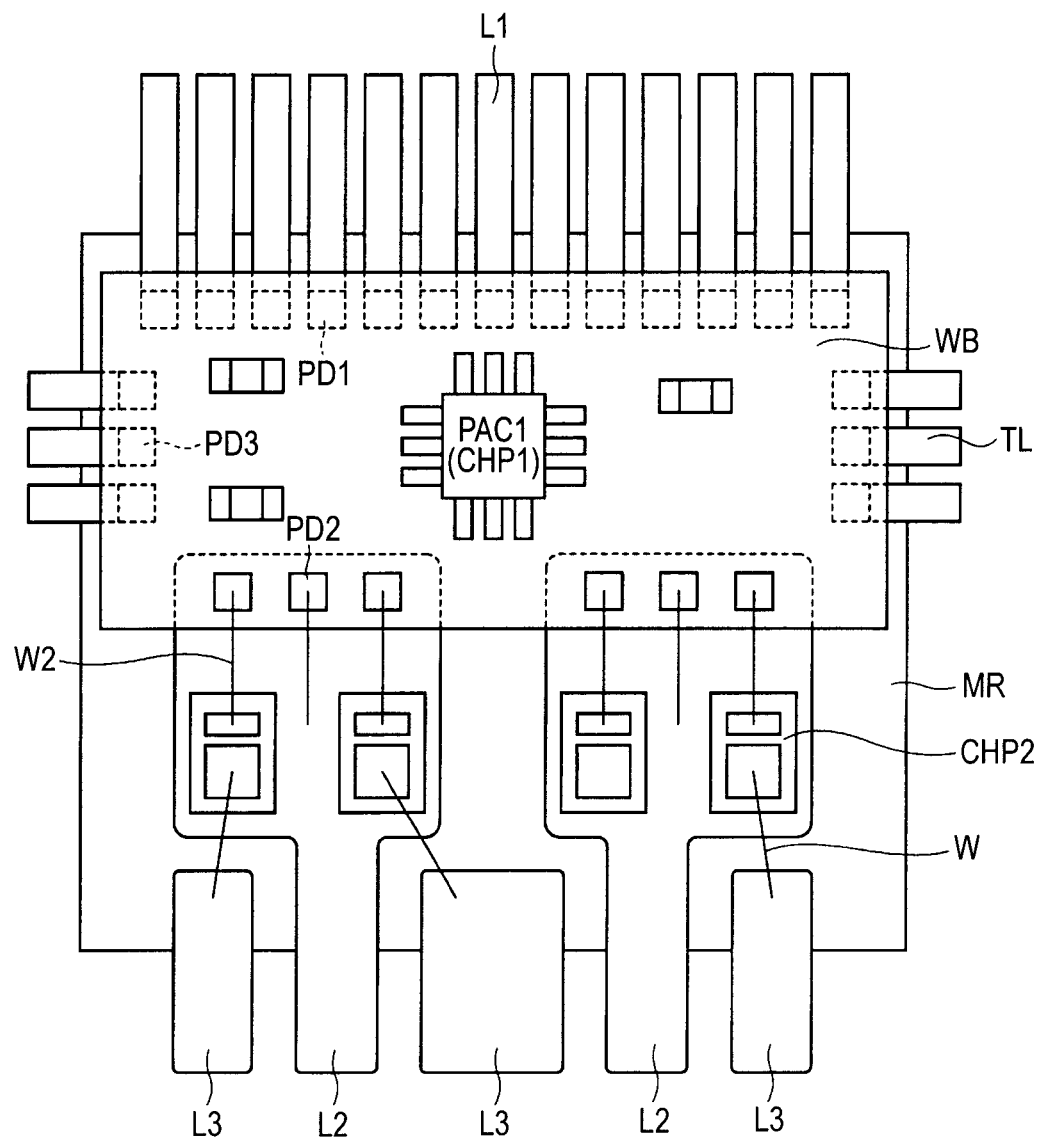
FIG. 14 is a plan view illustrating the configuration of a semiconductor device in a fifth embodiment.

FIG. 14 is a plan view illustrating the configuration of a semiconductor device in the fifth embodiment. The configuration of the semiconductor device in the fifth embodiment illustrated in FIG. 14 is substantially the same as that of the semiconductor device in the fourth embodiment illustrated in FIG. 13; therefore, description will be given to a major difference.

As illustrated in FIG. 14, the semiconductor device (module) in the fifth embodiment includes a rectangular wiring board WB and components, such as a package PAC1 and a passive component SMD, are placed over both sides of the wiring board WB. Terminals PD1 to terminals PD3 are formed along the peripheral portion of the wiring board WB. The terminals PD1 and the terminals PD3 are formed in the back surface of the wiring board WB and the terminals PD2 are formed in the main surface (front surface) of the wiring board WB. The terminals PD2 formed in the wiring board WB are coupled with semiconductor chips CHP2 placed over the leads L2 through a wire W2. Meanwhile, the terminals PD1 formed in the back surface of the wiring board WB are coupled with the leads L1 by conductive material, not by wire. Similarly, the terminals PD3 formed in the back surface of the wiring board WB are also coupled with test leads TL by conductive material.

As mentioned above, a feature of the semiconductor device (module) in the fifth embodiment is that: the terminals PD1 formed in the back surface of the wiring board WB are coupled with the leads L1 by conductive material; and the terminals PD3 formed in the back surface of the wiring board WB are similarly coupled with the test leads TL by conductive material. This makes it possible to further reduce the size of the semiconductor device (module) in the fifth embodiment.

Figure 15:
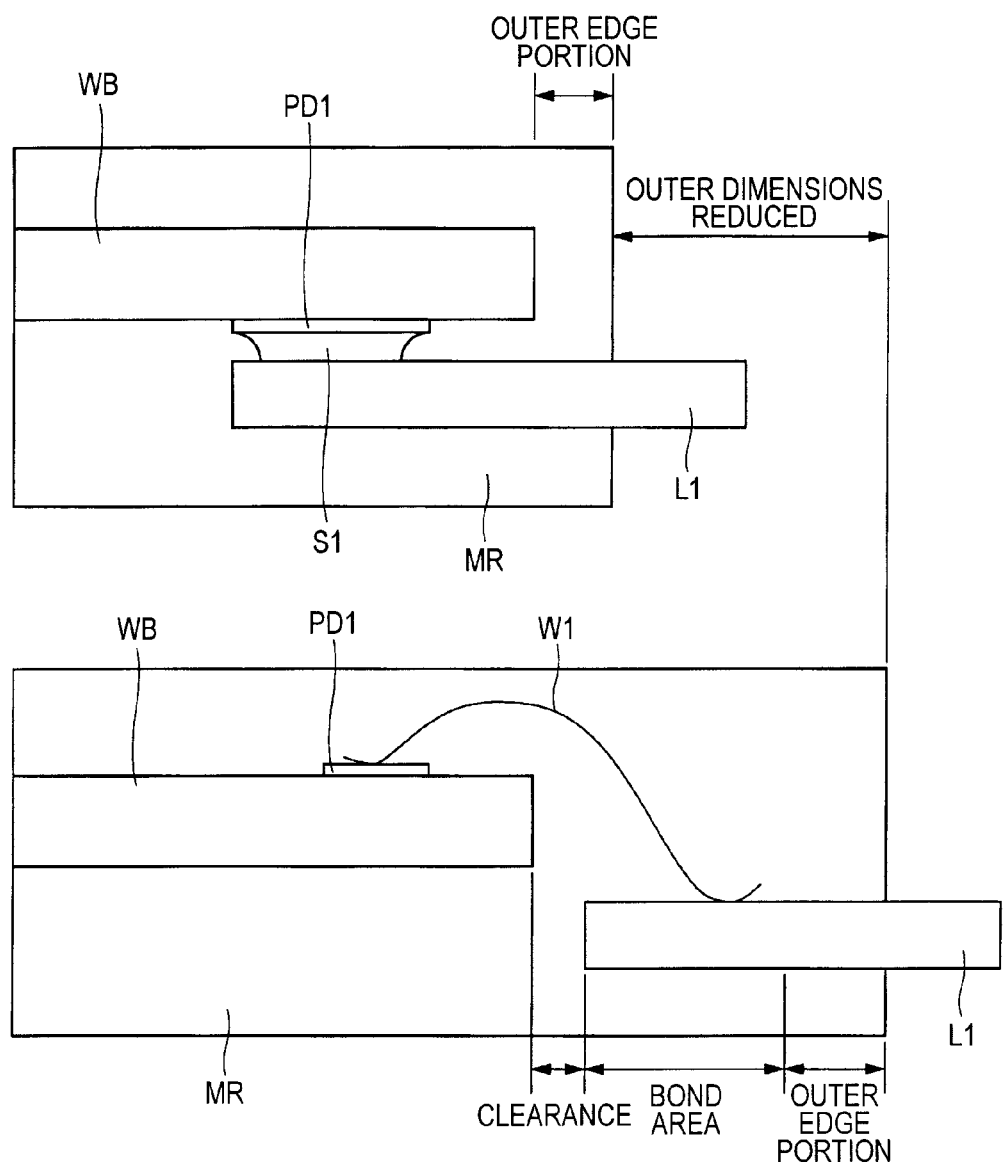
FIG. 15 is a drawing illustrating a comparison between the following cases: a case where a terminal formed in a wiring board and a lead are coupled together through a conductive material and a case where a terminal formed in a wiring board and a lead are coupled together through a wire.

The reason for this will be described with reference to FIG. 15. FIG. 15 illustrates a comparison between the following cases: a case where a terminal PD1 formed in a wiring board WB and a lead L1 are coupled with each other by conductive material; and a case where a terminal PD1 formed in a wiring board WB and a lead L1 are coupled with each other by a wire W1. In the upper sketch in FIG. 15, the terminal PD1 formed in the back surface of the wiring board WB and the lead L1 are coupled with each other by solder S1. In this case, only the outer edge portion is required. In the lower sketch in FIG. 15, meanwhile, the terminal PD1 formed in the main surface (front surface) of the wiring board WB and the lead L1 are coupled with each other by wire W1. In this case, as seen from the sketch, the clearance between the wiring board WB and the lead L1 and the bond area and outer edge portion of the lead L1 are required. As is apparent from FIG. 15, the outer dimensions of the resin MR can be reduced more in cases where the terminal PD1 and the lead L1 are coupled with each other by solder S1 than in the following cases: cases where the terminal PD and the lead L1 are coupled with each other by wire W1. Because of the foregoing, size reduction can be achieved according to the semiconductor device (module) in the fifth embodiment.

Since the overall wiring length is reduced as compared with cases where coupling by wire is used, aside from size reduction, the wiring resistance or parasitic inductance may be reduced. For this reason, the structure in which coupling by conductive material is used is effective especially when an analog signal or the like susceptible to power supply or noise is propagated because the structure limits external influence.

In the structure illustrated in FIG. 15, as mentioned above, the terminals PD1 formed in the wiring board WB and the leads L1 are coupled with each other by conductive material. As compared with the structure in which the terminals PD1 formed in the wiring board WB and the leads L1 are coupled with each other by wire W1, the above structure is advantageous in some regards to reduce the thickness of the semiconductor device (module):

For example, when a high-profile component (large in component height) is involved, it is advisable to place the component and leads on the same plane in the wiring board WB. The reason for this is as follows. When the component and leads are attached to both the front and back surfaces of the wiring board WB, their total height is "component height+ wiring board WB thickness+lead thickness." With the structure in which the component and leads are attached to the same plane of the wiring board WB, meanwhile, their total height is "wiring board WB thickness+either component height or lead thickness, whichever is larger." The smaller one is included in (canceled out by) the larger.

The leads L2 of the semiconductor device (module) in the fifth embodiment are larger in their faces (portions) where a semiconductor chip CHP2 is placed than those in the fourth embodiment. They are so arranged that they partly planarly overlap with the wiring board WB. This makes it possible to reduce the size of the semiconductor device (module) and enhance the heat radiation performance thereof.

The leads L2 are not coupled with the wiring board WB. The reason for this structure is to thermally separate the semiconductor chip CHP1 and the semiconductor chips CHP2 from each other.

In the above description, solder S1 is taken as an example of the conductive material coupling the terminals PD1 and the leads L1 together. However, the invention is not limited to this and, for example, conductive adhesive may be used to couple the terminals PD1 and the leads L1 together.

FIG. 14 depicts a structure in which the leads L2 are set on the back surface side of the wiring board WB and the wires W2 are so set that they straddle the edge (board end) of the wiring board WB. However, the invention is not limited to this. A structure in which the leads L2 are set on the front surface side of the wiring board WB and the wires W2 are so set that they straddle the edges (lead ends) of the leads L2 may be adopted.

Figure 16B:
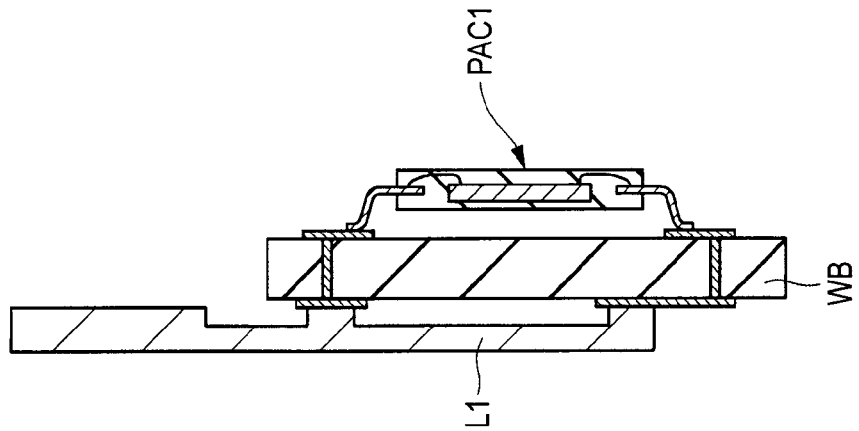
FIG. 16B is a sectional view taken along line A-A of FIG. 16A.
Figure 16A:
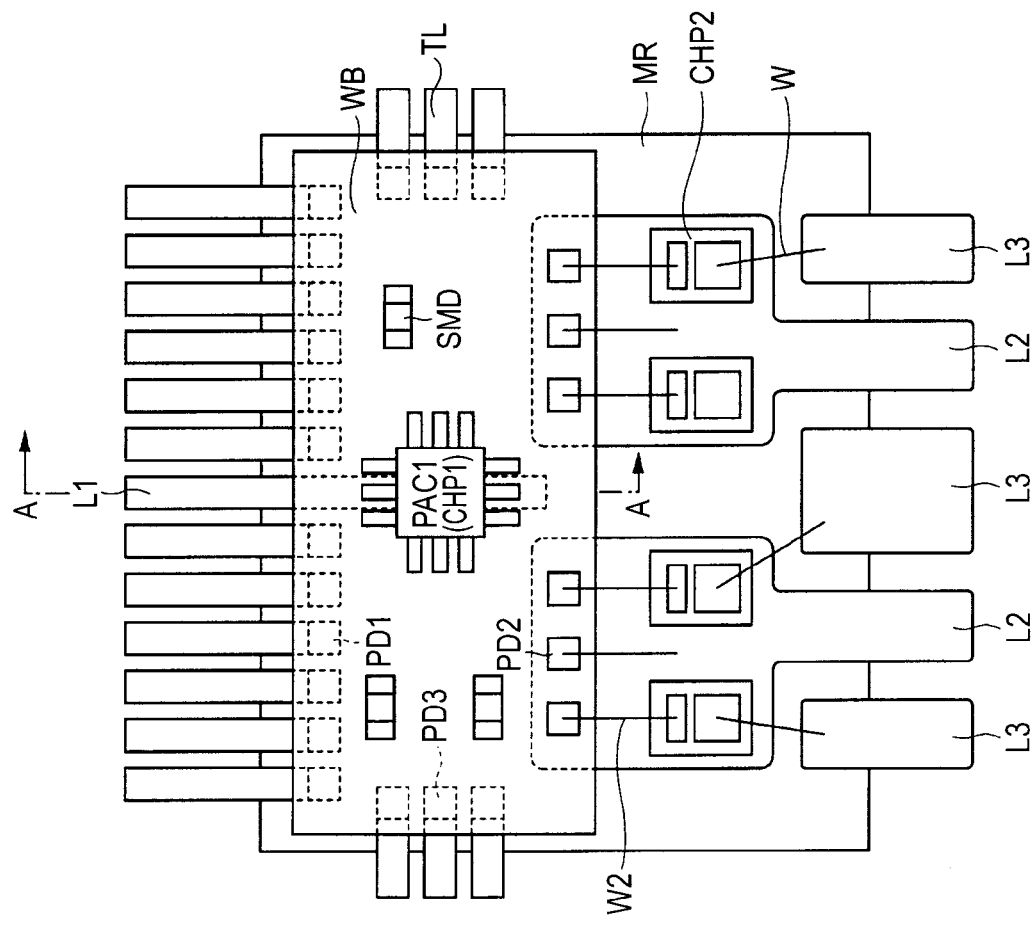
FIG. 16A is a plan view illustrating a modification to the semiconductor device in the fifth embodiment.

FIGS. 16A and 16B illustrate a modification to a semiconductor device (module) in the fifth embodiment. FIG. 16A is a plan view and FIG. 16B is a sectional view taken along line A-A of FIG. 16A. As illustrated in FIG. 16A and FIG. 16B, a configuration in which the following is implemented may be adopted: part of each lead L1 is extended to an area located directly under that planarly overlaps with the semiconductor chip CHP1 (package PAC1); and part of this lead L1 is half etched and coupled with the semiconductor chip CHP1 (package PAC1). In the case, the effect described below is obtained. For example, when the above-mentioned leads L1 are used to supply power to the semiconductor chip CHP1 (package PAC1), the length of wiring between the leads L1 and the semiconductor chip CHP1 (package PAC1) is reduced. Therefore, the influence of noise is limited and supply voltage with less noise can be supplied. When a high-speed signal is passed through the above-mentioned leads L1, the length of wiring between the leads L1 and the semiconductor chip CHP1 (package PAC1) is short and the influence of noise on the surroundings can also be reduced.

Sixth Embodiment

With respect to the sixth embodiment, description will be given to a manufacturing method for the semiconductor device (module) described in relation to the fifth embodiment with reference to the drawings. First, sectional views will be used to describe the manufacturing method for the semiconductor device (module) and then plan views will be used to describe the manufacturing method for the semiconductor device (module).

Figure 17:
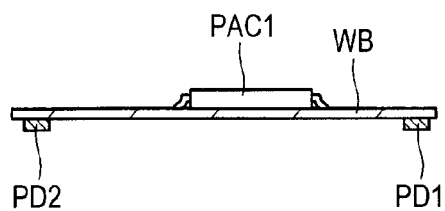
FIG. 17 is a sectional view illustrating a manufacturing process for a semiconductor device in a sixth embodiment.

First, a wiring board WB (multiple board) with terminals PD1 and terminals PD2 formed in its back surface as illustrated in FIG. 17 is prepared. A package PAC1 as a component is placed over the main surface (front surface) of the wiring board WB. Specifically, the package PAC1 and the wiring board WB are joined together through solder and then reflowing is carried out to mount the package PAC1 to the wiring board WB. This package PAC1 is obtained, for example, by packaging a semiconductor chip CHP1 with a micro formed therein. Though not shown in the drawing for convenience of explanation, a passive component and the like are also placed.

Figure 18:
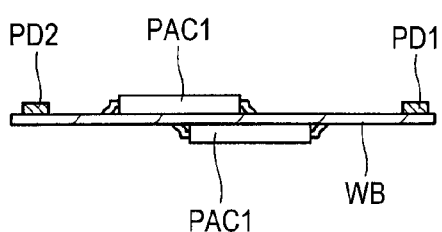
FIG. 18 is a sectional view illustrating the manufacturing process for the semiconductor device, following FIG. 17.

As illustrated in FIG. 18, subsequently, a package PAC1 as a component is placed over the back surface of the wiring board WB. Also in this case, the package PAC1 and the wiring board WB are joined together through solder and then reflowing is carried out to mount the package PAC1 to the wiring board WB. Though not shown in the drawing for convenience of explanation, a passive component and the like are also placed. Components can be placed over both the front surface and back surface of the wiring board WB as mentioned above.

Figure 19:
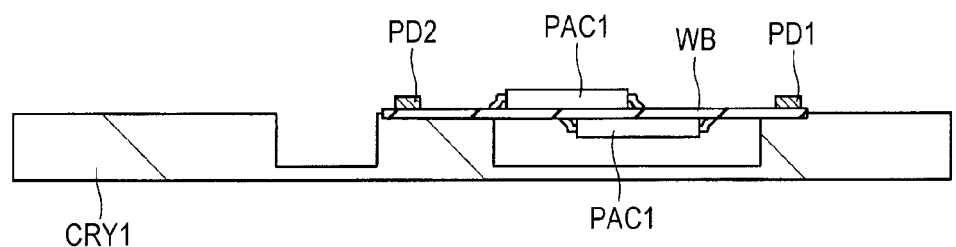
FIG. 19 is a sectional view illustrating the manufacturing process for the semiconductor device, following FIG. 18.

The multiple board is segmented to obtain individual wiring boards WB and thereafter, each wiring board WB mounted with components on both sides is set over a carrier CRY1 as illustrated in FIG. 19. At this time, the wiring board WB is so set that the terminals PD1 and terminals PD2 formed in the back surface thereof face upward. Thereafter, solder is supplied to the front surfaces of the terminals PD1 and the front surfaces of the terminals PD2 with a dispenser.

Figure 20:
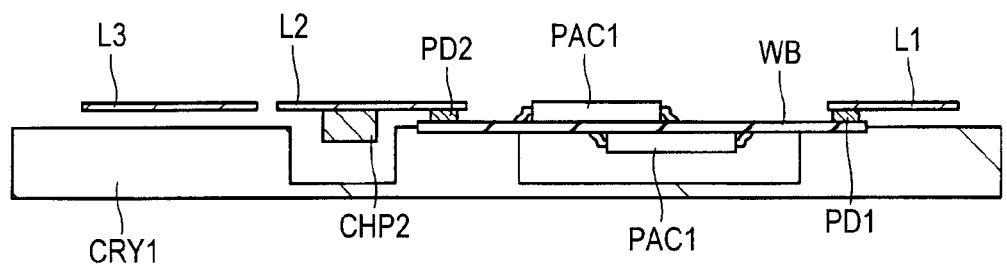
FIG. 20 is a sectional view illustrating the manufacturing process for the semiconductor device, following FIG. 19.

As illustrated in FIG. 20, subsequently, a lead frame including the leads L1, leads L2, and leads L3 and having a semiconductor chip CHP2 placed over the leads L2 is prepared. This lead frame and the wiring board WB are coupled with each other. For example, the terminals PD1 of the wiring board WB and the leads L1 are coupled with each other and the terminals PD2 of the wiring board WB and the leads L2 are coupled with each other. Specifically, the leads L1 are placed through solder applied to the terminals PD1 of the wiring board WB and the leads L2 are placed through solder applied to the terminals PD2 of the wiring board WB. Thereafter, reflowing is carried out to couple the terminals PD1 formed in the wiring board WB and the leads L1 with each other and couple the terminals PD2 formed in the wiring board WB and the leads L2 with each other. In each semiconductor chip CHP2 placed over the lead L2, there is formed a power MOSFET.

Figure 21:
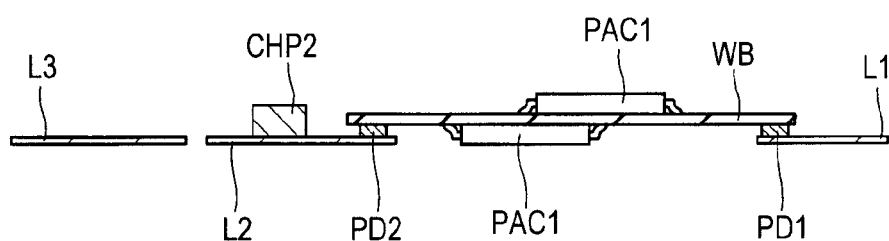
FIG. 21 is a sectional view illustrating the manufacturing process for the semiconductor device, following FIG. 20.
Figure 22:
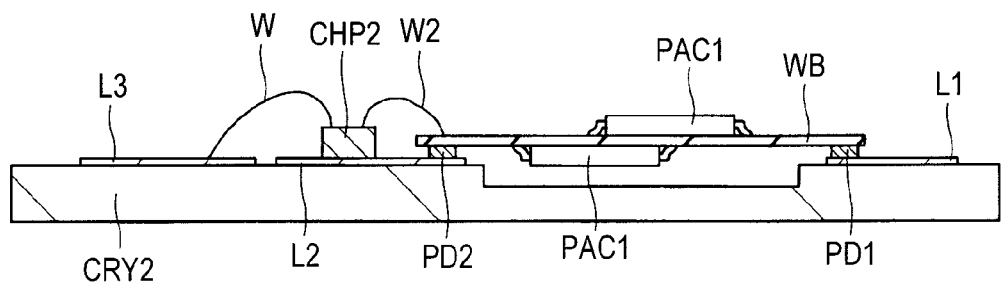
FIG. 22 is a sectional view illustrating the manufacturing process for the semiconductor device, following FIG. 21.

As illustrated in FIG. 21, subsequently, the lead frame with the wiring board WB coupled thereto is turned up side down. As illustrated in FIG. 22, the lead frame with the wiring board WB coupled thereto is set over the carrier CRY2. Thereafter, the semiconductor chips CHP2 placed over the leads L2 and the wiring board WB (terminals) are coupled with each other through a wire W2 and further the semiconductor chips CHP2 and the leads L3 are coupled with each other through a wire W. At this time, the leads L2 coupled with the terminals PD2 are set under the wiring board WB (terminals) to be bonded with a wire W2. Therefore, when the wire W2 is bonded to the wiring board WB, wire bonding can be stably carried out and the reliability of coupling between the wire W2 and the wiring board WB can be enhanced.

Figure 23:
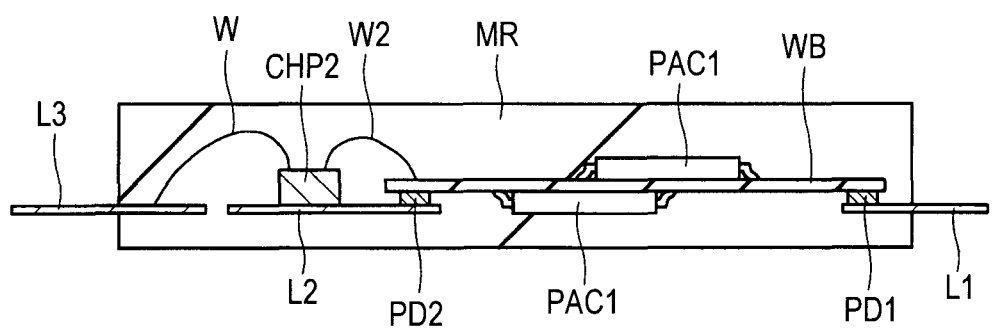
FIG. 23 is a sectional view illustrating the manufacturing process for the semiconductor device, following FIG. 22.

As illustrated in FIG. 23, subsequently, the wiring board WB with components placed over both its sides, semiconductor chips CHP2, wires W, W2, and partial areas of the leads L1 to leads L3 are sealed (molded) with resin MR. Then the lead frame is cut and as a result, the semiconductor device (module) in the fifth embodiment can be manufactured.

Figure 24:
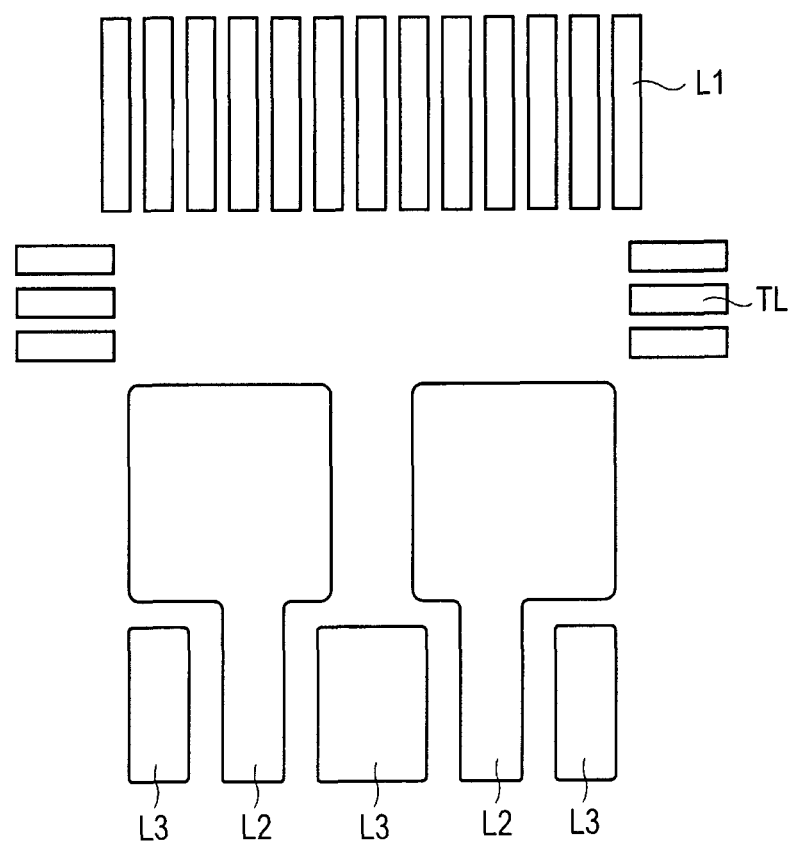
FIG. 24 is a plan view illustrating the manufacturing process for the semiconductor device in the sixth embodiment.

Further description will be given to the manufacturing method for the semiconductor device (module) in the fifth embodiment with reference to plan views. As illustrated in FIG. 24, first, the lead frame with the leads L1, leads L2, leads L3, and test leads TL formed therein is prepared.

Figure 25:
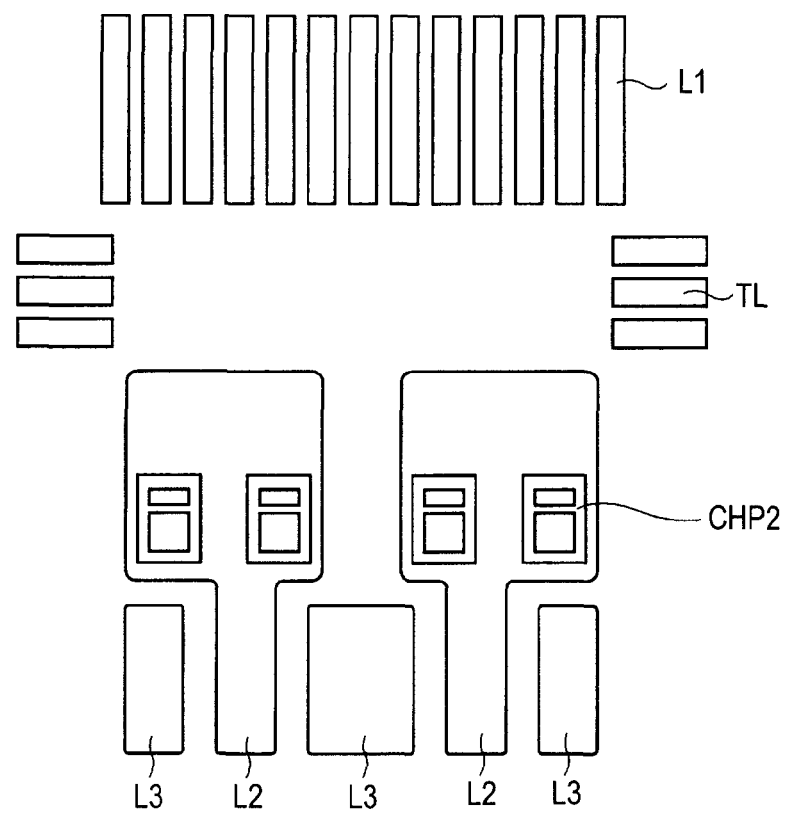
FIG. 25 is a plan view illustrating the manufacturing process for the semiconductor device, following FIG. 24.
Figure 26:
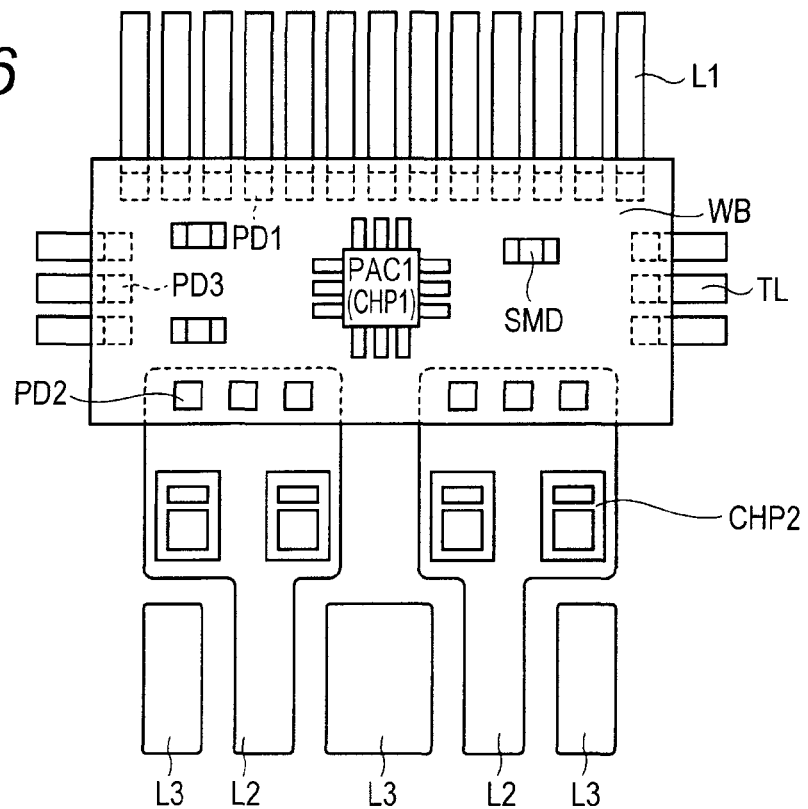
FIG. 26 is a plan view illustrating the manufacturing process for the semiconductor device, following FIG. 25.

As illustrated in FIG. 25, subsequently, the semiconductor chips CHP2 are placed over the leads L2. In each of these semiconductor chips CHP2, there is formed a power MOSFET. As illustrated in FIG. 26, thereafter, the wiring board WB with components (for example, package PAC1, passive component SMD, and the like) placed on both its sides is placed over the lead frame. Specifically, the terminals PD1 formed in the back surface of the wiring board WB and the leads L1 are coupled with each other through solder (conductive material); and the terminals PD3 formed in the back surface of the wiring board WB and the test leads TL are coupled with each other through solder (conductive material). At this time, in the main surface (front surface) of the wiring board WB, there are formed the terminals PD2.

Figure 27:
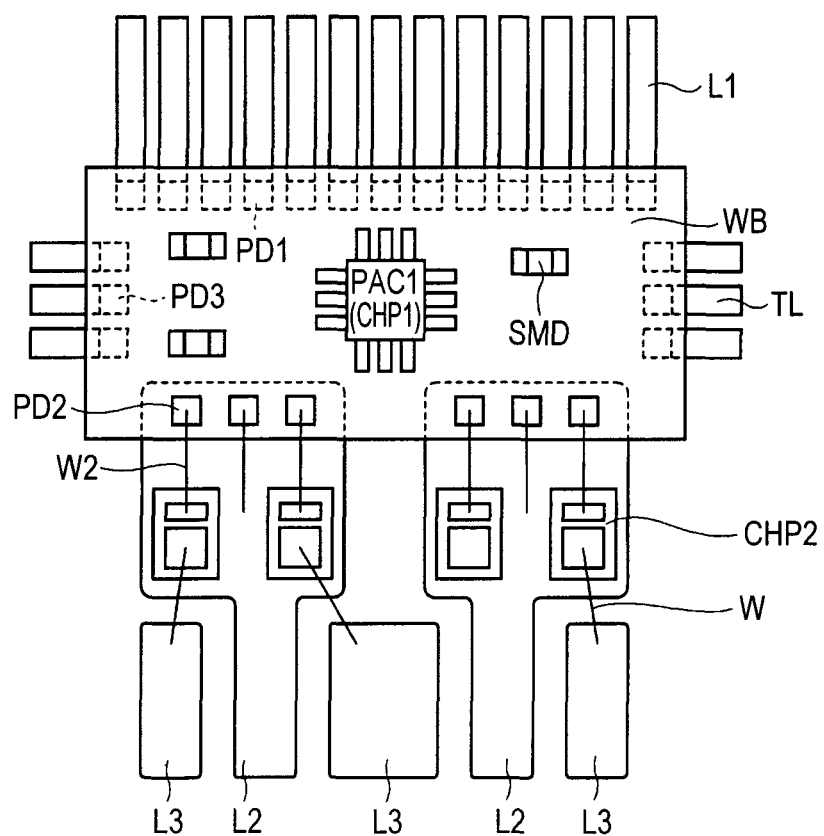
FIG. 27 is a plan view illustrating the manufacturing process for the semiconductor device, following FIG. 26.

As illustrated in FIG. 27, subsequently, the terminals PD2 formed in the front surface of the wiring board WB and the semiconductor chips CHP2 placed over the leads L2 are coupled with each other through a wire W2. At the same time, the semiconductor chips CHP2 and the leads L3 are coupled with each other through a wire W.

Figure 28:
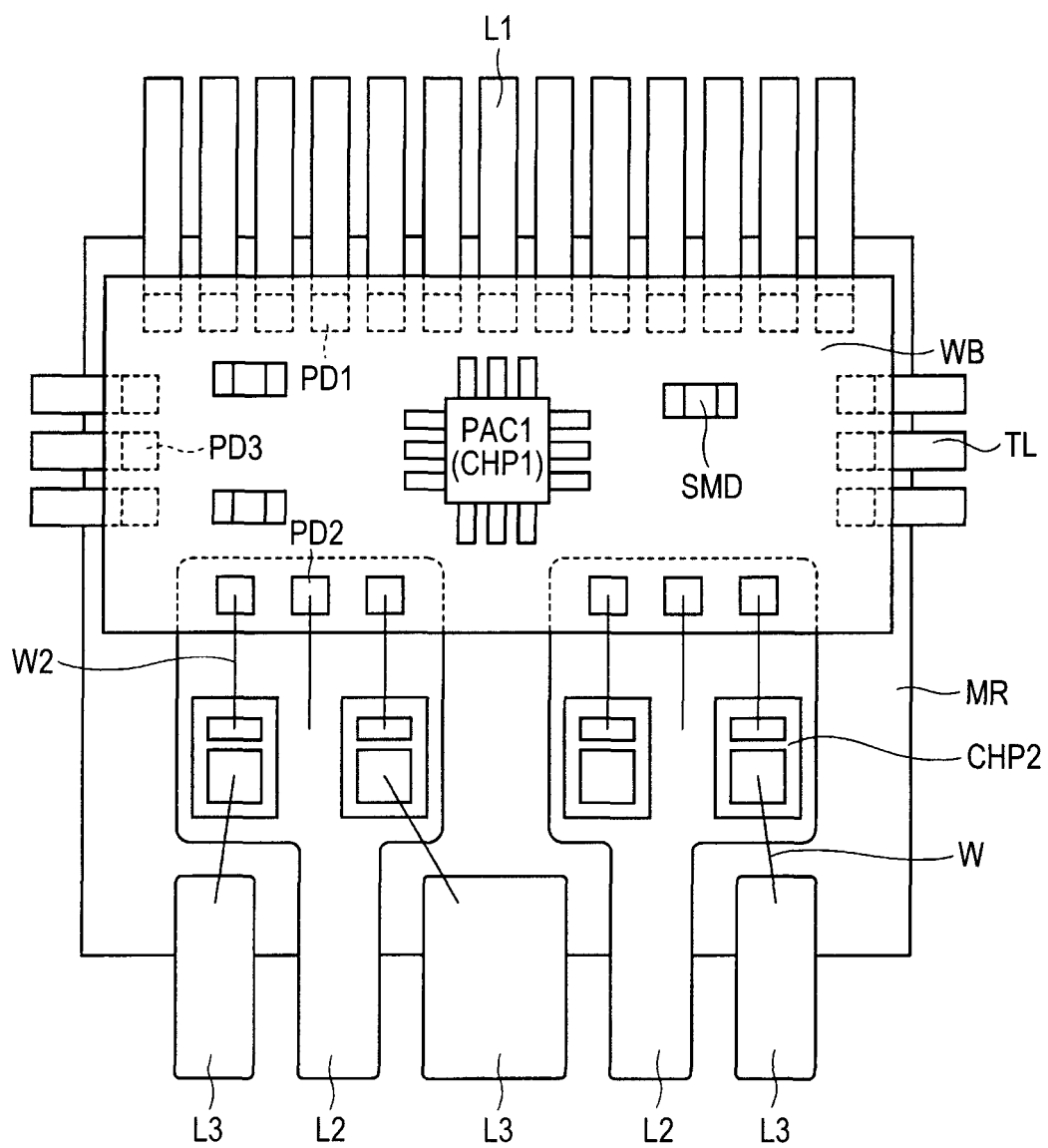
FIG. 28 is a plan view illustrating the manufacturing process for the semiconductor device, following FIG. 27.

As illustrated in FIG. 28, thereafter, the wiring board WB with components placed over both its sides, semiconductor chips CHP2, wires W, W2, partial areas of the leads L1 to the leads L3, and partial areas of the test leads TL are sealed (molded) with resin MR. Then the lead frame is cut and as a result, the semiconductor device (module) in the fifth embodiment can be manufactured.

A feature of the sixth embodiment is that the following processing is carried out at the step for coupling the terminals PD1 formed in the wiring board WB and the leads L1 with each other: the terminals PD1 and the leads L1 are coupled with each other by solder by supplying the solder to the terminals PD1. This makes it possible to enhance the reliability of coupling between the terminals PD1 and the leads L1 as compared with cases where solder is supplied to the leads L1.

Figure 29:
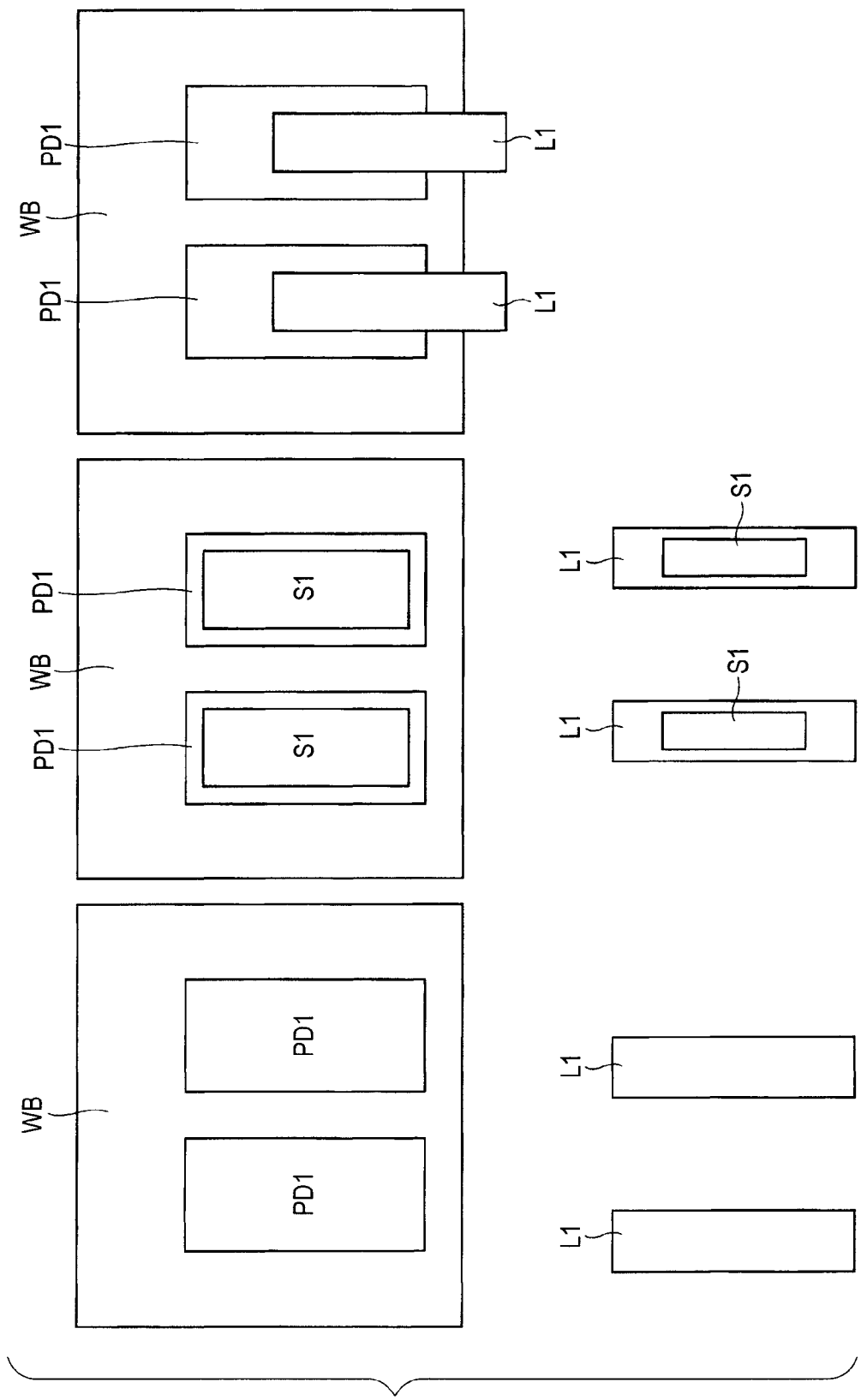
FIG. 29 is a drawing illustrating a comparison between a case where after solder is supplied to terminals, the terminals and leads are joined together and a case where solder is supplied to leads.

The reason for this will be described with reference to FIG. 29. FIG. 29 illustrates a comparison between the following cases: a case where solder S1 is supplied to the terminals PD1 and then the terminals PD1 and the leads L1 are coupled with each other; and a case where solder S1 is supplied to the leads L1. The upper sketch in FIG. 29 depicts a case where solder S1 is first supplied to the terminals PD1 formed in the wiring board WB and then the leads L1 are coupled to the terminals PD1. Meanwhile, the lower sketch in FIG. 29 depicts a case where solder S1 is supplied onto the leads L1. As seen from FIG. 29, the width of each terminal PD1 is larger than the width of each lead L1. (The width of each terminal refers to the horizontal width in FIG. 29 or the width in the direction in which the multiple terminals PD1 are lined.) (The width of each lead refers to the horizontal width in FIG. 29 or the width in the direction in which the multiple leads L1 are lined.) This means that the area of each terminal PD1 is larger than the area of each lead L1. Therefore, the quantity of solder is larger when solder S1 is supplied onto the terminals PD1 than when solder S1 is supplied onto the leads L1. This means that a sufficient quantity of solder can be ensured to couple the terminals PD1 and the leads L1 with each other when solder S1 is supplied onto the terminals PD1. As a result, when solder S1 is supplied onto the terminals PD1, a solder fillet is formed around each lead L1 and thus the reliability of coupling between the terminals PD1 and the leads L1 can be enhanced. In the sixth embodiment, for the above-mentioned reason, solder is supplied to the terminals PD1 at the step for coupling the terminals PD1 formed in the wiring board WB and the leads L1 with each other. The reliability of coupling between the terminals PD1 and the leads L1 can be thereby enhanced.

Seventh Embodiment

In the description of the seventh embodiment, a case where the wiring board WB and the leads are joined together with conductive material will be taken as an example.

Figure 30:
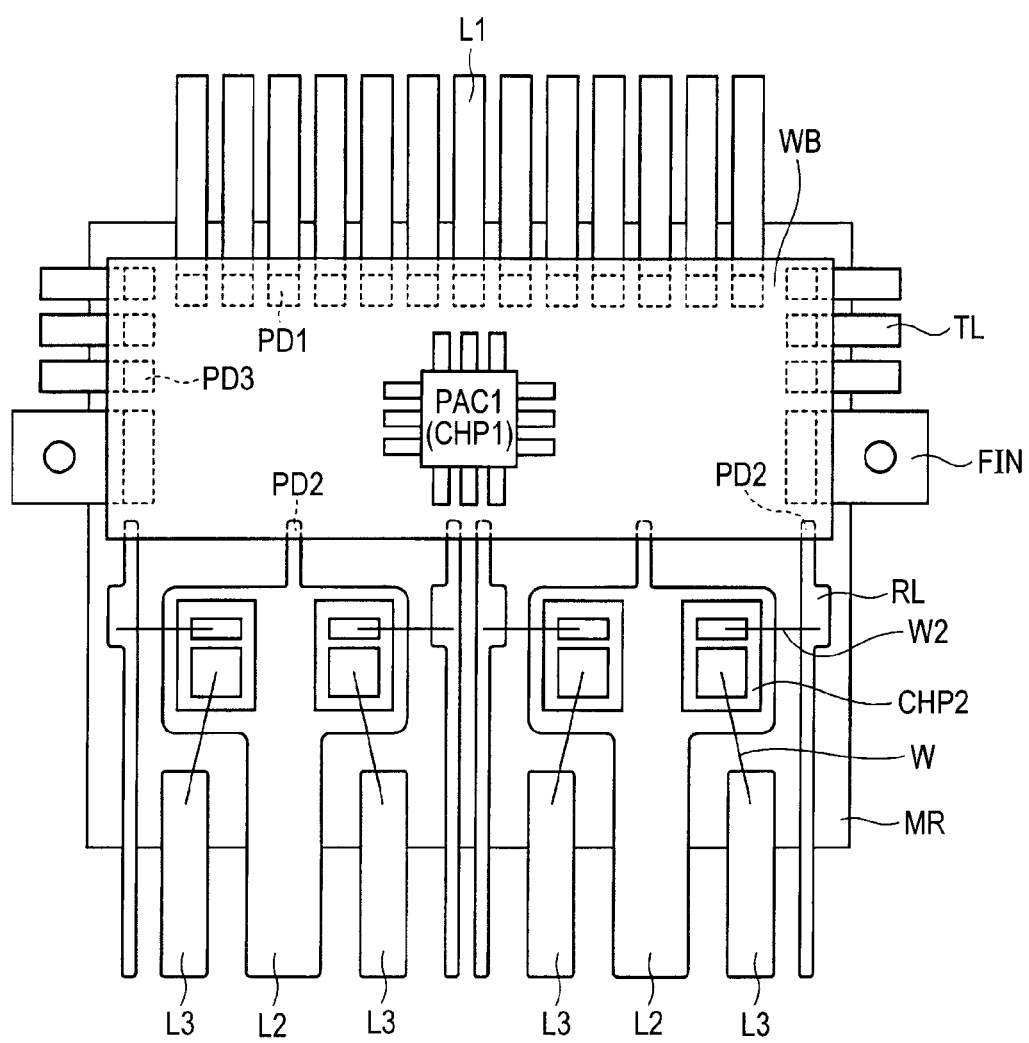
FIG. 30 is a plan view illustrating the configuration of a semiconductor device in a seventh embodiment.

FIG. 30 is a plan view illustrating the configuration of a semiconductor device in the seventh embodiment. The configuration of the semiconductor device in the seventh embodiment illustrated in FIG. 30 is substantially the same as that of the semiconductor device in the fifth embodiment illustrated in FIG. 14; therefore, description will be given to a major difference.

As illustrated in FIG. 30, the semiconductor device (module) in the seventh embodiment includes a rectangular wiring board WB and components, such as a package PAC1 and a passive component (not shown), are placed over both sides of this wiring board WB. Terminals PD1 to terminals PD3 are formed along the peripheral portion of the wiring board WB. The terminals PD1 to the terminals PD3 are formed in the back surface of the wiring board WB. The terminals PD1 formed in the back surface of the wiring board WB are coupled with the leads L1 by conductive material, not by wire. Similarly, the terminals PD2 formed in the back surface of the wiring board WB are coupled with the leads L2 or relay leads RL with conductive material. The terminals PD3 formed in the back surface of the wiring board WB are also coupled with test leads TL with conductive material. The relay leads RL and semiconductor chips CHP2 are electrically coupled with each other through a wire W2.

As mentioned above, a feature of the semiconductor device (module) in the seventh embodiment is that all the terminals PD1 to the terminals PD3 are formed in the back surface of the wiring board WB. Another feature is that: the terminals PD1 are coupled with the leads L1 with conductive material; the terminals PD2 are coupled with the leads L2 or the relay leads RL with conductive material; and the terminals PD3 are coupled with the test leads TL with conductive material. In the semiconductor device (module) in the seventh embodiment, as a result, all the terminals can be coupled with the leads with conductive material. Therefore, the semiconductor device (module) can be further reduced in size than the semiconductor device (module) in the fifth embodiment.

In the semiconductor device (module) in the seventh embodiment, in addition, heat radiation leads FIN are provided as illustrated in FIG. 30. Therefore, it is possible to efficiently dissipate heat produced in the semiconductor device to the outside through the heat radiation leads FIN. Especially, since the heat radiation leads FIN are joined with the wiring board WB through solder, heat can more efficiently dissipated than in cases where the heat radiation leads FIN are coupled with the wiring board WB by wire.

As described in relation to the second embodiment, it is advisable to weld the heat radiation leads FIN to a mounting body CA together with the other leads. This is because heat produced in the semiconductor device can be radiated to the mounting body CA by welding the heat radiation leads FIN to the mounting body CA.

In the semiconductor device (module) in the seventh embodiment, all the terminals formed in the wiring board WB are joined with the leads through solder. Therefore, for example, it is possible to join the terminals formed in the wiring board WB and the leads with each other through solder at the same time as the step for placing the semiconductor chips CHP2 over the leads L2 with solder in between. As a result, the following effect is also obtained: the effect of reducing the steps in the manufacturing process for the semiconductor device (module) in the seventh embodiment.

Eighth Embodiment

In the description of the eighth embodiment, a semiconductor device (module) in which the following measure is taken will be taken as an example: a package PAC1 in which a semiconductor chip CHP1 with a micro is formed is sealed and semiconductor chips CHP2 with a power MOSFET formed therein are three-dimensionally laminated.

Figure 31B:
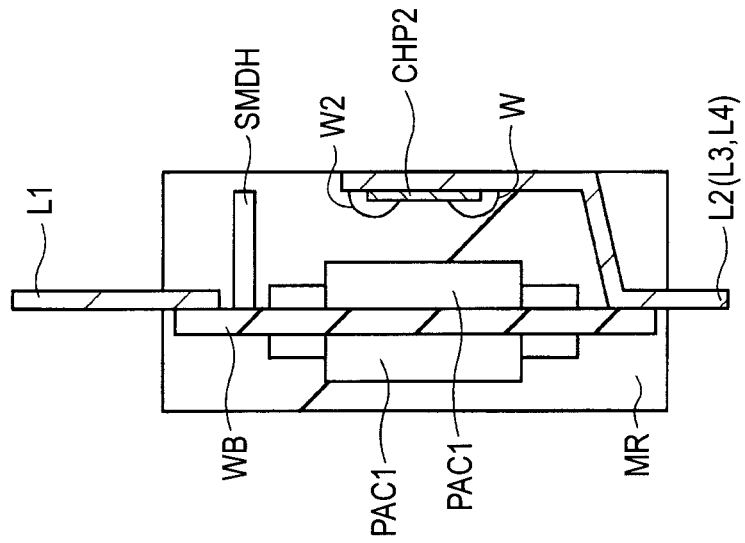
FIG. 31B is a sectional view taken along line A-A of FIG. 31A, illustrating the configuration of the semiconductor device in the eighth embodiment.
Figure 31A:
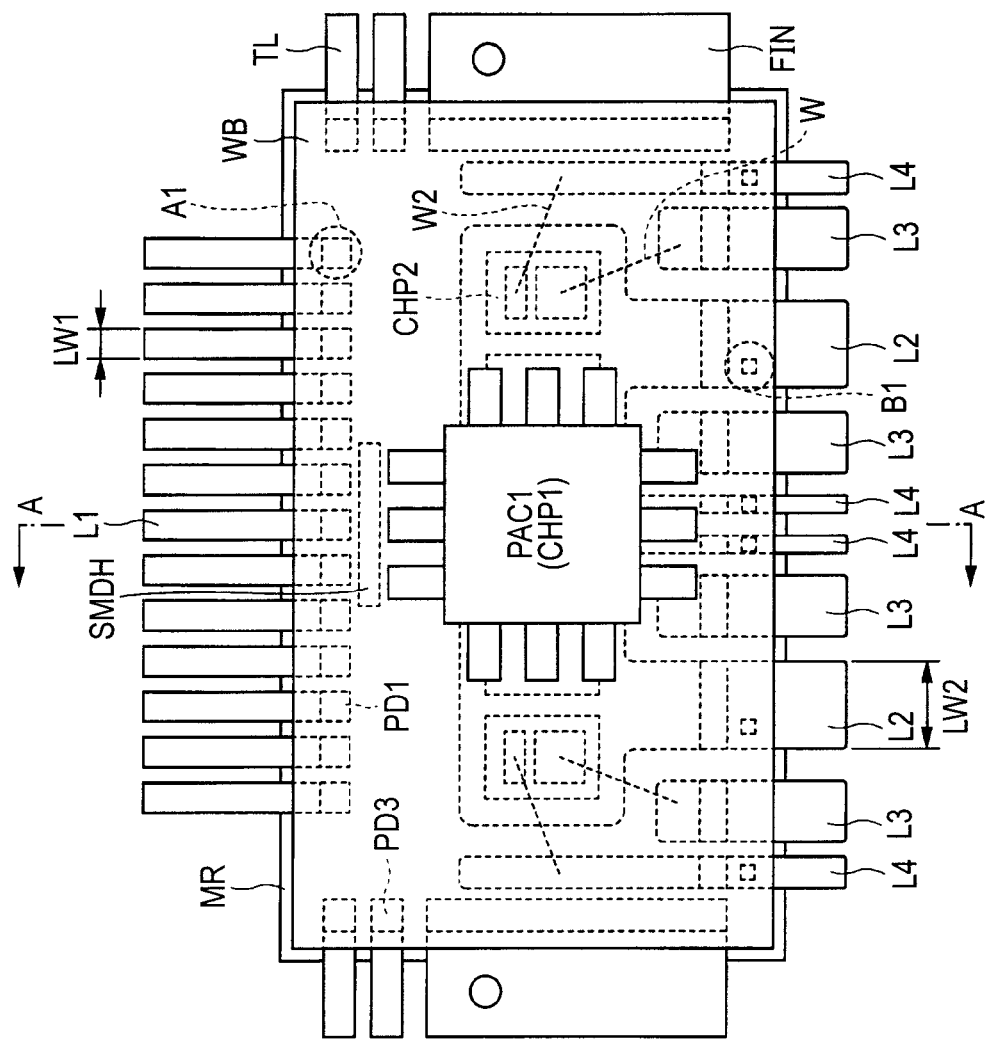
FIG. 31A is a plan view illustrating the configuration of a semiconductor device in an eighth embodiment.

FIG. 31A is a plan view illustrating the configuration of a semiconductor device in the eighth embodiment; and FIG. 31B is a sectional view (sectional view taken along line A-A of FIG. 31A) illustrating the configuration of the semiconductor device in the eighth embodiment. In FIG. 31A, the constituent elements indicated by broken line are located under the wiring board WB. As illustrated in FIG. 31A, the semiconductor device (module) in the eighth embodiment includes a rectangular wiring board WB and components, such as a package PAC1 and a passive component, are placed over both sides of this wiring board WB. In the package PAC1, the semiconductor chip CHP1 with a micro formed therein is sealed. Multiple leads L1 are formed close to a first side of the wiring board WB. These leads L1 are coupled with the terminals PD1 formed in the back surface of the wiring board WB with conductive material, such as solder. Test leads TL and heat radiation leads FIN are formed close to a third side or a fourth side of the wiring board WB orthogonal to the first side. These test leads TL and heat radiation leads FIN are also coupled with the terminals (terminals PD3 and the like) formed in the back surface of the wiring board WB through conductive material. Also in the eighth embodiment, as mentioned above, the heat radiation leads FIN are provided as in the seventh embodiment; therefore, heat produced in the semiconductor device can be efficiently dissipated to the outside through the heat radiation leads FIN. Especially, since the heat radiation leads FIN are also joined with the wiring board WB with solder, heat can be more efficiently dissipated than in cases where the heat radiation leads FIN are coupled with the wiring board WB by wire.

The positions or number of the heat radiation leads FIN is not limited to those indicated in FIG. 31A. When the micro or a regulator placed over the wiring board WB produces much heat, the heat radiation performance can be enhanced by setting the heat radiation leads closer thereto than the other leads are.

A feature of the eighth embodiment is that the leads L2 to leads L4 provided close to the second side of the wiring board WB opposite the first side thereof are located under the wiring board WB so that the following is implemented: the wiring board WB and partial areas of the leads L2 to the leads L4 are three-dimensionally laminated. That is, the leads L2 to the leads L4 are bent and set in areas located under that planarly overlap with the wiring board WB. The semiconductor chips CHP2 are placed over the leads L2 set in areas located under the wiring board WB. The semiconductor chips CHP2 and the leads L4 are coupled with each other through a wire W2 and the semiconductor chips CHP2 and the leads L3 are coupled with each other through a wire W.

As illustrated in FIG. 31B showing another view point, the leads L2 to the leads L4 are bent and the semiconductor chips CHP2 are placed in the bent areas. The semiconductor chips CHP2 are coupled with the leads L4 through a wire W2 and coupled with the leads L3 through a wire W. The wiring board WB is set above the semiconductor chips CHP2. The wiring board WB is coupled with the leads L1 and the leads L2 through conductive material (not shown) and components (package PAC1 and the like) are placed over both sides of the wiring board. These constituent elements are sealed with resin MR.

The leads L2 to the lead L4 need not be so structured that they are aggregated on one side on the lower side of the wiring board WB as illustrated in FIG. 31A. Instead, for example, they may be set both on the left side and on the right side and bent.

The wiring board WB, package PAC1 (semiconductor chip CHP1), and multiple leads L1 will be designated as first structure and the multiple leads L2 and the semiconductor chips CHP2 will be designated as second structure. A feature of the eighth embodiment is that the first structure and the second structure are laminated and set so that they planarly overlap with each other. In other words, the first structure is set over the second structure and the second structure and the first structure are three-dimensionally laminated and set. In the eighth embodiment, as mentioned above, the following can be implemented by three-dimensionally laminating and setting the first structure and the second structure: the semiconductor device (module) can be more reduced in size than in cases where the first structure and the second structure are set so that they are flush with each other.

There is the resin MR between the semiconductor chip CHP1 (package PAC1) and each semiconductor chip CHP2; therefore, the conduction of heat from each semiconductor chip CHP2 to the semiconductor chip CHP1 (package PAC1) can be reduced.

When a high-profile component SMDH or the like is involved, it is advisable to place such a component SMDH on the side where the leads L2 of the wiring board WB are bent, that is, the side where the second structure is set. As a result, the component SMDH is set between the wiring board WB and the leads L2 (between the first structure and the second structure). Therefore, the component height is absorbed and increase in the thickness of the semiconductor device (module) can be suppressed.

The lead width LW2 of each lead L2 over which a semiconductor chip CHP2 is placed is larger than the lead width LW1 of each lead L1 (LW1<LW2) because a large current is passed there. However, the size of the junction B1 of each lead L2 with the wiring board WB is smaller than the size of the junction A1 of each lead L1 with the wiring board WB. This structure makes it possible to prevent heat produced from each semiconductor chip CHP2 with a power MOSFET formed therein from being conducted to the semiconductor chip CHP1 with the micro formed therein through the wiring board WB. Conversely, when the semiconductor chip CHP1 is a micro or the like that produces much heat, the influence of heat on each semiconductor chip CHP2 can be reduced.

Figure 32:
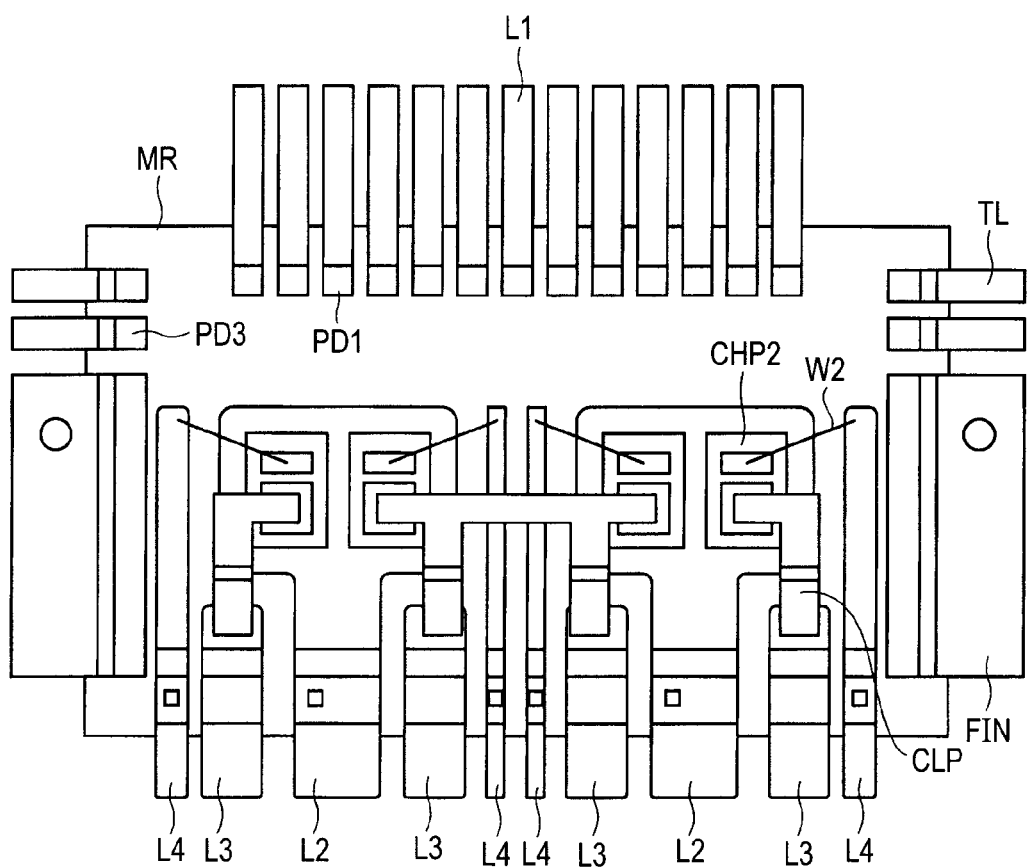
FIG. 32 is a drawing illustrating an example in which a Cu clip is used in the eighth embodiment.

FIGS. 31A and 31B show a structure in which coupling between a pad (for example, a source pad) of each semiconductor chip CHP2 and a lead L3 (for example, a source lead) is implemented by wire W. Instead, they may be coupled with each other by a metal plate, large in width, such as a Cu clip CLP as illustrated in FIG. 32. In this case, resistance can be reduced as compared with cases where they are coupled with each other by wire W. The metal plate may be an Al ribbon bonded using an ultrasonic wave and heat at the same time. In FIG. 32, the wiring board WB is omitted.

Figure 33:
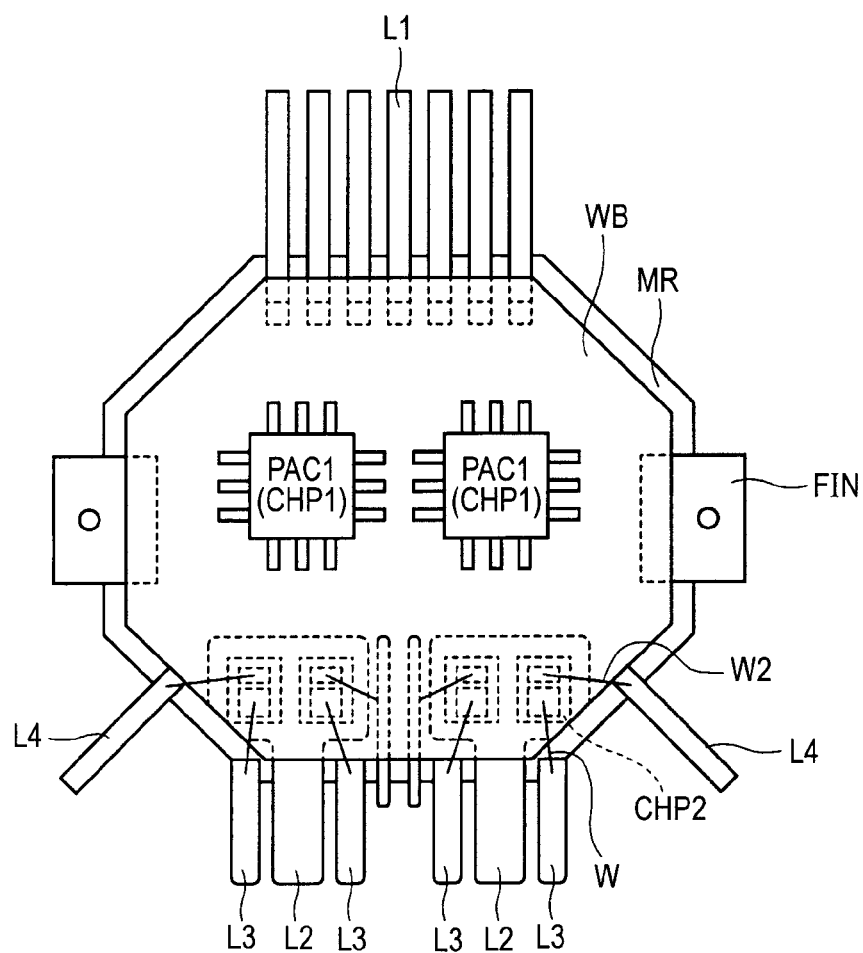
FIG. 33 is a drawing illustrating a modification to the semiconductor device illustrated in FIG. 31.
Figure 34:
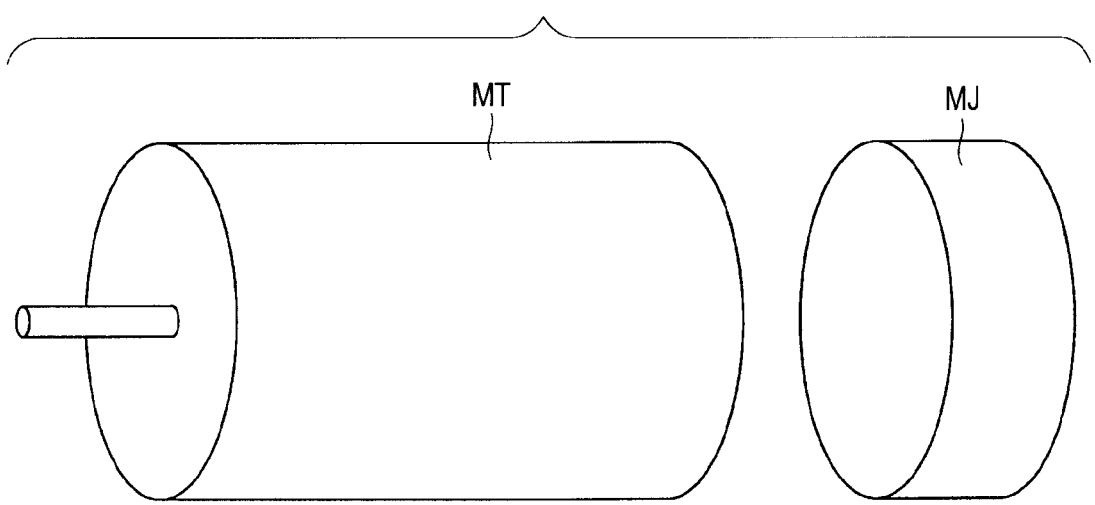
FIG. 34 is a schematic diagram illustrating how a semiconductor device is mounted at the rear part of a motor.

FIG. 33 illustrates a modification to the semiconductor device (module) illustrated in FIG. 31. Also in the semiconductor device (module) illustrated in FIG. 33, the same measure as in the semiconductor device (module) illustrated in FIGS. 31A and 31B is taken. That is, the first structure and the second structure are three-dimensionally laminated and set. For this reason, the size of the semiconductor device (module) can be reduced. Especially, in the modification illustrated in FIG. 33, the outside shape of the resin MR sealing the constituent elements including the first structure and the second structure is substantially circular (for example, octagonal). For this reason, the module MJ (module illustrated in FIG. 33) in the modification can be attached to the rear part of a motor MT within the range of the outer dimensions of the motor MT as illustrated in FIG. 34.

Ninth Embodiment

With respect to the ninth embodiment, description will be given to a manufacturing method for the semiconductor device (module) described in relation to the eighth embodiment with reference to the drawings. First, sectional views will be used to describe the manufacturing method for the semiconductor device (module) and then plan views will be used to describe the manufacturing method for the semiconductor device (module).

Figure 35:
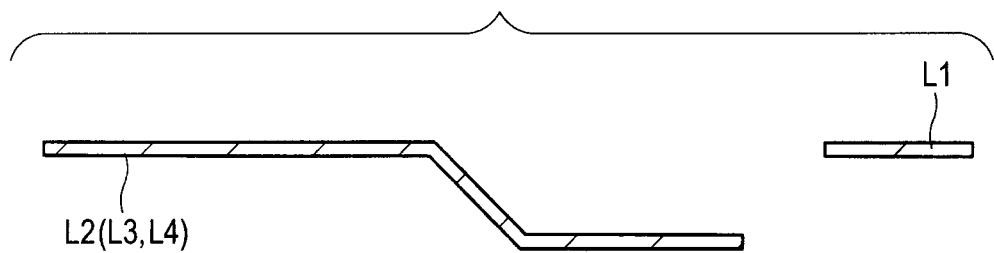
FIG. 35 is a sectional view illustrating a manufacturing process for a semiconductor device in a ninth embodiment.
Figure 36:
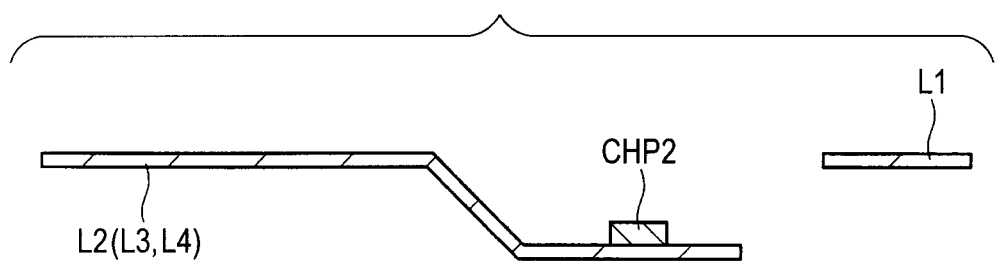
FIG. 36 is a sectional view illustrating the manufacturing process for the semiconductor device, following FIG. 35.
Figure 37:
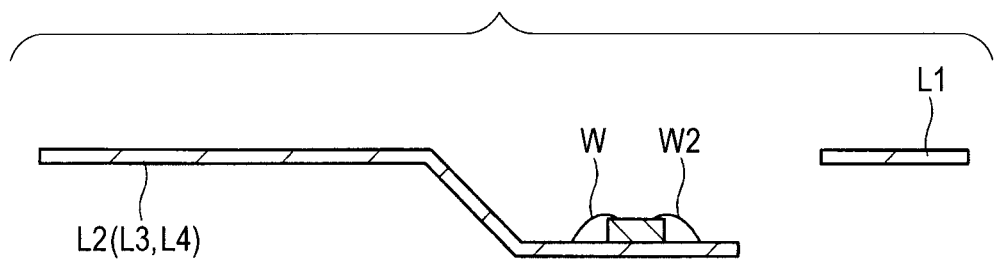
FIG. 37 is a sectional view illustrating the manufacturing process for the semiconductor device, following FIG. 36.

First, a lead frame having leads L1 to leads L4 as illustrated in FIG. 35 is prepared and part of each of the leads L2 to the leads L4 is bent. As illustrated in FIG. 36, subsequently, a semiconductor chip CHP2 is placed in an end area of the bent lead L2. This semiconductor chip CHP2 is a semiconductor chip with a power MOSFET formed therein. As illustrated in FIG. 37, subsequently, the semiconductor chips CHP2 placed over the leads L2 and the leads L4 are coupled with each other through a wire W2; and the semiconductor chips CHP2 and the leads L3 are coupled with each other through a wire W.

Figure 38:
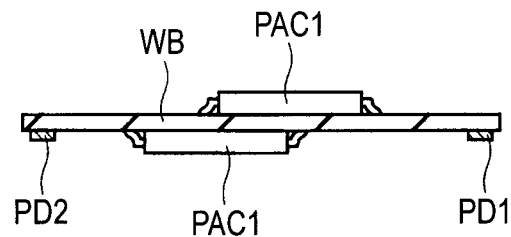
FIG. 38 is a sectional view illustrating the manufacturing process for the semiconductor device, following FIG. 37.

As illustrated in FIG. 38, meanwhile, a wiring board WB with components placed over both its sides is prepared. Specifically, a wiring board WB (multiple board) with terminals PD1 and terminals PD2 formed in its back surface is prepared. Then a package PAC1 as a component is placed over the main surface (front surface) of the wiring board WB. In detailed description, the package PAC1 and the wiring board WB are joined together through solder and then ref lowing is carried out to mount the package PAC1 to the wiring board WB. This package PAC1 is obtained, for example, by packaging a semiconductor chip CHP1 with a micro formed therein. Though not shown in the drawing, a passive component and the like are also placed.

Subsequently, a package PAC1 as a component is placed over the back surface of the wiring board WB. Also in this case, the package PAC1 and the wiring board WB are joined together through solder and then ref lowing is carried out to mount the package PAC1 to the wiring board WB. Though not shown in the drawing, a passive component and the like are also placed. Components can be placed over both the front surface and back surface of the wiring board WB as mentioned above. Thereafter, the multiple board can be segmented to obtain individual wiring boards WB.

Figure 39:
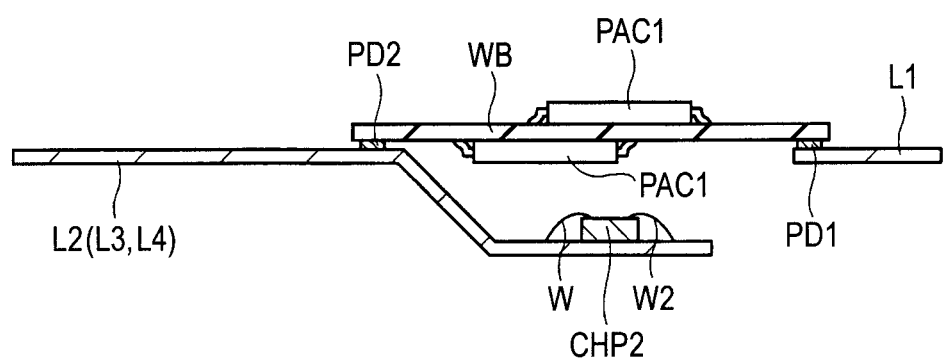
FIG. 39 is a sectional view illustrating the manufacturing process for the semiconductor device, following FIG. 38.

As illustrated in FIG. 39, thereafter, each wiring board WB mounted with components on both sides is set over the lead frame. For example, the terminals PD1 formed in the wiring board WB are coupled with the leads L1 through solder (conductive material); and the terminals PD2 formed in the wiring board WB are coupled with the leads L2 through solder (conductive material). As a result, the wiring board WB is set above the semiconductor chips CHP2. That is, the semiconductor chips CHP2 and the wiring board WB are three-dimensionally laminated and set.

Figure 40:
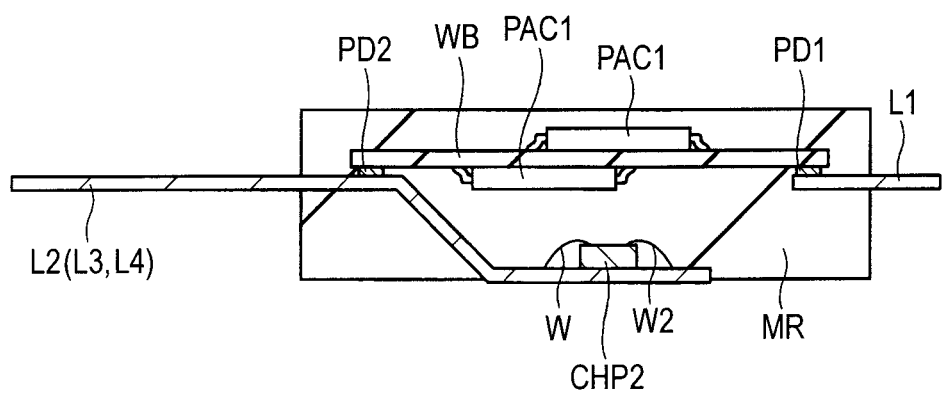
FIG. 40 is a sectional view illustrating the manufacturing process for the semiconductor device, following FIG. 39.

As illustrated in FIG. 40, subsequently, the wiring board WB mounted with components on both sides, semiconductor chips CHP2, wires W, W2, and partial areas of the leads L1 to the leads L4 are sealed (molded) with resin MR. Then the lead frame is cut and as a result, the semiconductor device (module) in the eighth embodiment can be manufactured.

Figure 41:
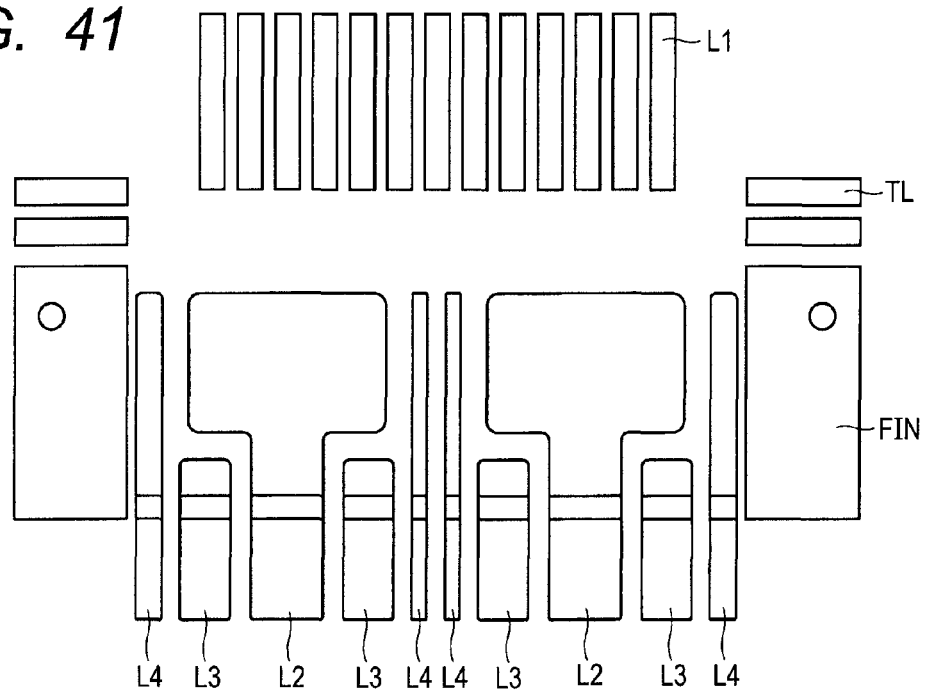
FIG. 41 is a plan view illustrating a manufacturing process for a semiconductor device in the ninth embodiment.

Further description will be given to the manufacturing method for the semiconductor device (module) in the eighth embodiment with reference to plan views. As illustrated in FIG. 41, first, the lead frame with the leads L1 to leads L4 and the test leads TL formed therein is prepared. At this time, the end areas of the leads L2 to leads L4 have been bent.

Figure 42:
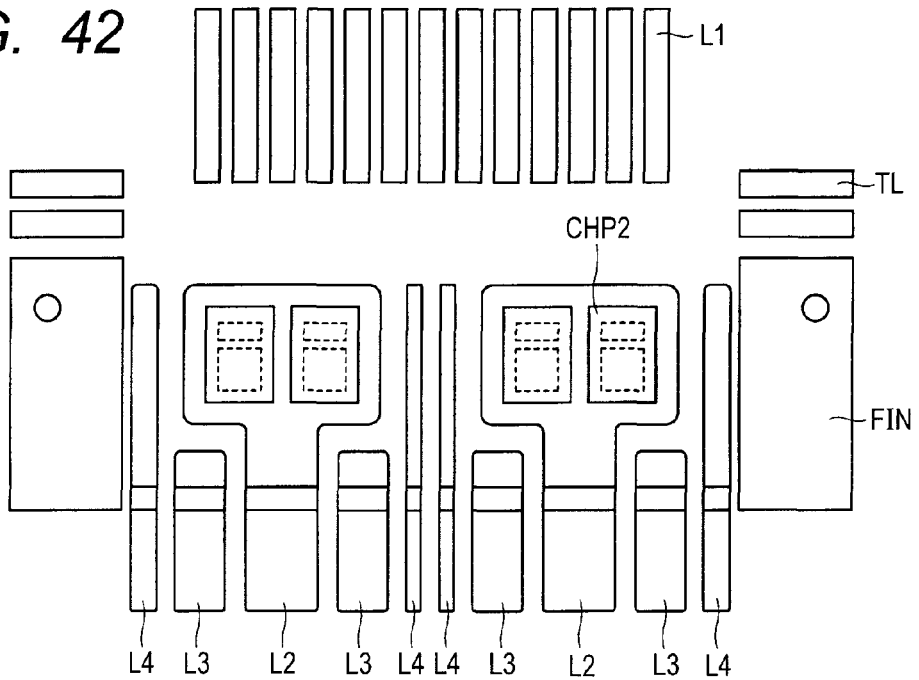
FIG. 42 is a plan view illustrating the manufacturing process for the semiconductor device, following FIG. 41.
Figure 43:
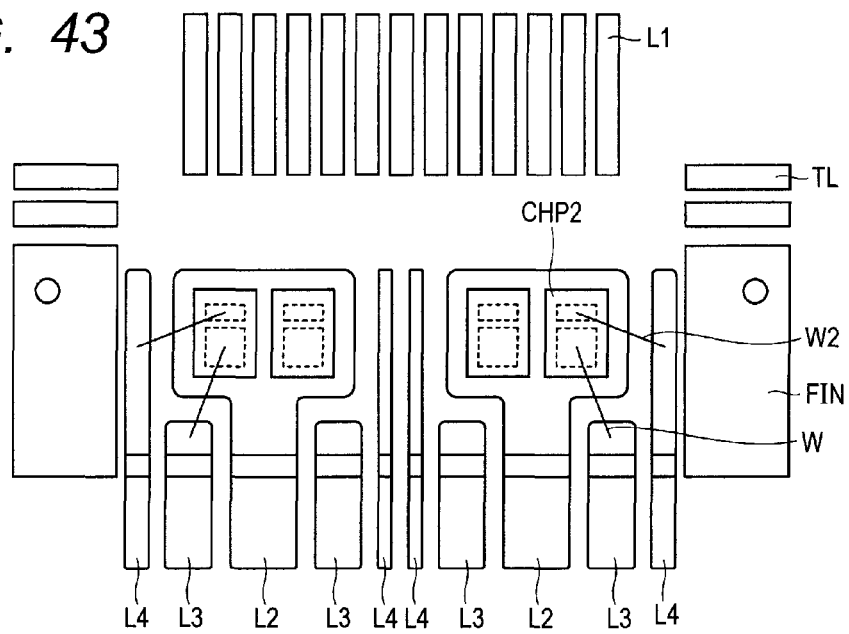
FIG. 43 is a plan view illustrating the manufacturing process for the semiconductor device, following FIG. 42.

As illustrated in FIG. 42, subsequently, the semiconductor chips CHP2 are placed over the leads L2. In each of these semiconductor chips CHP2, there is formed a power MOSFET. As illustrated in FIG. 43, thereafter, the semiconductor chips CHP2 and the leads L4 are coupled with each other through a wire W2 and the semiconductor chips CHP2 and the leads L3 are coupled with each other through a wire W.

Figure 44:
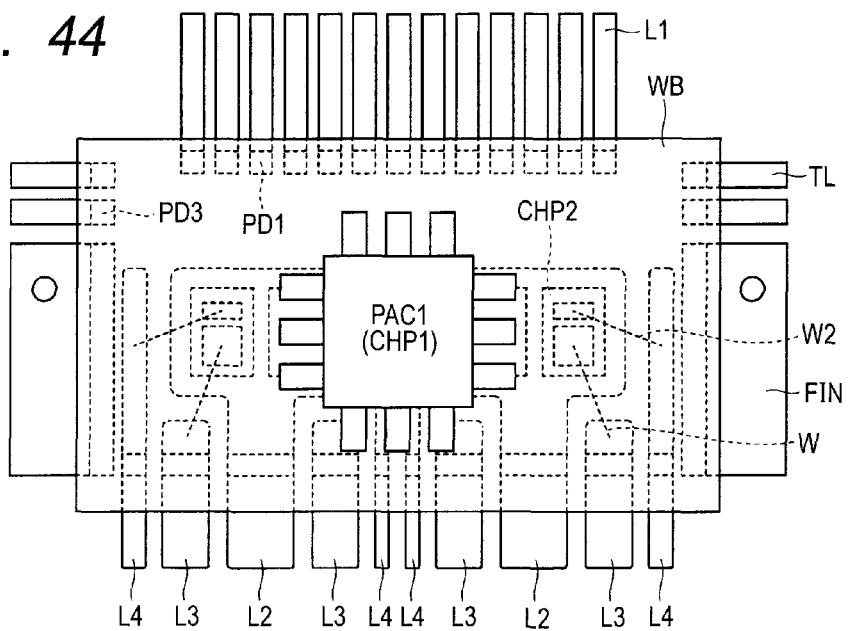
FIG. 44 is a plan view illustrating the manufacturing process for the semiconductor device, following FIG. 43.

As illustrated in FIG. 44, thereafter, the wiring board WB with components (for example, package PAC1, passive component SMD, and the like) placed on both its sides is placed over the lead frame. Specifically, the terminals PD1 formed in the back surface of the wiring board WB and the leads L1 are coupled with each other through solder (conductive material); and the terminals PD3 formed in the back surface of the wiring board WB and the test leads TL are coupled with each other through solder (conductive material). Further, the wiring board WB and the leads L2 are electrically coupled with each other. As a result, the wiring board WB is set above the semiconductor chips CHP2 placed over the leads L2. That is, the semiconductor chips CHP2 and the wiring board WB are three-dimensionally laminated and set.

Figure 45:
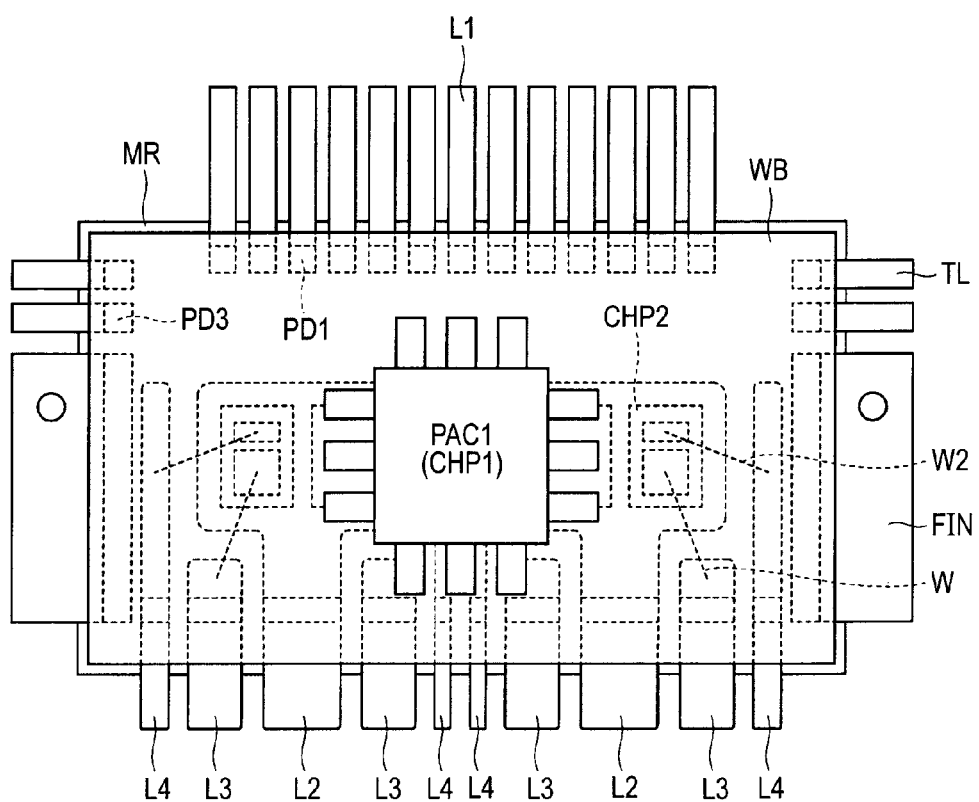
FIG. 45 is a plan view illustrating the manufacturing process for the semiconductor device, following FIG. 44.

As illustrated in FIG. 45, thereafter, the wiring board WB with components placed over both its sides, semiconductor chips CHP2, wires W, W2, partial areas of the leads L1 to the leads L4, and partial areas of the test leads TL are sealed (molded) with resin MR. Then the lead frame is cut and as a result, the semiconductor device (module) in the eighth embodiment can be manufactured.

10th Embodiment

Figure 46:
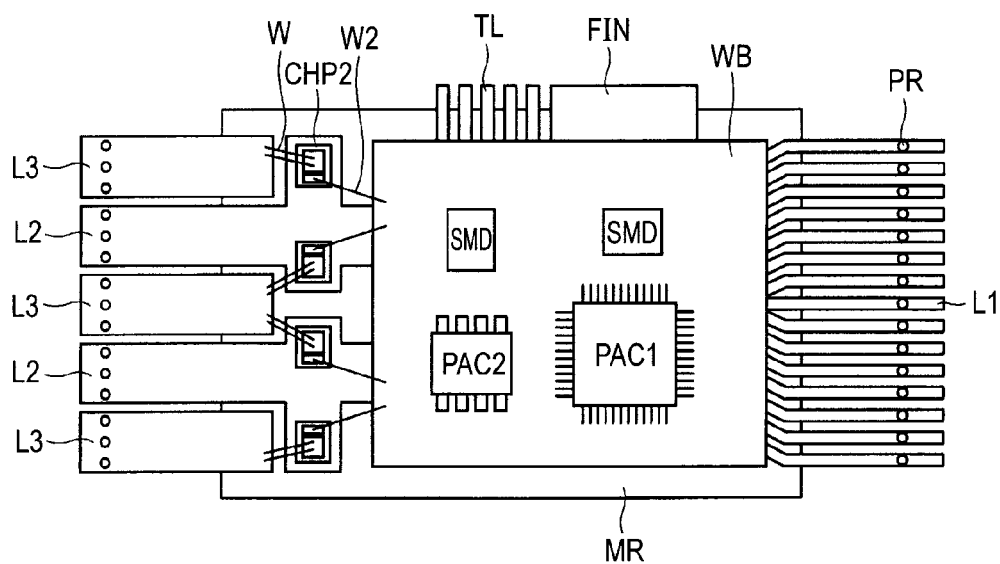
FIG. 46 is a plan view of a semiconductor device in a 10th embodiment as viewed from the front surface side.

With respect to the 10th embodiment, description will be given to a semiconductor device (module) prototyped by the present inventors. FIG. 46 is a plan view illustrating the semiconductor device (module) in the 10th embodiment as viewed from the front surface side. In FIG. 46, the semiconductor device (module) in the 10th embodiment includes a rectangular wiring board WB and a package PAC1, a package PAC2, and passive components SMD are placed over the front surface of this wiring board WB. The package PAC1 is, for example, a package in which a semiconductor chip with a micro formed therein is sealed; and the package PAC2 is, for example, a package in which a semiconductor chip dedicated to control on switching of power MOSFETs is sealed.

Multiple leads L1 are set on the right side (first side) of the wiring board WB and leads L2 with semiconductor chips CHP2 placed thereover and leads L3 are set on the left side (second side) of the wiring board WB. In addition, test leads TL and a heat radiation lead FIN are set on the upper side (third side) of the wiring board. The semiconductor chips CHP2 placed over the leads L2 and the wiring board WB are coupled with each other through a wire W2 and the semiconductor chips CHP2 and the leads L3 are coupled with each other through a wire W. These constituent elements are sealed with resin MR.

Figure 47:
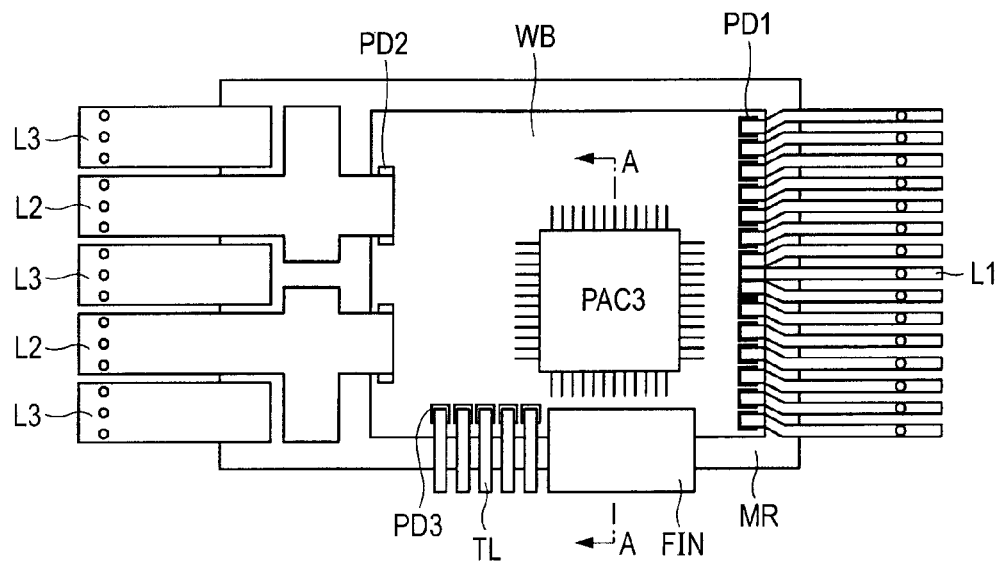
FIG. 47 is a plan view of a semiconductor device in the 10th embodiment as viewed from the back surface side.

FIG. 47 is a plan view illustrating the semiconductor device (module) in the 10th embodiment as viewed from the back surface side. In FIG. 47, the semiconductor device (module) in the 10th embodiment includes the rectangular wiring board WB and a package PAC3 is placed over the back surface of this wiring board WB.

The leads L1 set on the right side (first side) of the wiring board WB are coupled with the terminals PD1 formed over the wiring board WB through solder (conductive material). Similarly, the leads L2 set on the left side (second side) of the wiring board WB and the terminals PD2 formed in the wiring board WB are also coupled with each other through solder (conductive material). Further, the test leads TL and the heat radiation lead FIN formed on the lower side (third side) of the wiring board WB are coupled with the terminals PD3 formed in the wiring board WB through solder (conductive material).

A feature of the thus configured semiconductor device (module) in the 10th embodiment is that when an electrical test is conducted on the semiconductor device (module), a special socket is unnecessary. More specific description will be given. After the completion of a semiconductor device (module), socket pins are pressed against the leads L1 to L3 and the test leads L3 to test its electrical characteristic. A semiconductor device (module) determined to be normal as the result of this test is shipped as a product. At this testing step, the semiconductor device (module) in the 10th embodiment can be inspected without use of any special socket.

In FIG. 46 and FIG. 47, for example, positions (open circles) where socket pins PR should be brought into contact with the semiconductor device are indicated. The pin pitch of the socket pins PR brought into contact with the leads L1 is identical with the pin pitch of the socket pins PR brought into contact with the leads L2 to the leads L3; therefore, an identical socket can be utilized. In the example in FIG. 46 and FIG. 47, inspection can be carried out with one lead L1 in correspondence with one socket pin PR and one lead L2 to L3 in correspondence with three socket pins PR. This means that when an electrical characteristic test is conducted on the leads L1 to the leads L3, an identical socket with an identical pitch can be used. In the semiconductor device (module) in the 10th embodiment, as mentioned above, it is unnecessary to use different sockets having different pin pitches for the leads L1 to the leads L3 in an electrical characteristic test. An identical socket with an identical pin pitch can be used for the leads L1 to the leads L3. Therefore, it is unnecessary to prepare a special socket. This makes it possible to use an ordinary socket and reduce a test cost.

Figure 48:
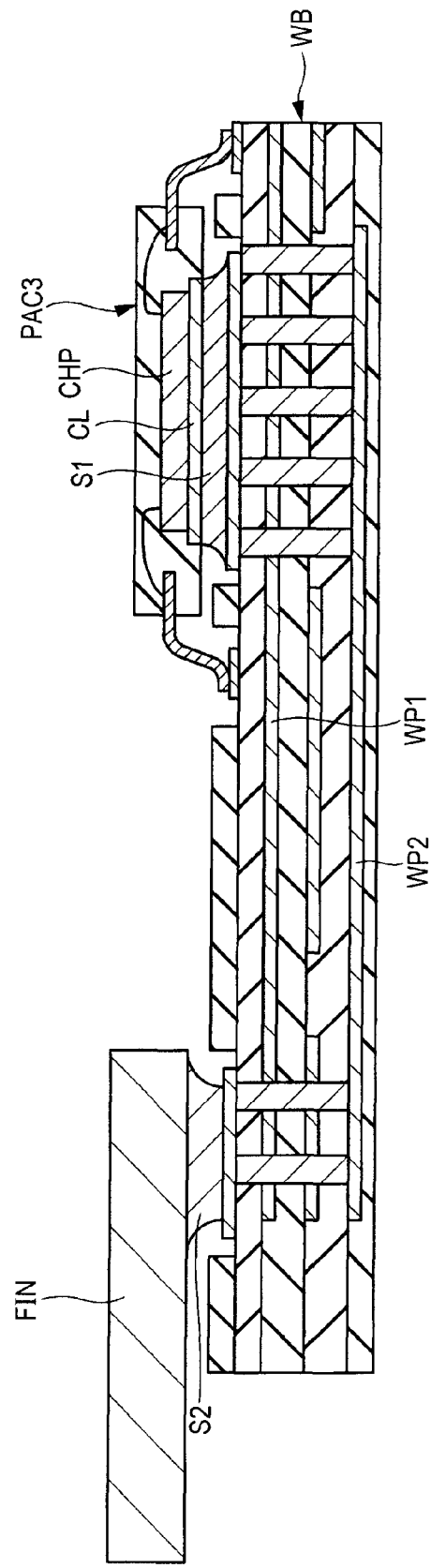
FIG. 48 is a sectional view taken along line A-A of FIG. 47.

Description will be given to a heat radiation measure for the semiconductor device (module) in the 10th embodiment. FIG. 48 is a sectional view taken along line A-A of FIG. 47. As illustrated in FIG. 48, a chip placement portion CL is provided in the package PAC3 placed over the back surface of the wiring board WB and the semiconductor chip CHP is placed over this chip placement portion CL. The chip placement portion CL is exposed from the back surface of the package PAC3 and coupled with the wiring board WB through solder S1. The heat radiation lead FIN is also coupled with the wiring board WB through solder S2. Heat produced in the semiconductor chip CHP is dissipated by the heat radiation path from chip placement portion CL, solder S1, wiring WP1 (wiring WP2) (ground pattern), solder S2, to heat radiation lead FIN. Therefore, the heat radiation efficiency can be enhanced when the distance between the package PAC3 and the heat radiation lead FIN is short. In the 10th embodiment, for this reason, the placement position of the package PAC3 is determined so that the distance between the package PAC3 and heat radiation lead FIN placed over the back surface of the wiring board WB is shortened. In other words, it is desirable to set the package PAC3 as close to the side of the wiring board WB where the heat radiation lead FIN is set as possible. Further, it is desirable to prevent a heat producing component or the like from being set between the package PAC3 and the heat radiation lead FIN. In the semiconductor device (module) in the 10th embodiment, the heat radiation efficiency can be enhanced as mentioned above.

Up to this point, concrete description has been given to the invention made by the present inventors based on embodiments thereof. However, the invention is not limited to these embodiments and can be variously modified without departing form the subject matter thereof, needless to add.

The gate insulating film of each MOSFET is not limited to an oxide film and includes other insulating films such as nitride.

In each of the above-mentioned embodiments, each lead L2 with a semiconductor chip CHP2 placed thereover is in a protruded shape and is so structured that it is less prone to come off from the resin MR (sealing body). Also with respect to the other leads, the same effect can be obtained by: forming each lead in a protruded shape, providing the lead with a recessed portion, or bending it in the Z-direction (direction of the height of the package) in the resin MR (sealing body).

The invention can be widely utilized in the manufacturing industry that manufactures semiconductor devices.

What is claimed is:
1. A semiconductor device comprising:
(a) a wiring board;
(b) a first semiconductor chip placed over the main surface of the wiring board;
(c) a plurality of first leads electrically coupled with the first semiconductor chip;
(d) a plurality of second leads each having a first surface and a second surface opposite the first surface;
(e) at least one respective second semiconductor chip placed over the first surface of each of the plurality of second leads and having a power MOSFET functioning as a switching element formed therein; and
(f) a sealing body having a top surface, a bottom surface opposite the top surface, and a plurality of side surfaces between the top and bottom surfaces in a thickness direction thereof, the sealing body sealing the wiring board, the first semiconductor chip, a partial area of each of the first leads, a partial area of each of the second leads, and each second semiconductor chip,
wherein the wiring board is electrically coupled with each second semiconductor chip,
wherein the entire second surface of each second lead is exposed from the sealing body, and
wherein the second surface of each second lead has a first partial surface and a second partial surface, the first partial surface being located directly below the corresponding at least one second semiconductor chip and the second partial surface being on a part of the second lead protruded from one of the plurality of side surfaces of the sealing body, the first and second partial surfaces being in the same plane.

2. The semiconductor device according to claim 1, further comprising:
a test lead for testing the functions of the semiconductor device,
wherein the test lead is sealed with the sealing body to an end portion thereof and one side of the end portion of the test lead is exposed from the sealing body.

3. The semiconductor device according to claim 1,
wherein a component is placed on both sides of the wiring board, and
wherein a first structure including the wiring board, the first semiconductor chip, and the first leads and a second structure including the second leads and the second semiconductor chip are laminated and set so that the first structure and the second structure overlap with each other in plan view.

4. The semiconductor device according to claim 1,
wherein the second surface of each of the plurality of second leads is exposed from the sealing body.

5. The semiconductor device according to claim 1,
wherein the sealing body has a first side and a second side opposite the first side,
wherein the plurality of first leads protrude from the first side of the sealing body along a first direction,
wherein the plurality of second leads protrude from the second side of the sealing body along the first direction, and
wherein, in a second direction which intersects perpendicularly with the first direction, a width of each of the plurality of second leads is wider that a width of each of the plurality of first leads.

6. The semiconductor device according to claim 1,
wherein, in a plan view, a passive component is placed over the main surface of the wiring board between the first and second semiconductor chips.

7. The semiconductor device according to claim 1,
wherein each of the plurality of second leads is spaced from the wiring board in a plan view.

8. The semiconductor device according to claim 1,
wherein a component is placed on both sides of the wiring board and the wiring board is supported by a board holder.

9. A semiconductor device according to claim 8,
wherein the first semiconductor chip is electrically coupled with a plurality of first terminals formed in the wiring board and the first terminals and the first leads are electrically coupled with each other through a first wire, wherein each second semiconductor chip is electrically coupled with a second terminal formed in the wiring board through a second wire, and wherein, in plan view, the board holder is formed in an area overlapping with a first terminal formation region where the first terminals are formed and a second terminal formation region where the second terminal is formed.

10. The semiconductor device according to claim 1,
wherein a component is placed on both sides of the wiring board,
wherein the first semiconductor chip is electrically coupled with a plurality of first terminals formed in the wiring board, and the first terminals and the first leads are coupled with each other through conductive material, and
wherein each second semiconductor chip is electrically coupled with a second terminal formed in the wiring board through a second wire.

11. The semiconductor device according to claim 10,
wherein the conductive material is solder or conductive adhesive.

12. The semiconductor device according to claim 1,
wherein a component is placed on both sides of the wiring board,
wherein the first semiconductor chip is electrically coupled with a plurality of first terminals formed in the wiring board, and the first terminals and the first leads are coupled with each other through conductive material,
wherein each second semiconductor chip is electrically coupled to a relay lead through a second wire, the relay lead being coupled through conductive material with a second terminal formed in the wiring board.

13. The semiconductor device according to claim 12,
wherein the conductive material is solder or conductive adhesive.

14. The semiconductor device according to claim 1,
wherein the first semiconductor chip is packaged as a package body.

15. The semiconductor device according to claim 14,
wherein the type of the package body is any of QFP, QFN, BGA, and CSP.

16. The semiconductor device according to claim 1,
wherein the wiring board is in a rectangular shape,
wherein each second semiconductor chip is placed over the first surface of the corresponding second lead and is set adjacently to a first side of the wiring board, and
wherein the first semiconductor chip is set over the wiring board close to a second side of the wiring board opposite the first side.

17. The semiconductor device according to claim 16, further comprising:
a third semiconductor chip placed over the main surface of the wiring board and having a switching control unit for controlling turn-on/off of a switching element formed therein,
wherein the third semiconductor chip is set between the first semiconductor chip and the second semiconductor chips in a plan view.

18. The semiconductor device according to claim 1, further comprising:
a board placement portion formed in the same layer as the first leads and the second leads, and
wherein the wiring board is placed over the main surface of the board placement portion.

19. The semiconductor device according to claim 18,
wherein the first semiconductor chip is electrically coupled with a plurality of first terminals formed in the wiring board, and the first terminals and the first leads are electrically coupled with each other through first wires.

20. The semiconductor device according to claim 19,
wherein each second semiconductor chip is electrically coupled with a second terminal formed in the wiring board through a second wire.

21. The semiconductor device according to claim 1,
wherein (b1) a rewritable nonvolatile memory storing a program, and (b2) a central processing unit carrying out processing based on the program stored in the nonvolatile memory are formed in the first semiconductor chip.

22. The semiconductor device according to claim 21,
wherein the central processing unit has a communication function for communication with a source external to the semiconductor device.

23. The semiconductor device according to claim 22,
wherein the central processing unit further has a switching control function for controlling turn-on/off of the switching element.

24. The semiconductor device according to claim 23,
wherein the switching element is used to supply power to a motor.

* * * * *